(12) United States Patent
Chiang et al.

(10) Patent No.: US 12,696,690 B2
(45) Date of Patent: Jul. 28, 2026

(54) RESISTIVE MEMORY DEVICE WITH ENHANCED LOCAL ELECTRIC FIELD AND METHODS OF FORMING THE SAME

(71) Applicant: Taiwan Semiconductor Manufacturing Company Limited, Hsinchu (TW)

(72) Inventors: Hung-Li Chiang, Taipei City (TW); Jung-Piao Chiu, Kaohsiung City (TW); Jer-Fu Wang, Taipei City (TW); Tzu-Chiang Chen, Hsinchu City (TW); Meng-Fan Chang, Taichung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 415 days.

(21) Appl. No.: 17/714,350

(22) Filed: Apr. 6, 2022

(65) Prior Publication Data

US 2023/0157187 A1     May 18, 2023

Related U.S. Application Data

(60) Provisional application No. 63/279,392, filed on Nov. 15, 2021.

(51) Int. Cl.
*H10N 70/00* (2023.01)
*H10B 63/00* (2023.01)

(52) U.S. Cl.
CPC .......... *H10N 70/841* (2023.02); *H10B 63/30* (2023.02); *H10B 63/80* (2023.02); *H10N 70/021* (2023.02); *H10N 70/063* (2023.02)

(58) Field of Classification Search
CPC .. H10N 70/841; H10N 70/021; H10N 70/063; H10N 70/24; H10N 70/826; H10N 70/883; H10B 63/30; H10B 63/80
(Continued)

(56) References Cited

U.S. PATENT DOCUMENTS 9,853,215 B1     12/2017  Tseng et al.
11,730,070 B2 *   8/2023  Miyazoe .............. H10N 70/011
257/4
(Continued)

FOREIGN PATENT DOCUMENTS

JP      2017208419 A  * 11/2017
TW          I657517 B     4/2019
(Continued)

OTHER PUBLICATIONS

Tanaka, "Semiconductor Device and Manufacturing Method of the Same", Nov. 24, 2017 (Year: 2017).*
(Continued)

*Primary Examiner* — Mounir S Amer
*Assistant Examiner* — Nicholas B Michaud
(74) *Attorney, Agent, or Firm* — The Marbury Law Group, PLLC

(57)     ABSTRACT

A resistive memory device includes a bottom electrode, a switching layer including a first horizontal portion, a second horizontal portion over an upper surface of the bottom electrode, and a first vertical portion over a side surface of the bottom electrode, a top electrode including a first horizontal portion over the first horizontal portion of the switching layer, a second horizontal portion over the second horizontal portion of the switching layer, and a first vertical portion over the first vertical portion of the switching layer, and a conductive via contacting the first horizontal portion, the second horizontal portion and the first vertical portion of the top electrode. By providing a switching layer and a top electrode which conform to a non-planar profile of the bottom electrode, charge crowding and a localized increase in electric field may facilitate resistance-state switching and provide a reduced operating voltage.

19 Claims, 34 Drawing Sheets

(58) Field of Classification Search
USPC ............................. 257/4, 536; 438/270, 666
See application file for complete search history.

(56)                       References Cited

U.S. PATENT DOCUMENTS

| | | | | |
|---|---|---|---|---|
| 2013/0082231 A1* | 4/2013 | Tada | ................. | G11C 13/0007 |
| | | | | 257/4 |
| 2014/0210103 A1* | 7/2014 | Satoh | .................... | H10N 70/20 |
| | | | | 257/774 |
| 2015/0109093 A1* | 4/2015 | Higano | ............. | H10N 70/8833 |
| | | | | 338/20 |
| 2016/0049583 A1* | 2/2016 | Huang | ............. | H10N 70/8833 |
| | | | | 257/4 |
| 2016/0284993 A1* | 9/2016 | Tada | ...................... | H10B 63/30 |
| 2017/0207387 A1* | 7/2017 | Yang | .................... | H10N 70/24 |
| 2019/0273117 A1* | 9/2019 | Hung | .................... | H10N 50/80 |
| 2020/0152702 A1 | 5/2020 | Ando et al. | | |
| 2023/0320240 A1* | 10/2023 | Cai | .................... | H10N 70/021 |
| | | | | 257/4 |

FOREIGN PATENT DOCUMENTS

| | | | |
|---|---|---|---|
| TW | I671895 B | 9/2019 |
| TW | I709223 B | 11/2020 |

OTHER PUBLICATIONS

Taiwan Patent and Trademark Office; Prepared by: Jianq Chyun Intellectual Property Office; Application No. 111129293; Office Action mailed Jun. 6, 2023; 5 pages.

* cited by examiner

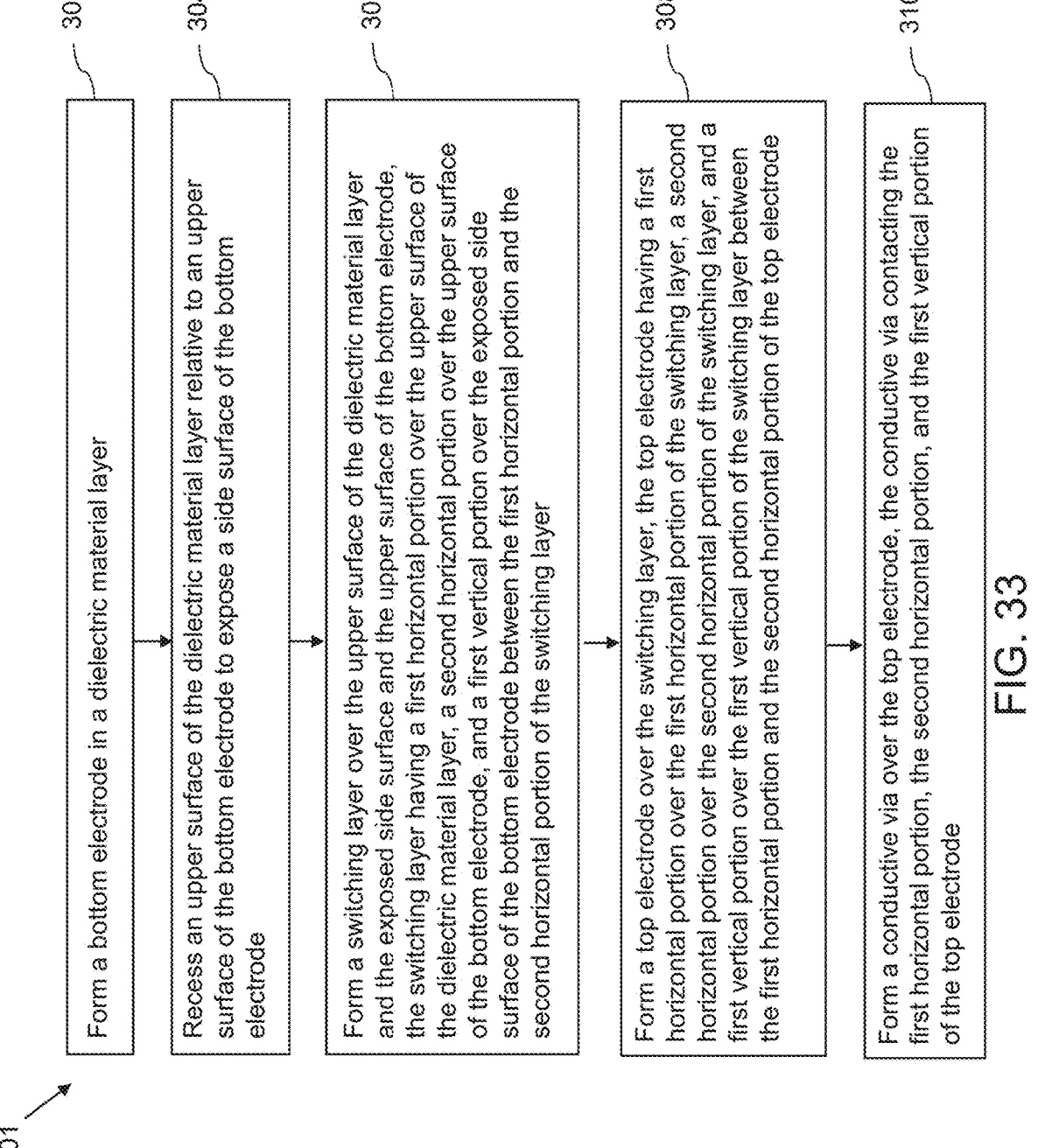

301

302 — Form a bottom electrode in a dielectric material layer

304 — Recess an upper surface of the dielectric material layer relative to an upper surface of the bottom electrode to expose a side surface of the bottom electrode 306 — Form a switching layer over the upper surface of the dielectric material layer and the exposed side surface and the upper surface of the bottom electrode, the switching layer having a first horizontal portion over the upper surface of the dielectric material layer, a second horizontal portion over the upper surface of the bottom electrode, and a first vertical portion over the exposed side surface of the bottom electrode between the first horizontal portion and the second horizontal portion of the switching layer 308 — Form a top electrode over the switching layer, the top electrode having a first horizontal portion over the first horizontal portion of the switching layer, a second horizontal portion over the second horizontal portion of the switching layer, and a first vertical portion over the first vertical portion of the switching layer between the first horizontal portion and the second horizontal portion of the top electrode 310 — Form a conductive via over the top electrode, the conductive via contacting the first horizontal portion, the second horizontal portion, and the first vertical portion of the top electrode

FIG. 33

RESISTIVE MEMORY DEVICE WITH ENHANCED LOCAL ELECTRIC FIELD AND METHODS OF FORMING THE SAME

RELATED APPLICATIONS

This application claims the benefit of priority from a U.S. provisional application Ser. No. 63/279,392, titled "RRAM with Enhanced Local Electric Field," filed on Nov. 15, 2021, the entire contents of which are incorporated herein by reference.

BACKGROUND

Resistive memory devices use a memory element that can provide at least two resistive states providing different levels of electrical resistance. An example of an emerging resistive memory device technology is resistive random-access memory (RRAM or ReRAM). A ReRAM device is a non-volatile memory device that operates by changing the resistance across a solid-state dielectric material. Other emerging non-volatile memory technologies that utilize similar resistive switching principles include phase-change memory (PCM), magnetoresistive random-access memory (MRAM), conductive-bridging RAM (CBRAM) and carbon nanotube (CNT) memory. These emerging technologies are often considered as potential replacements for flash memory. However, to date these technologies have not been widely adopted. There is a continuing need for improvements in resistive memory technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 33 is a flowchart illustrating a method of fabricating a resistive memory device according to an embodiment of the present disclosure.

DETAILED DESCRIPTION

Figures 1A, 1B:
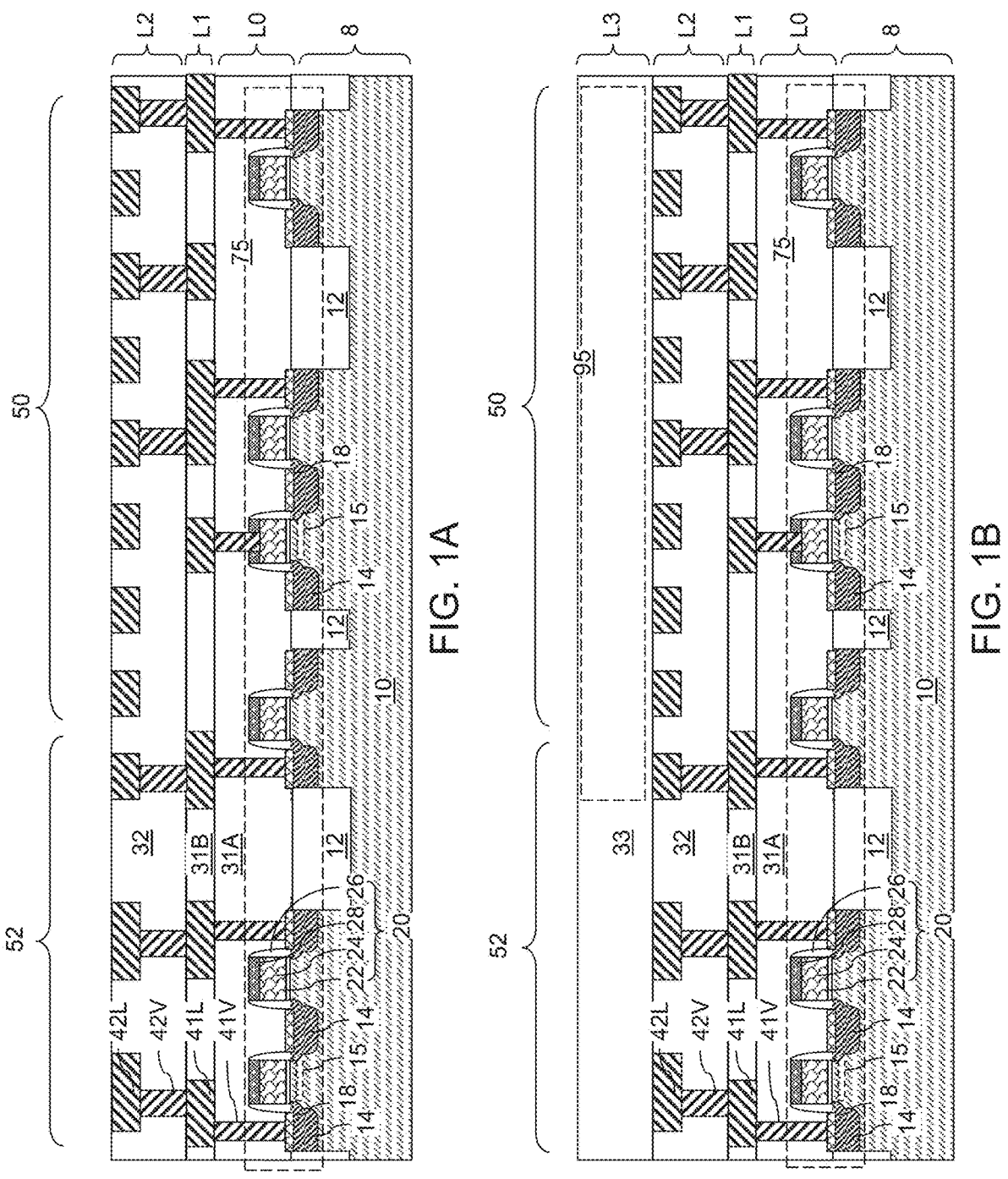
FIG. 1A is a vertical cross-sectional view of a first exemplary structure prior to formation of an array of memory devices according to an embodiment of the present disclosure.
FIG. 1B is a vertical cross-sectional view of the first exemplary structure during formation of the array of memory devices according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, various embodiments include resistive memory devices, such as resistive random-access memory (ReRAM) devices, and methods of fabricating resistive memory devices having a non-planar switching layer and a non-planar top electrode. The various embodiments disclosed herein may provide resistive memory devices having a reduced operating voltage.

As used herein, a "resistive memory device" includes a memory device in which data may be stored in a memory element by changing the electrical resistance of the memory element. The change in electrical resistance of the memory element may be incurred rapidly (e.g., in less than 10 minutes, such as less than 1 minute, including less than 1 second), may be non-volatile (i.e., the memory element will retain its resistance state in the absence of applied power for a prolonged time period, such as greater than 24 hours), and may be reversible. A resistive memory device typically includes a large number of independently functioning memory cells (such as more than $10^3$, more than $10^5$, more than $10^6$, or more than $10^9$ memory cells) organized into a memory array, where each memory cell of the memory array may include a memory element that can provide at least two resistive states providing different levels of electrical resistance.

The resistive states of the individual memory elements of a resistive memory device may be modified by applying electrical stress to the memory elements, such as through voltage or current pulsing. In the case of ReRAM memory devices, for example, the memory elements may have an initial first state of electrical resistance. In embodiments, the memory elements may include a dielectric material, and their initial state of electrical resistance may be a relatively highly resistive state. An initial, one-time "forming" step (also known as an "electroforming" step) may be performed by applying one or more voltage pulses at a sufficiently high voltage to induce a soft breakdown in the material of the memory elements. Following this "forming" step, the electrical resistance of the memory elements may be significantly decreased, such that they are in a stable Low Resistance State (LRS).

To reverse this process, a "Reset" process may be performed by applying one or more additional voltage pulses, which may have opposite polarity from the voltage pulse(s) used during the "forming" step, that causes the electrical resistance of the memory elements to increase, such that they are in a stable High Resistance State (HRS). The "Reset" process may break the conduction paths, or "filaments," through the memory elements, causing the memory elements to again become relatively highly resistive. The resistivity of the memory elements after a "Reset" may be close to their original resistive state prior to the "forming" step. A "Set" process may be performed by applying one or more additional voltage pulses, which may have the same polarity as the voltage pulse(s) used during the initial "forming" step, to cause the conduction paths to re-form, and convert the memory elements back to the Low Resistance State (LRS).

Thus, individual memory cells of the memory array may be programmed by changing the memory elements of the cell from a High Resistance State (HRS) to a Low Resistance State (LRS), or vice versa. During a read operation, a low voltage may be applied to the memory elements, and the logic state of each memory cell may be determined based on the current flow through the memory cell. A relatively higher current flow indicates that the memory element in the cell has a Low Resistance State (LRS), while a relatively lower current flow indicates that the memory element has a High Resistance State (HRS). The difference in the detected current between memory elements having a High Resistance State (HRS) and a Low Resistance State (LRS) may be referred to as the "memory window" of the resistive memory device. In some embodiments, the high current flow (i.e., LRS) may indicate a stored data value of "1", while a low current flow (i.e., HRS) may indicate a stored data value of "0".

One type of resistive memory device may include a memory element having a planar configuration. The memory element may include a planar switching layer (which may also be referred to as a "storage layer") comprised of a dielectric material, and a planar electrode (which may also be referred to as a "top electrode") comprised of a conductive material located over the planar switching layer. The switching layer and the top electrode may form a layer stack that is sandwiched between a pair of conductive members that may be used to apply a voltage across the layer stack. In embodiments in which the planar switching layer and the planar top electrode extend in a horizontal direction (i.e., parallel to the surface of a support substrate), the conductive members may include a bottom electrode that contacts the lower surface of the switching layer, and an upper conductive member, such as a conductive via, that contacts the upper surface of the top electrode. A resistive memory device having a planar configuration as described above may be an attractive option for back-end-of-line (BEOL) integration due to the ease of manufacture of the individual memory elements.

One issue with current resistive memory devices having a planar configuration is that a relatively high voltage across the planar switching layer and the planar top electrode may be required to change the memory element between a High Resistance State (HRS) and a Low Resistance State (LRS). This may result in high operating voltages for the memory device.

In order to address the issue of high operating voltages in resistive memory devices, such as a resistive random-access memory (ReRAM) device, the various embodiments disclosed herein include a resistive memory device including a non-planar switching layer and a non-planar top electrode. The non-planar switching layer and the non-planar top electrode may form a layer stack located between a bottom electrode and a conductive via. The layer stack including the non-planar switching layer and the non-planar top electrode may conform to a non-planar profile of the bottom electrode. In various embodiments, the switching layer may include a first horizontal portion over the upper surface of a dielectric material layer, a second horizontal portion over an upper surface of the bottom electrode that projects above the upper surface of the dielectric material layer, and a first vertical portion that extends over a side surface of the bottom electrode between the first horizontal portion and the second horizontal portion of the switching layer. In addition, the top electrode may include a first horizontal portion over the first horizontal portion of the switching layer, a second horizontal portion over the second horizontal portion of the switching layer, and a first vertical portion that extends over the first vertical portion of the switching layer between the first horizontal portion and the second horizontal portion of the top electrode. The conductive via may contact the first horizontal portion, the second horizontal portion, and the first vertical portion of the top electrode.

Accordingly, the layer stack including the non-planar switching layer and the non-planar top electrode may extend continuously over a corner portion of the bottom electrode in which the side surface meets the upper surface of the bottom electrode. During operation of the resistive memory device, charge crowding near the corner portion of the bottom electrode may provide a localized increase in the electric field. This enhanced electric field may facilitate switching of the switching layer of the memory device between a High Resistance State (HRS) and a Low Resistance State (LRS). Thus, a relatively lower voltage may be applied across the non-planar switching layer and the top electrode to change the switching layer between a High Resistance State (HRS) and a Low Resistance State (LRS). This may enable the operating voltage of the memory device to be effectively reduced.

Referring to FIG. 1A, a vertical cross-sectional view of a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

The exemplary structure may also include a peripheral logic region 52 in which electrical connections between each array of non-volatile memory cells and a peripheral circuit including field effect transistors may be subsequently formed. Areas of the memory array region 50 and the logic region 52 may be used to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of memory devices and are herein referred to as lower interconnect-level structures (L0, L1, L2). In case a two-dimensional array of memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

FIG. 1B is a vertical cross-sectional view of the first exemplary structure during formation of an array of memory devices, according to an embodiment of the present disclosure. Referring to FIG. 1B, an array 95 of non-volatile memory cells, such as resistive memory devices, may be formed in the memory array region 50 over the second interconnect-level structure L2. The details for the structure and the processing steps for the array 95 of non-volatile memory cells are subsequently described in detail below. A third ILD layer 33 may be formed during formation of the array 95 of non-volatile memory cells. The set of all structures formed at the level of the array 95 of non-volatile memory cells is herein referred to as a third interconnect-level structure L3.

Figure 1C:
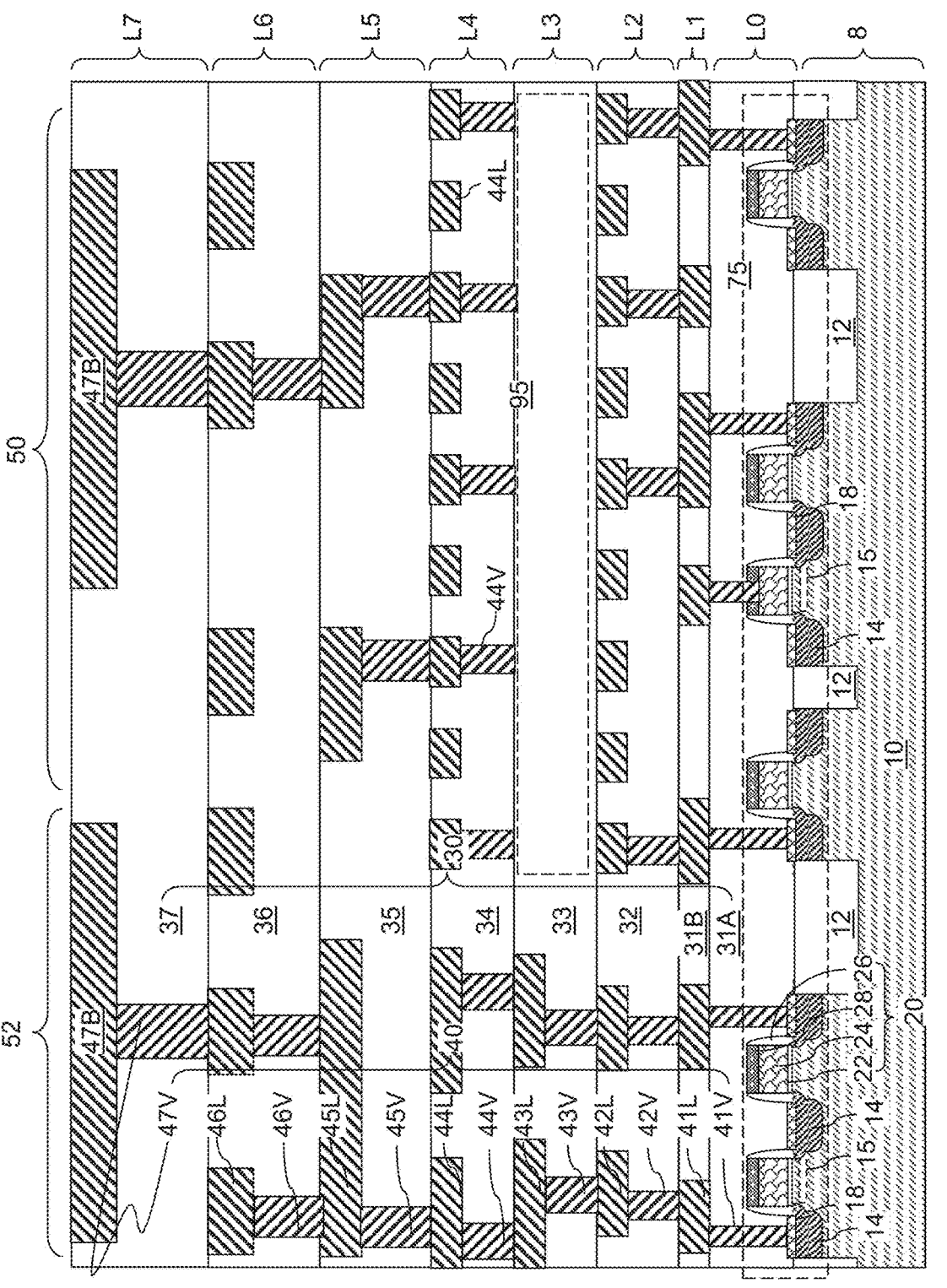
FIG. 1C is a vertical cross-sectional view of the first exemplary intermediate structure after formation of upper-level metal interconnect structures according to an embodiment of the present disclosure.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may use C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by using two single damascene processes, or may be simultaneously formed as a unitary structure using a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described using an embodiment in which the array 95 of non-volatile memory cells, such as resistive memory devices, may be formed as a component of a third interconnect-level structure L3, embodiments are expressly contemplated herein in which the array 95 of non-volatile memory cells may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells may be provided within multiple interconnect-level structures in the memory array region 50. While the present disclosure is described using an embodiment in which an array 95 of non-volatile memory cells may be formed in a single interconnect-level structure, embodiments are expressly contemplated herein in which an array 95 of non-volatile memory cells may be formed over two vertically adjoining interconnect-level structures. Furthermore, embodiments are expressly contemplated herein in which an array 95 of non-volatile memory cells may be formed on or within the semiconductor material layer 10 (e.g., in a front-end-of-line (FEOL) operation).

Figure 2:
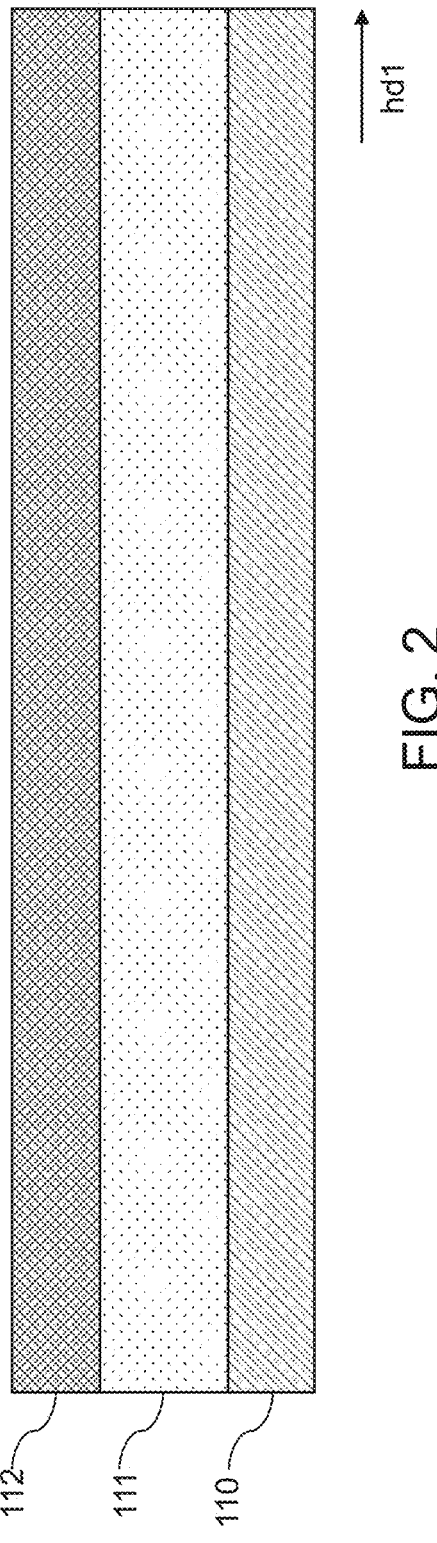
FIG. 2 is a vertical cross-sectional view of an exemplary intermediate structure during a process of forming a resistive memory device including a first dielectric material layer and a metal feature formed over a substrate according to an embodiment of the present disclosure.

FIGS. 2-18 are sequential vertical cross-sectional views of an exemplary structure during a process of forming a resistive memory device according to various embodiments of the present disclosure. The resistive memory device may form a memory cell that is a part of an array 95 of memory cells such as shown in FIGS. 1B and 1C. Referring to FIG. 2, a first dielectric material layer 111 may be deposited over a substrate 110. The substrate 110 may be any suitable substrate, such as a semiconductor device substrate, and may include control elements formed during FEOL processes. In some embodiments, one or more additional dielectric material layers, such as ILD layers, may be deposited between the substrate 110 and the first dielectric material layer 111. In such embodiments, the first dielectric material layer 111 may be omitted. For example, ILD layer 32 discussed above with respect to FIGS. 1B and 1C may be substituted for the first dielectric material layer 111.

The first dielectric material layer 111 may be formed of any suitable dielectric material such as silicon oxide ($SiO_2$), or the like, or high-k dielectric materials such as silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), silicon carbide (SiC) or the like. In some embodiments, the first dielectric material layer 111 may be a native oxide layer formed on the substrate 110. Other suitable dielectric materials are also within the contemplated scope of disclosure.

The first dielectric material layer 111 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Referring again to FIG. 2, a metal line 112 may be formed over the first dielectric material layer 111. In some embodiments, one or more additional metal interconnect structures, such as metal via structures and metal lines, may be deposited between the substrate 110 and the metal line 112. In such embodiments, the metal line 112 may be omitted. For example, a metal line 42L discussed above with respect to FIGS. 1B and 1C may be substituted for metal line 112.

In various embodiments, the metal line 112 may be partially or fully embedded within the first dielectric material layer 111 such that the metal line 112 is surrounded by the first dielectric material layer 111 on its bottom and lateral side surfaces. For example, the metal line 112 may extend within the first dielectric material layer 111 along a first horizontal direction (hd1 in FIG. 2) and may be laterally surrounded by the first dielectric material layer 111 along a second horizontal direction that is perpendicular to the first horizontal direction (i.e., into and out of the page in FIG. 2). In some embodiments, a plurality of metal lines 112 embedded within the first dielectric material layer 111 may extend parallel to one another along the first horizontal direction, hd1, and may be separated from one another along the second horizontal direction by the first dielectric material layer 111. In various embodiments, an upper surface of the metal line 112 may be substantially co-planar with the upper surface of the first dielectric material layer 111.

The metal line 112 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. In some embodiments, the metal line 112 may include a metallic liner (such as a layer of TiN, TaN, or WN) contacting the first dielectric material layer 111, and a metallic fill material (such as W, Cu, Co, Mo, Ru, other elemental metals, or an alloy or a combination thereof) located over the metallic liner. Other suitable electrically conductive materials for the metal line 112 are within the contemplated scope of disclosure.

The metal line 112 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), electrochemical deposition, or combinations thereof.

Figure 3:
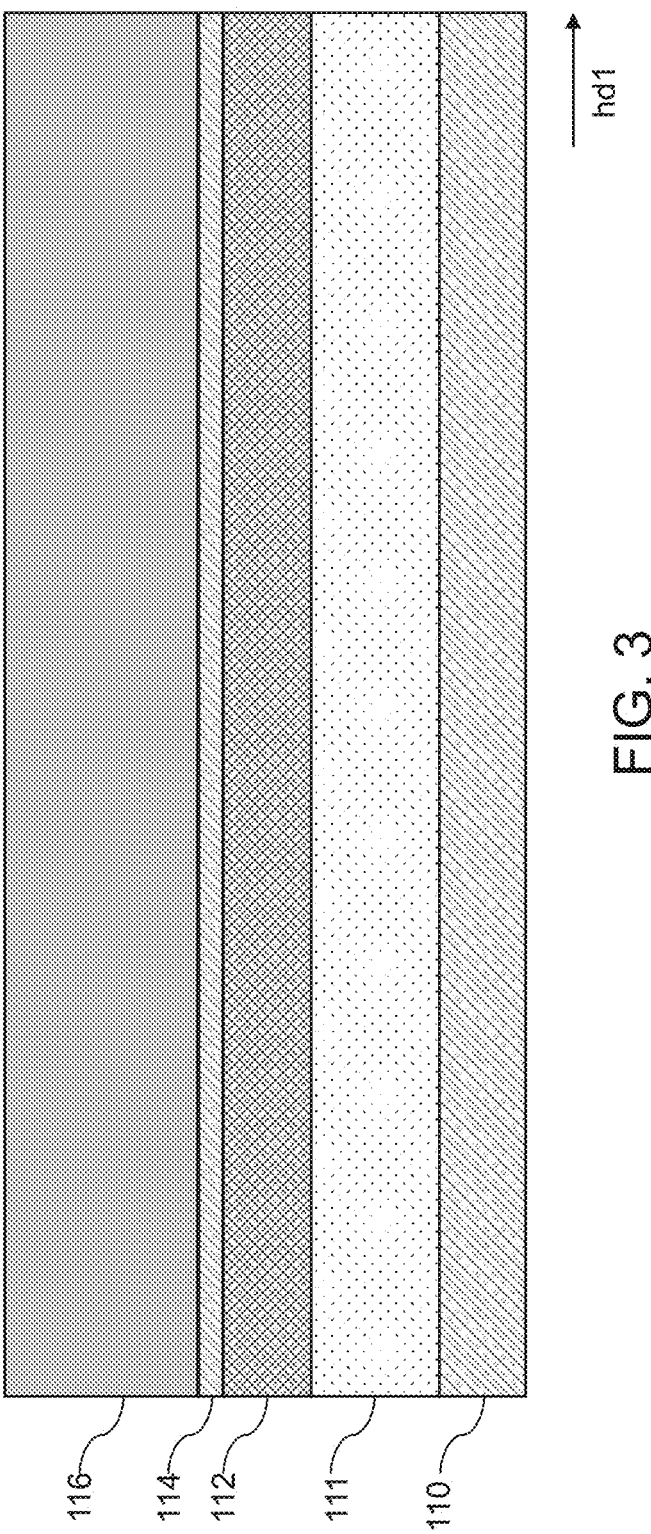
FIG. 3 is a vertical cross-sectional view of an exemplary structure during a process of forming a resistive memory device that includes a second dielectric material layer deposited over the metal line and a third dielectric material layer deposited over the second dielectric material layer according to an embodiment of the present disclosure.

FIG. 3 is a vertical cross-sectional view of an exemplary structure during a process of forming a resistive memory device that includes a second dielectric material layer 114 deposited over the metal line 112 and a third dielectric material layer 116 deposited over the second dielectric material layer 114 according to an embodiment of the present disclosure. Referring to FIG. 3, the second dielectric material layer 114 may be deposited over the upper surface of the metal line 112 and the exposed upper surface of the first dielectric material layer 111. In embodiments, the second dielectric material layer 114 may be composed of a suitable dielectric material as described above, and may be deposited using a suitable deposition process as described above. In some embodiments, the second dielectric material layer 114 may be composed of a different dielectric material than the first dielectric material layer 111. Alternatively, the second dielectric material layer 114 and the first dielectric material layer 111 may be composed of the same dielectric material. In various embodiments, following the deposition of the second dielectric material layer 114, the metal line 112 may be embedded within the dielectric material of the first dielectric material layer 111 and the second dielectric material layer 114 over the bottom, top, and lateral side surfaces of metal line 112.

Referring again to FIG. 3, the third dielectric material layer 116 may be deposited over the upper surface of the second dielectric material layer 114 using a suitable deposition process as described above. The third dielectric material layer 116 may be composed of a suitable dielectric material as described above. In various embodiments, the second dielectric material layer 114 may be composed of a different dielectric material than the third dielectric material layer 116. In some embodiments, the second dielectric material layer 114 may be an etch stop layer having different etch characteristics (i.e., a higher etch resistivity) than the material of the third dielectric material layer 116. In one non-limiting embodiment, the second dielectric material layer 114 may include silicon carbide, and the third dielectric material layer 116 may include silicon oxide formed using a tetraethyl orthosilicate (TEOS) precursor. The third dielectric material layer 116 may have a thickness that is greater than the thickness of the second dielectric material layer 114.

In an alternative embodiment, the second dielectric material layer 114 may be omitted, and the third dielectric material layer 116 may be deposited directly over the upper surface of metal line 112 and the exposed upper surface of the first dielectric material layer 111. In such an embodiment, there is no etch stop layer between the third dielectric material layer 116 and the upper surface of the metal line 112.

Figure 4:
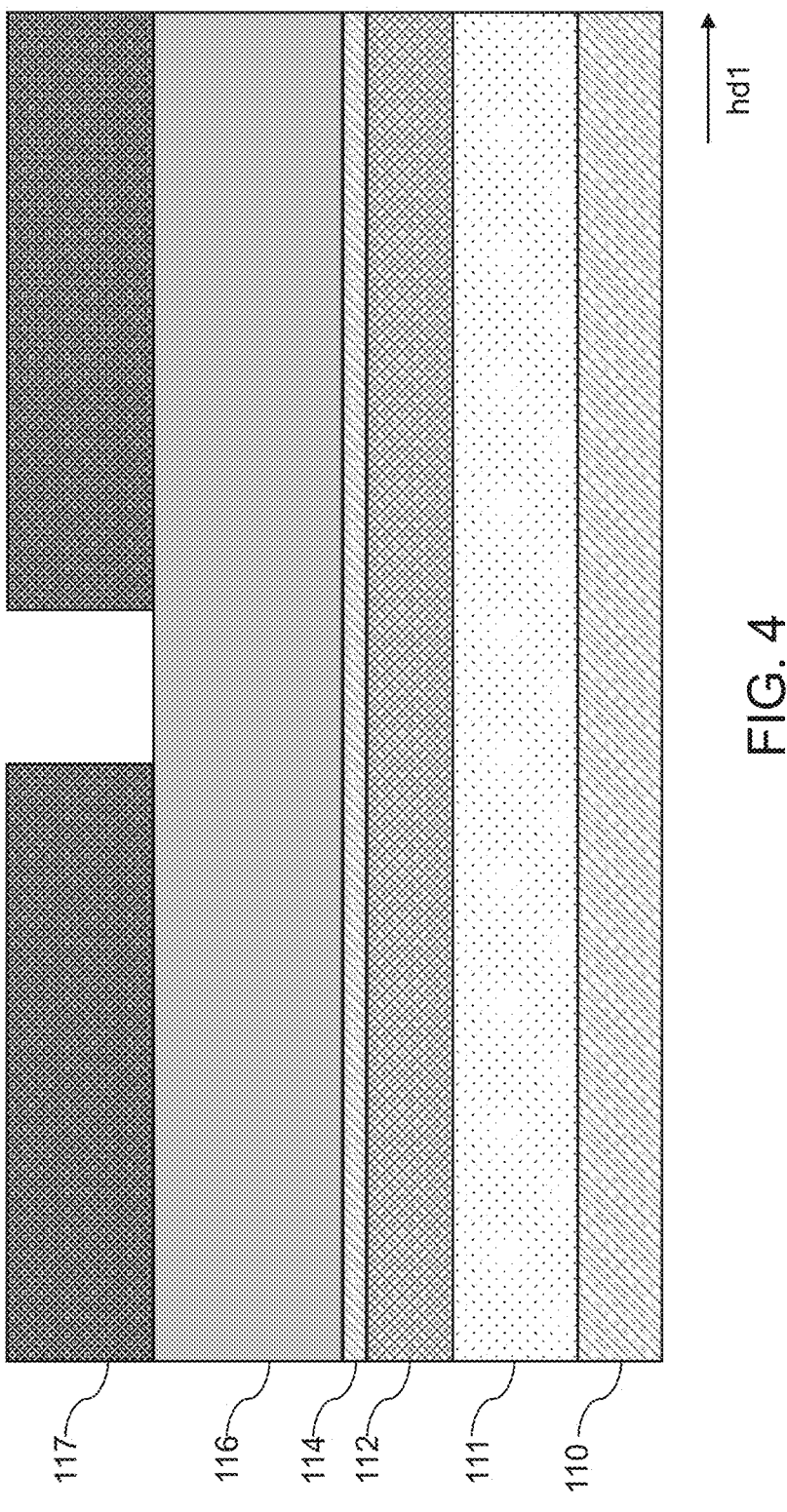
FIG. 4 is a vertical cross-sectional view of an exemplary structure during a process of forming a resistive memory device that includes a patterned mask formed over the upper surface of the third dielectric material layer according to an embodiment of the present disclosure.

FIG. 4 is a vertical cross-sectional view of an exemplary structure during a process of forming a resistive memory device that includes a patterned mask 117 formed over the upper surface of the third dielectric material layer 116 according to an embodiment of the present disclosure. Referring to FIG. 4, the mask 117, which may include a layer of photoresist and/or a hard mask, may be patterned using a photolithographic technique to form one or more openings through the mask corresponding to the location of a bottom electrode to be subsequently formed.

Figure 5:
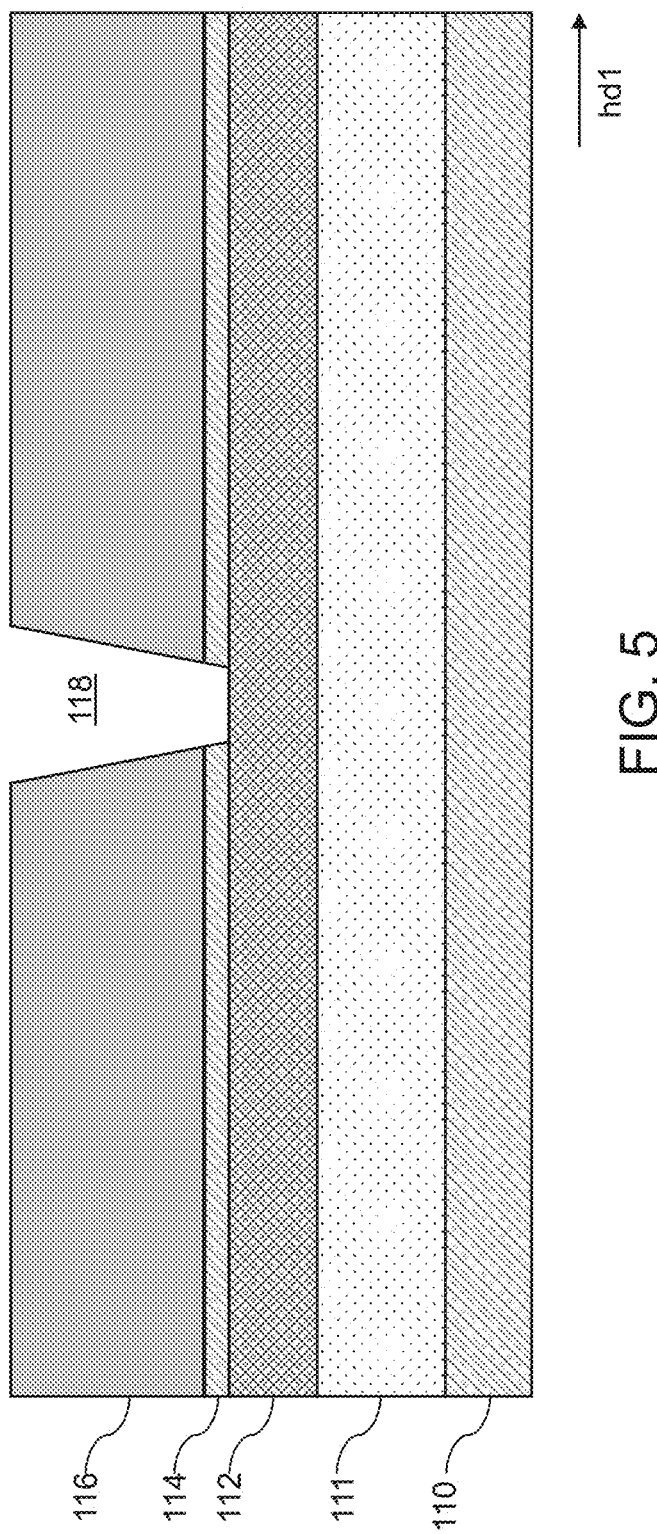
FIG. 5 is a vertical cross-section view of an exemplary structure during a process of forming a resistive memory device showing an opening formed through the third dielectric material layer and the second dielectric material layer to expose the upper surface of the metal line according to an embodiment of the present disclosure.

FIG. 5 is a vertical cross-section view of an exemplary structure during a process of forming a resistive memory device showing an opening 118 formed through the third dielectric material layer 116 and the second dielectric material layer 114 to expose the upper surface of the metal line 112 according to an embodiment of the present disclosure. Referring to FIG. 5, the exemplary intermediate structure may be etched through the patterned mask 117 to remove portions of the third dielectric material layer 116 and the second dielectric material layer 114 and expose the upper surface of the metal line 112. In various embodiments, a first etching process, which may be an anisotropic etching process, may be used to etch through the third dielectric material layer 116. The first etching process may stop at the second dielectric material layer 114. Then, a second etching process, which may also be an anisotropic etching process, may be used to etch through the second dielectric material layer 114 and expose the metal line 112 at the bottom of the opening 118. In some embodiments, the second etching process may use a different etch chemistry than the first etching process. Following the etching process, the patterned mask 117 may be removed using a suitable process, such as by ashing or by dissolution using a solvent.

Figure 6:
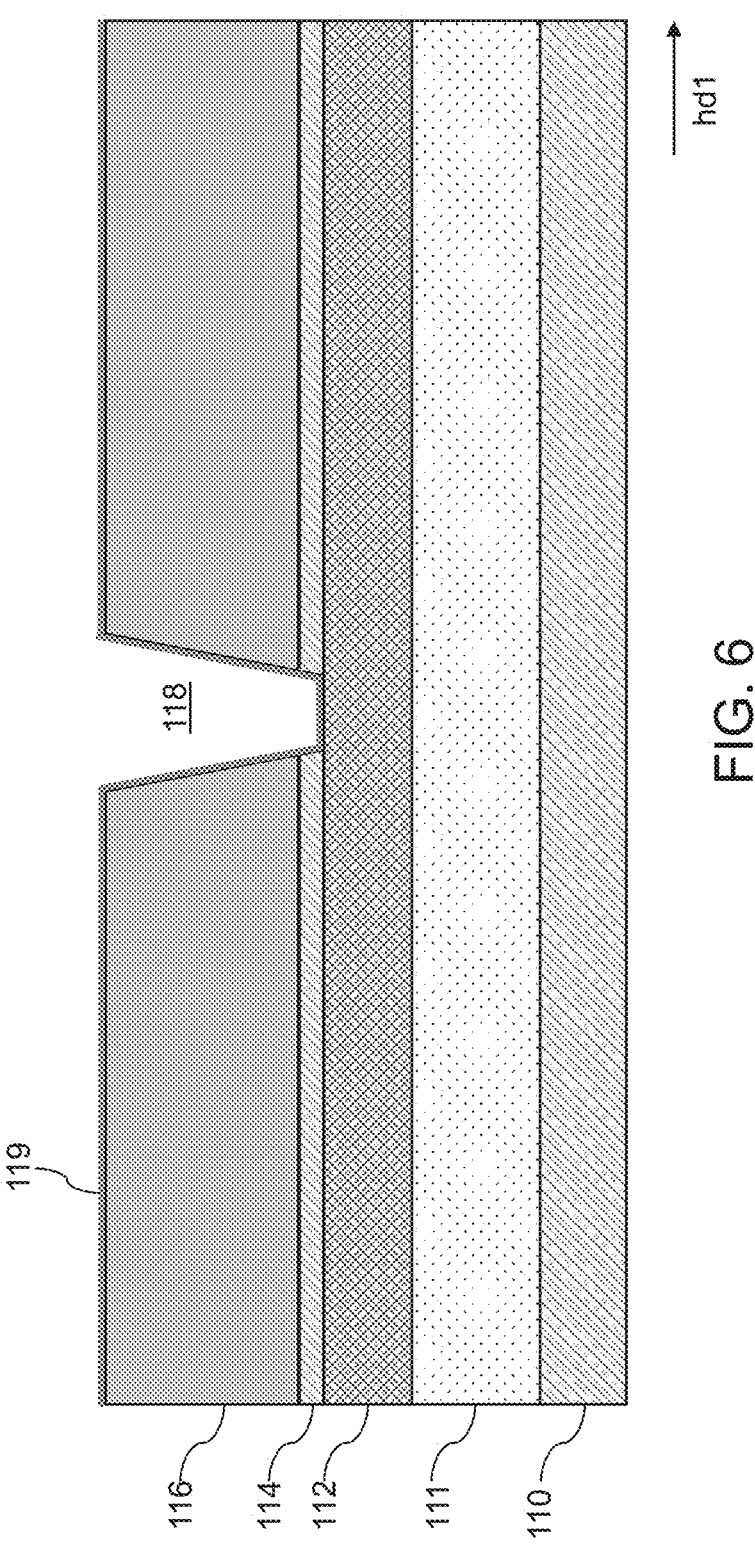
FIG. 6 is a vertical cross-section view of an exemplary structure during a process of forming a resistive memory device showing a barrier layer deposited over the upper surface of the third dielectric material layer, over the exposed side surfaces of the third dielectric material layer and the second dielectric material layer along the sidewalls of the opening, and over the exposed surface of the metal line on the bottom surface of the opening according to an embodiment of the present disclosure.

FIG. 6 is a vertical cross-section view of an exemplary structure during a process of forming a resistive memory device showing a barrier layer 119 deposited over the upper surface of the third dielectric material layer 116, over the exposed side surfaces of the third dielectric material layer 116 and the second dielectric material layer 114 along the sidewalls of the opening 118, and over the exposed surface of the metal line 112 on the bottom surface of the opening 118. The barrier layer 119 may include one or more layers of a suitable metallic liner material, such as TiN, TaN or WN. Other suitable materials for the barrier layer 119 are within the contemplated scope of disclosure. The barrier layer 119 may be deposited using a suitable deposition process, such as physical vapor deposition (PVD), sputtering, chemical vapor deposition (CVD), atomic layer deposition (ALD), plasma-enhanced chemical vapor deposition (PECVD), electrochemical deposition, or the like.

Figure 7:
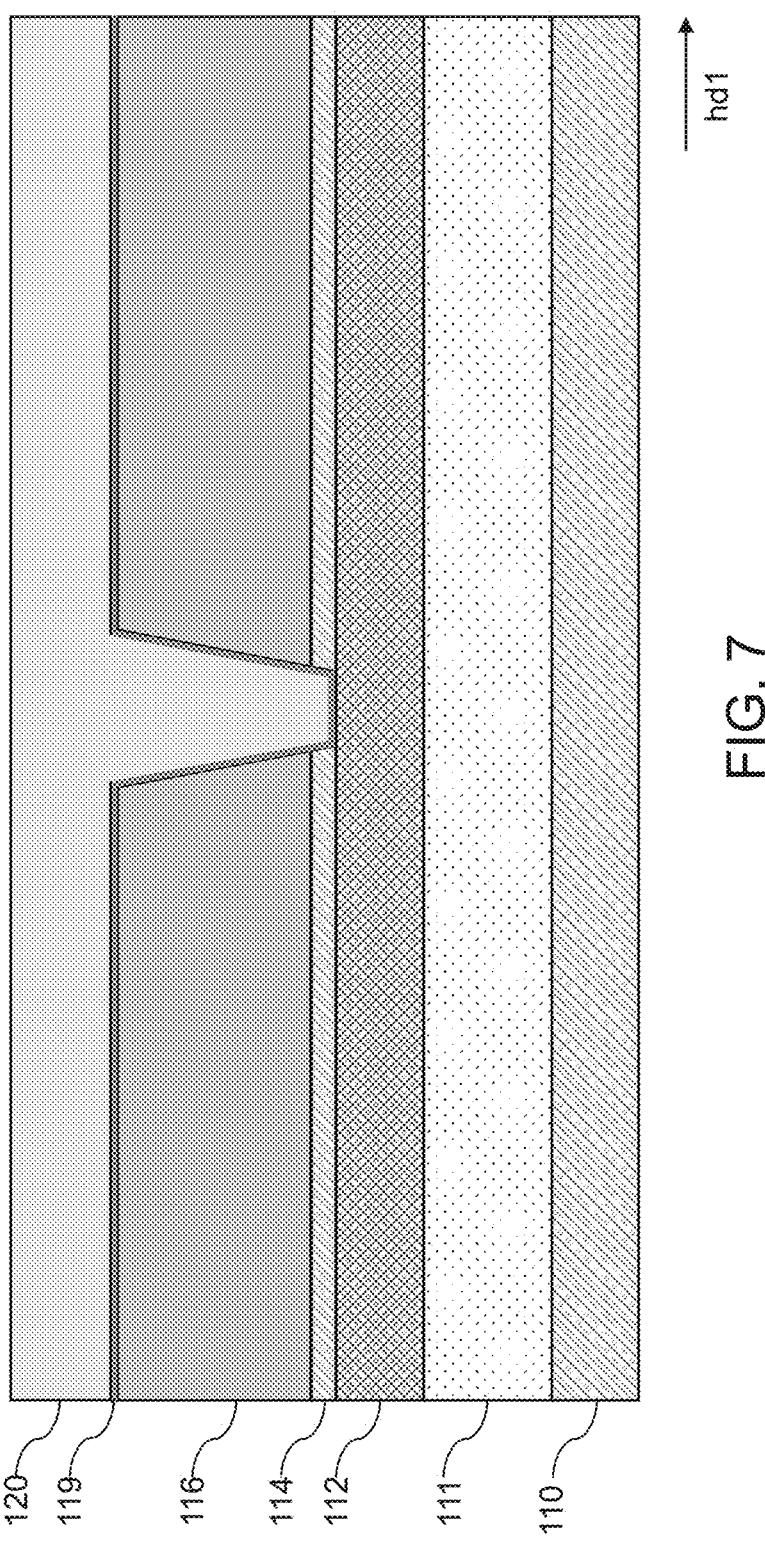
FIG. 7 is a vertical cross-section view of an exemplary structure during a process of forming a resistive memory device showing a conductive material layer deposited over the barrier layer according to an embodiment of the present disclosure.

FIG. 7 is a vertical cross-section view of an exemplary structure during a process of forming a resistive memory device showing a conductive material layer 120 deposited over the barrier layer 119 according to an embodiment of the present disclosure. In various embodiments, the conductive material layer 120 may be deposited over the barrier layer 119 such that the conductive material layer 120 fills a remaining volume of the opening 118. The conductive material layer 120 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable electrically conductive materials for the conductive material layer 120 are within the contemplated scope of disclosure. The conductive material layer 120 may be deposited using a suitable deposition method as described above.

Figure 8:
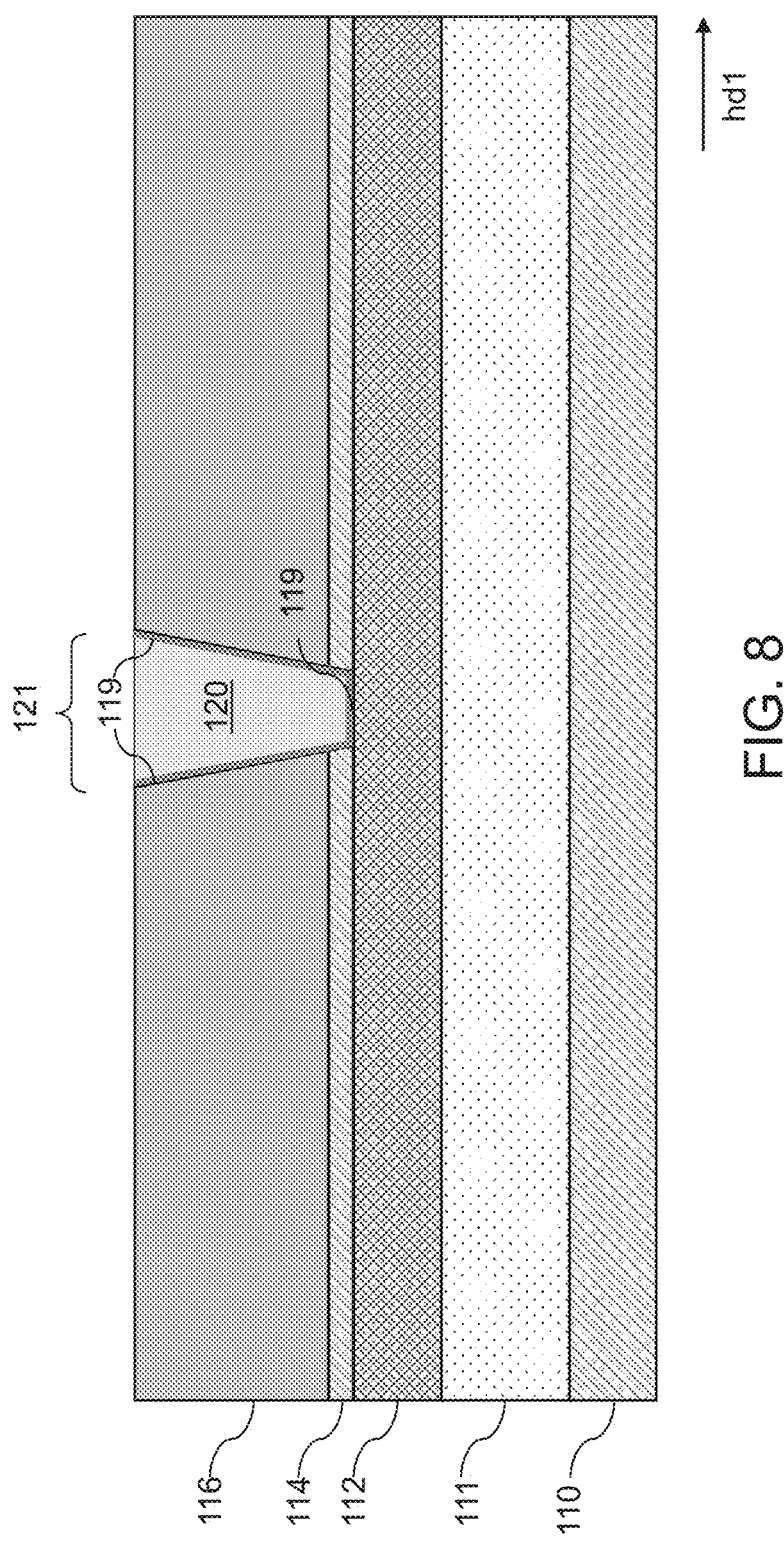
FIG. 8 is a vertical cross-section view of an exemplary structure during a process of forming a resistive memory device following a planarization process to remove portions of the conductive material layer and the barrier layer from over the upper surface of the third dielectric material layer according to an embodiment of the present disclosure.

FIG. 8 is a vertical cross-section view of an exemplary structure during a process of forming a resistive memory device following a planarization process to remove portions of the conductive material layer 120 and the barrier layer 119 from over the upper surface of the third dielectric material layer 116 according to an embodiment of the present disclosure. Referring to FIG. 8, a planarization process, such as a chemical mechanical planarization (CMP) process, may be used to remove portions of the conductive material layer 120 and the barrier layer 119 from over the upper surface of the third dielectric material layer 116. The remaining portions of the conductive material layer 120 and the barrier layer 119 may together form a bottom electrode 121 that contacts the upper surface of the metal line 112 and may be laterally surrounded by the second dielectric material layer 114 and the third dielectric material layer 116. The barrier layer 119 may be located on the outer surface of the bottom electrode 121 along the lateral sidewalls and bottom surface of the bottom electrode 121. The remaining portion of the conductive material layer 120 may form a conductive fill portion of the bottom electrode 121 that may be located radially inward from the barrier layer 119. In various embodiments, the upper surface of the bottom electrode 121 may be substantially co-planar with the upper surface of the third dielectric material layer 116. In some embodiments, a width dimension of the bottom electrode 121 (e.g., along the first horizontal direction hd1) may be between about 20 nm and about 30 nm at the upper surface of the bottom electrode, and may be between about 15 nm and about 20 nm at the bottom surface of the bottom electrode. The height dimension of the bottom electrode 121 between the upper surface and the bottom surface of the bottom electrode 121 may be between about 30 nm and about 60 nm. It will be understood that greater or lesser width and height dimensions of the bottom electrode 121 are within the contemplated scope of disclosure.

In some embodiments, a plurality of bottom electrodes 121 such as shown in FIG. 8 may be formed through the third dielectric material layer 116 and the second dielectric material layer 114. Each bottom electrode 121 of the plurality of bottom electrodes 121 may electrically contact a metal line 112 on a bottom surface of the bottom electrode 121. Each bottom electrode 121 may correspond to the location of a resistive memory device of an array 95 of resistive memory devices (see FIGS. 1B and 1C) to be subsequently formed.

Figure 9:
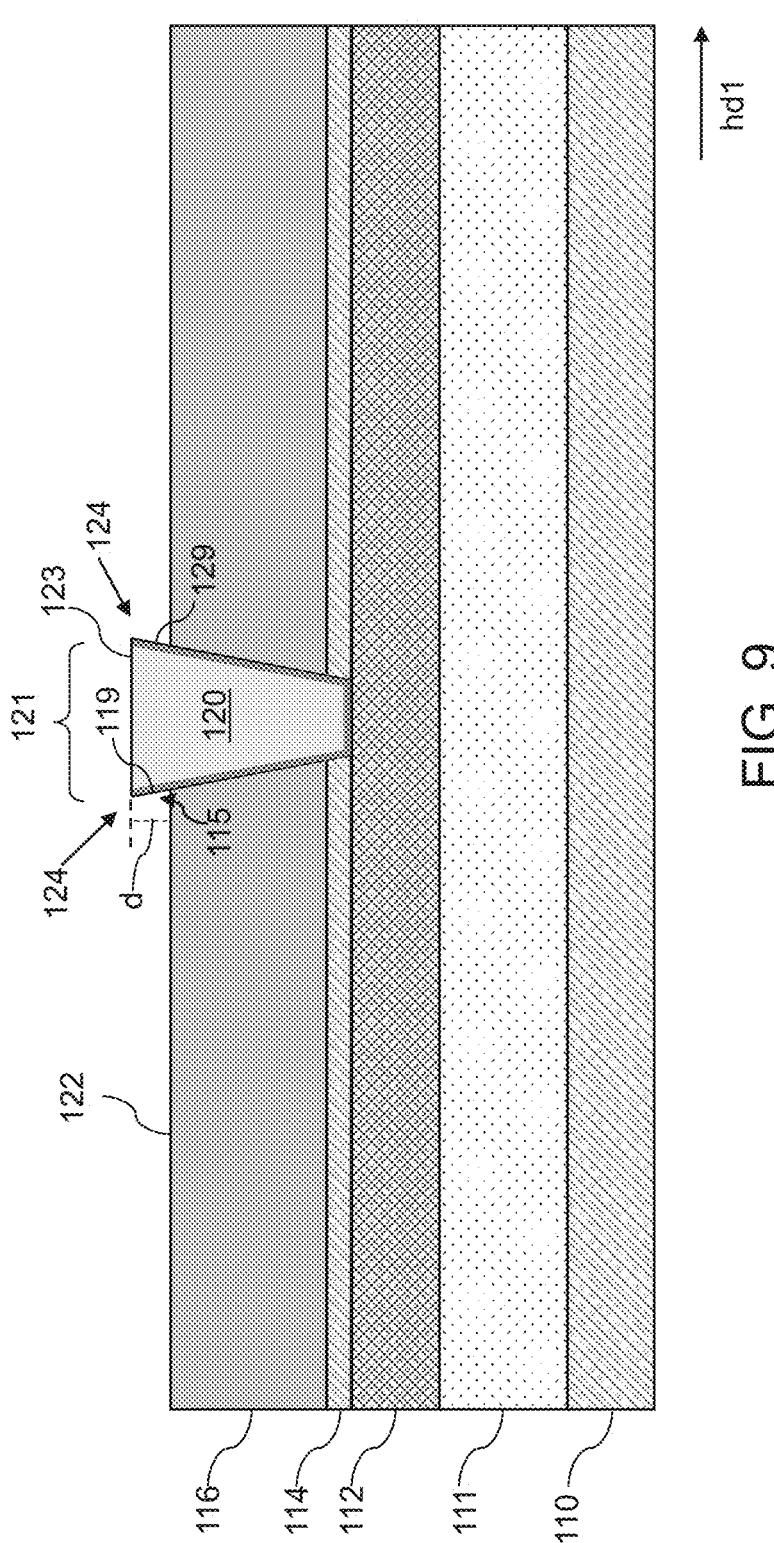
FIG. 9 is a vertical cross-section view of an exemplary structure during a process of forming a resistive memory device following an etching process that recesses the upper surface of the third dielectric material layer relative to the upper surface of the bottom electrode according to an embodiment of the present disclosure.

FIG. 9 is a vertical cross-section view of an exemplary structure during a process of forming a resistive memory device following an etching process that recesses the upper surface 122 of the third dielectric material layer 116 relative to the upper surface 123 of the bottom electrode 121 according to an embodiment of the present disclosure. Referring to FIG. 9, an etching process, such as a wet etching process, may be performed on the exemplary structure to remove a portion of the third dielectric material layer

116 such that the upper surface 122 of the third dielectric material layer 116 is recessed relative to the upper surface 123 of the bottom electrode 121. The etching process may use an etch chemistry that may have a higher etch selectivity for the third dielectric material layer 116 relative to the materials of the bottom electrode 121. In various embodiments, the etch rate of the third dielectric material layer 116 during the etching process may be at least 5 times greater, such as at least 10 times greater, including 100 times greater or more, than the etch rate of the bottom electrode 121 during the etching process.

In various embodiments, following the etching process the upper surface 122 of the third dielectric material layer 116 may be vertically recessed relative to the upper surface 123 of the bottom electrode 121 by a recess distance, d. In some embodiments, the recess distance, d, may be between about 3 nm and about 10 nm, although greater or lesser recess distances are within the contemplated scope of disclosure. A portion of the bottom electrode 121 may protrude above the upper surface 122 of the third dielectric material layer 116. The upper surface 123 of the bottom electrode 121, a portion of the side surface 129 of the bottom electrode 121, and the corner portion 124 where the side surface 129 meets the upper surface 123 of the bottom electrode 121, may be exposed following the etching process. In some embodiments, the bottom electrode 121 may have a cylindrical or frustoconical shape, and the side surface 129 may be a curved surface that extends continuously around the periphery of the bottom electrode 121. In other embodiments, the bottom electrode 121 may have a polygonal cross-sectional shape, such as a rectangular prism or frustopyramidal shape, and the side surface 129 may include a plurality of planar segments extending around the periphery of the bottom electrode 121.

In various embodiments, the portion of the bottom electrode 121 that protrudes above the upper surface 122 of the third dielectric material layer 116 may have a tapered side surface 129 that tapers radially inwardly between the corner portion 124 of the bottom electrode 121 and the upper surface 122 of the third dielectric material layer 116. In such embodiments, a reentrant portion 115 may be located adjacent to the exposed side surface 129 of the bottom electrode 121, where the reentrant portion 115 may be defined as a volume surrounding the bottom electrode 121 within which a vertical line segment extending from the upper surface 122 of the third dielectric material layer 116 contacts either the exposed side surface 129 or the corner portion 124 of the bottom electrode 121.

In embodiments in which a plurality of bottom electrodes 121 are formed through the third dielectric material layer 116 and the second dielectric material layer 114, following the etching process, each of the bottom electrodes 121 may project above the upper surface 122 of the third dielectric material layer 116 such that the upper surface 123, a portion of the side surface 129 and the corner portion 124 of each of the bottom electrodes 121 may be exposed.

Figure 10:
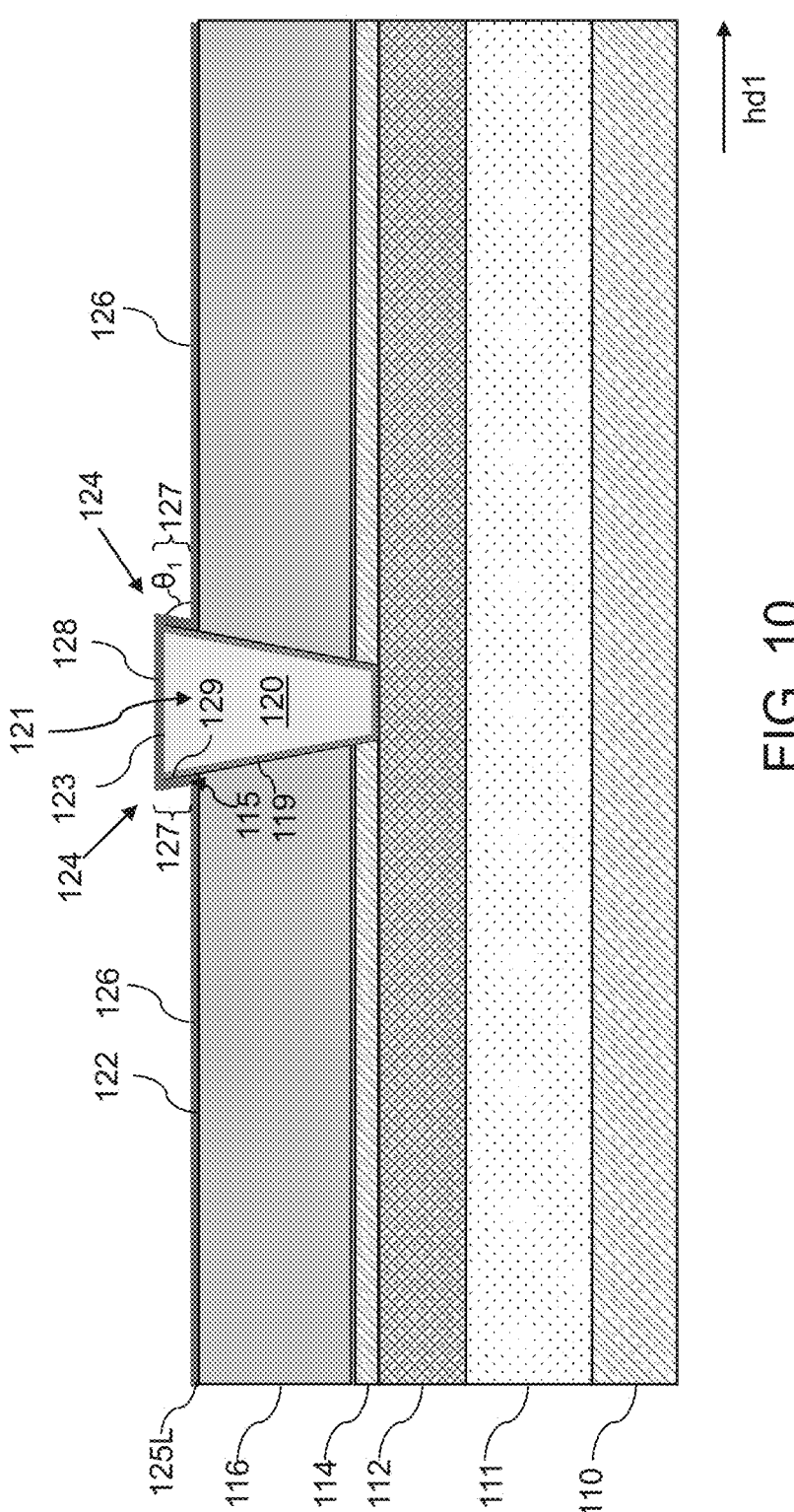
FIG. 10 is a vertical cross-section view of an exemplary structure during a process of forming a resistive memory device that shows a continuous switching layer deposited over the third dielectric material layer and the bottom electrode according to an embodiment of the present disclosure.

FIG. 10 is a vertical cross-section view of an exemplary structure during a process of forming a resistive memory device that shows a continuous switching layer 125L deposited over the third dielectric material layer 116 and the bottom electrode 121 according to an embodiment of the present disclosure. In various embodiments, the continuous switching layer 125L may be conformally deposited over the exposed upper surface 122 of the third dielectric material layer 116 and the exposed side surface 129, corner portion 124 and upper surface 123 of the bottom electrode 121. The continuous switching layer 125L may be deposited using a suitable deposition process as described above.

The continuous switching layer 125L may include a solid-state dielectric material that may be switchable between a High Resistance State (HRS) and a Low Resistance State (LRS). Suitable materials for the continuous switching layer 125L may include, for example, a dielectric material, a metal oxide and/or a high-k material, such as titanium dioxide ($TiO_2$), hafnium dioxide ($HFO_2$), hafnium-aluminum-dioxide ($HF_xAl_{1-x}O_2$), tantalum pentoxide ($Ta_2O_5$), tungsten dioxide ($WO_2$), zirconium dioxide ($ZrO_2$), hafnium zirconium oxide ($Hf_xZr_{1-x}O_2$, where $0.1 \leq x \leq 0.9$), aluminum oxide ($Al_2O_3$), nickel oxide (NiO), zinc oxide (ZnO) and silicon oxide ($SiO_2$). Other suitable materials having a resistive switching property are within the contemplated scope of disclosure. The continuous switching layer 125L may include single layer of material or multiple layers of materials that may have the same or different compositions.

Referring again to FIG. 10, the continuous switching layer 125L may include a first horizontal portion 126 that is located over the upper surface 122 of the third dielectric material layer 116, and a second horizontal portion 128 that is located over the upper surface 123 of the bottom electrode 121. The first horizontal portion 126 and the second horizontal portion 128 of the continuous switching layer 125L may each extend parallel to the first horizontal direction, hd1. The continuous switching layer 125L may further include a first vertical portion 127 that may extend over the side surface 129 of the bottom electrode 121 between the first horizontal portion 126 and the second horizontal portion 128. In embodiments in which the bottom electrode 121 has a cylindrical or frustoconical shape, the first vertical portion 127 of the continuous switching layer 125L may include a curved outer surface that extends continuously around the peripheral circumference of the side surface 129 of the bottom electrode 121. In embodiments in which the bottom electrode 121 has a polygonal cross-sectional shape, such as a rectangular prism or frustopyramidal shape, the first vertical portion 127 may have an outer surface including a plurality of planar segments extending around the periphery of the bottom electrode 121. In some embodiments, the first vertical portion 127 of the continuous switching layer 125L may extend at an oblique angle with respect to the first horizontal portion 126 and the second horizontal portion 128 of the continuous switching layer 125L. In some embodiments, the first vertical portion 127 of the continuous switching layer 125L may extend at an angle, $\theta_1$, with respect to the first horizontal portion 126 of the continuous switching layer 125L. In some embodiments, angle $\theta_1$ may be ≤90° such as between 60° and 90°. In embodiments in which the bottom electrode 121 includes a tapered side surface 129, a portion of the continuous switching layer 125L may be located within the reentrant portion 115 adjacent to the side surface 129 of the bottom electrode 121.

Figure 11:
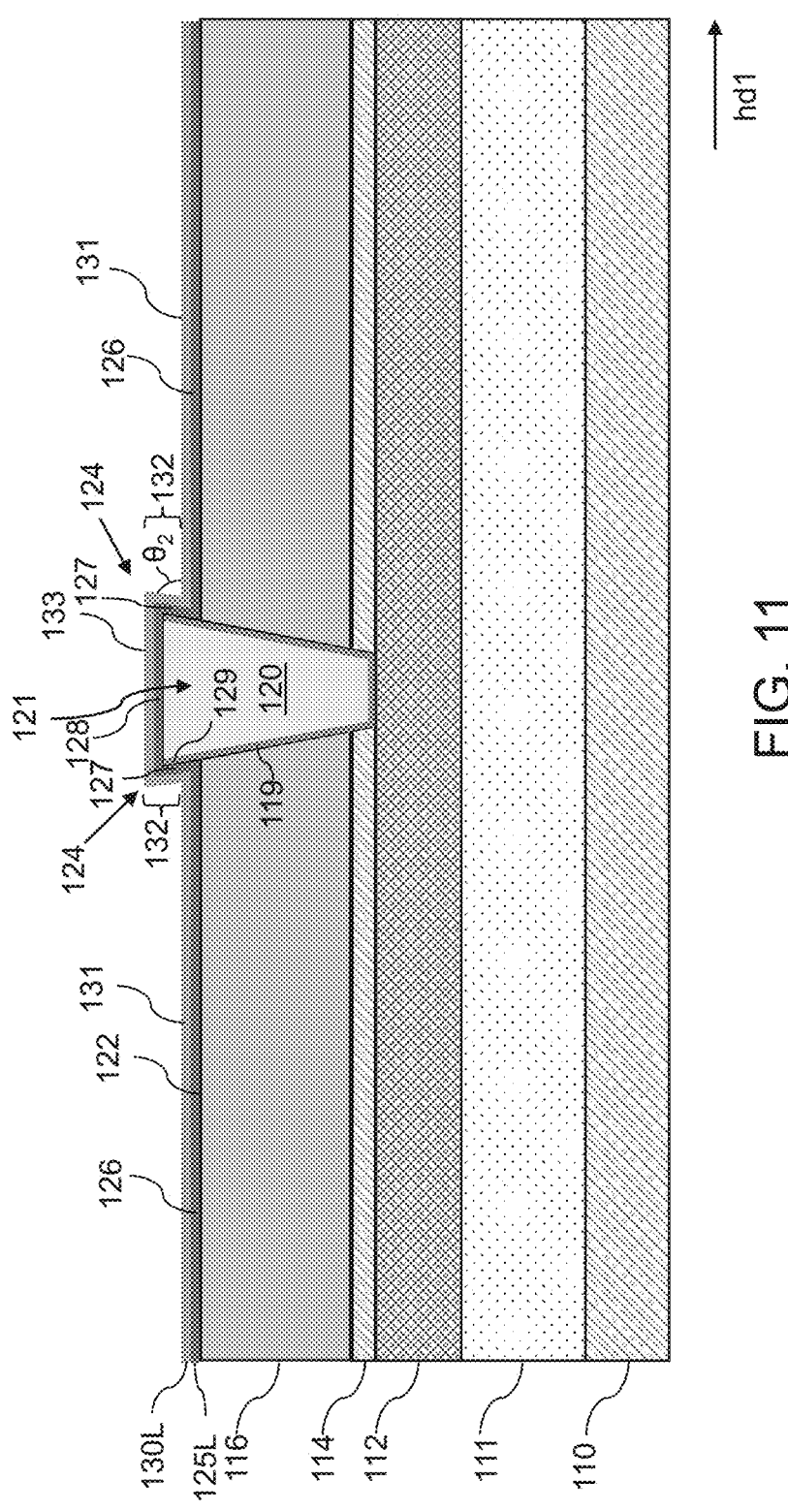
FIG. 11 is a vertical cross-section view of an exemplary structure during a process of forming a resistive memory device that shows a continuous top electrode deposited over the continuous switching layer according to an embodiment of the present disclosure.

FIG. 11 is a vertical cross-section view of an exemplary structure during a process of forming a resistive memory device that shows a continuous top electrode 130L deposited over the continuous switching layer 125L according to an embodiment of the present disclosure. In various embodiments, the continuous top electrode 130L may be conformally deposited over the first horizontal portion 126 of the continuous switching layer 125L, the first vertical portion 127 of the continuous switching layer 125L and the second horizontal portion 128 of the continuous switching layer 125L. The continuous top electrode 130L may be deposited using a suitable deposition process as described above.

The continuous top electrode 130L may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. Other suitable materials for the continuous top electrode 130L are within the contemplated scope of disclosure. The continuous top electrode 130L may include single layer of a conductive material or multiple layers of conductive materials that may have the same or different compositions.

Referring again to FIG. 11, the continuous top electrode 130L may include a first horizontal portion 131 that is located over the first horizontal portion 126 of the continuous switching layer 125L, and a second horizontal portion 133 that is located over the second horizontal portion 128 of the continuous switching layer 125L. The first horizontal portion 131 and the second horizontal portion 133 of the continuous top electrode 130L may each extend parallel to the first horizontal direction, hd1. The continuous top electrode 130L may further include a first vertical portion 132 that may extend over first vertical portion 127 of the continuous switching layer 125L between the first horizontal portion 131 and the second horizontal portion 131 of the continuous top electrode 130L. In embodiments in which the bottom electrode 121 has a cylindrical or frustoconical shape, the first vertical portion 132 of the continuous top electrode 130L may include a curved outer surface that extends continuously around the first vertical portion 127 of the continuous switching layer 125L. In embodiments in which the bottom electrode 121 has a polygonal cross-sectional shape, such as a rectangular prism or frustopyramidal shape, the first vertical portion 132 of the continuous top electrode 130L may have an outer surface including a plurality of planar segments extending around the periphery of the first vertical portion 127 of the continuous switching layer 125L. In some embodiments, the first vertical portion 132 of the continuous top electrode 1301, may extend at an angle, $\theta_2$, with respect to the first horizontal portion 131 of the continuous top electrode 130L. In some embodiments, angle $\theta_2$ may be between about 60° and about 100°.

Figure 12:
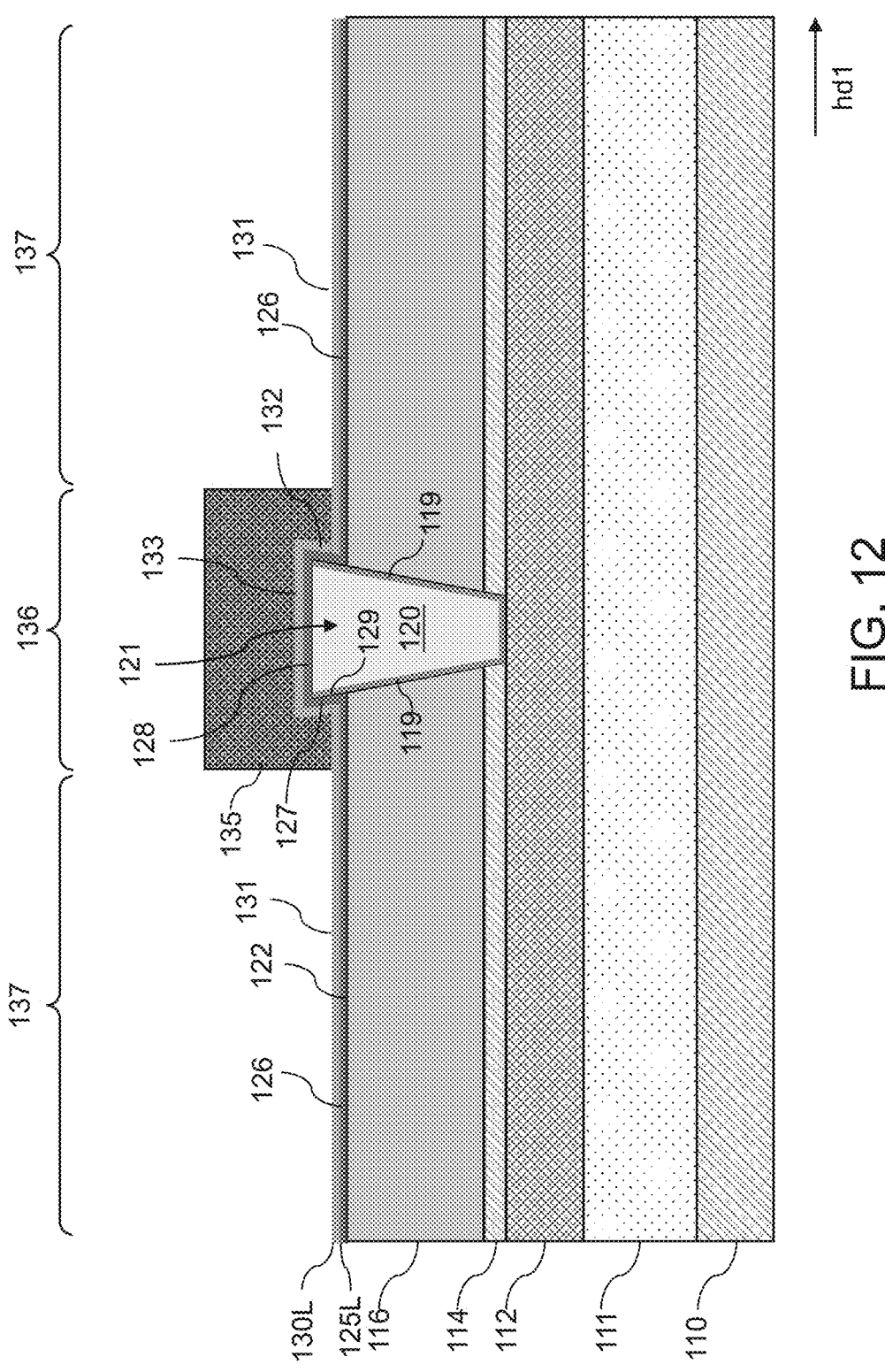
FIG. 12 is a vertical cross-sectional view of an exemplary structure during a process of forming a resistive memory device that includes a patterned mask located over the continuous top electrode according to an embodiment of the present disclosure.

FIG. 12 is a vertical cross-sectional view of an exemplary structure during a process of forming a resistive memory device that includes a patterned mask 135 located over the continuous top electrode 130L according to an embodiment of the present disclosure. Referring to FIG. 12, the mask 135, which may include a layer of photoresist and/or a hard mask, may be patterned using a photolithographic technique such that a first region 136 of the of the exemplary structure is covered by the mask 135 and a second region 137 of the exemplary structure is exposed through the mask 135. As shown in FIG. 12, the first region 136 of the exemplary structure may include the bottom electrode 121 and portions of the continuous switching layer 125L and the continuous top electrode 130L that overlie and are adjacent to the bottom electrode 121.

Figure 13:
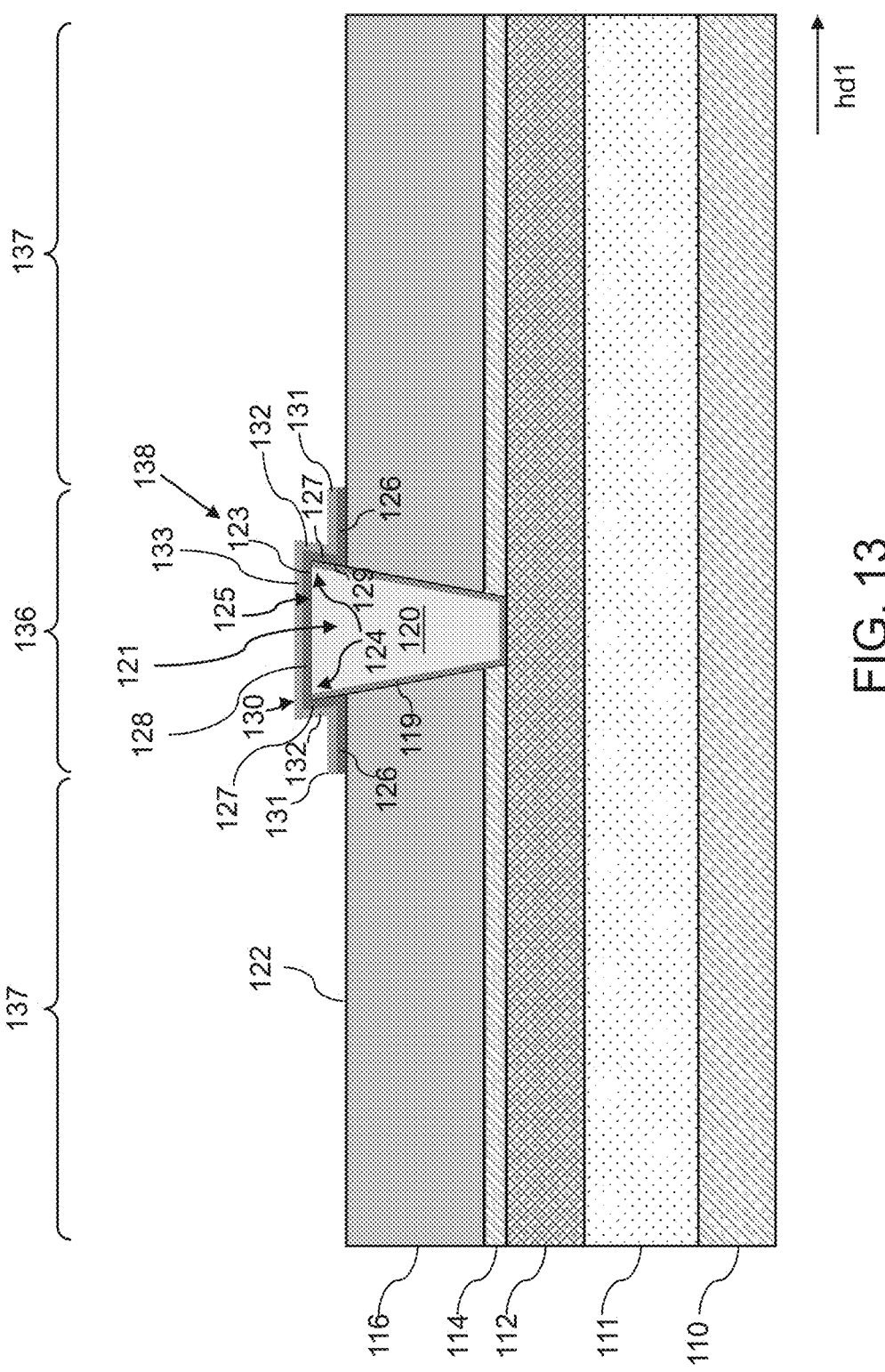
FIG. 13 is a vertical cross-sectional view of an exemplary structure during a process of forming a resistive memory device that includes a layer stack located over and adjacent to the bottom electrode within the first region of the exemplary structure according to an embodiment of the present disclosure.

FIG. 13 is a vertical cross-sectional view of an exemplary structure during a process of forming a resistive memory device that includes a layer stack 138 located over and adjacent to the bottom electrode 121 within the first region 136 of the exemplary structure according to an embodiment of the present disclosure. Referring to FIG. 13, an etching process, such as an anisotropic etching process, may be used to remove portions of the continuous top electrode 130L and the continuous switching layer 125L that are exposed through the patterned mask 135. The etching process may stop at the third dielectric material layer 116. Portions of the continuous top electrode 130L and the continuous switching layer 125L in the first region 136 of the exemplary structure may be protected from etching by the patterned mask 135. The remaining (i.e., unetched) portions of the continuous top electrode 130L and the continuous switching layer 125L may form a layer stack 138 located over and adjacent to the bottom electrode 121. Following the etching process, the patterned mask 135 may be removed using a suitable process, such as by ashing or by dissolution using a solvent.

Referring again to FIG. 13, the layer stack 138 may include a discrete switching layer 125 including a first horizontal portion 126 located over the upper surface 122 of the third dielectric material layer 116, a first vertical portion 127 located over the side surface 129 of the bottom electrode 121, and a second horizontal portion 128 located over the upper surface 123 of the bottom electrode 121. The layer stack 138 may also include a discrete top electrode 130 located over the discrete switching layer 125, wherein the discrete top electrode 130 includes a first horizontal portion 131 over the first horizontal portion 126 of the switching layer 125, a first vertical portion 132 over the first vertical portion 127 of the switching layer 125, and a second horizontal portion 133 over the second horizontal portion 128 of the switching layer 125.

In embodiments in which a plurality of bottom electrodes 121 project above the upper surface 122 of the third dielectric material layer 116, a plurality of layer stacks 138 such as shown in FIG. 13 may be formed over each of the bottom electrodes 121. The plurality of layer stacks 138 may be formed by conformally depositing a continuous switching layer 125L over the plurality of bottom electrodes 121 and a continuous top electrode 130L over the continuous switching layer 125L, and etching the continuous top electrode 130L and the continuous switching layer 125L though a patterned mask 135 to provide the plurality of layer stacks 138 over each of the bottom electrodes 121. The upper surface 122 of the third dielectric material layer 116 may be exposed between the respective layer stacks 138.

Figure 14:
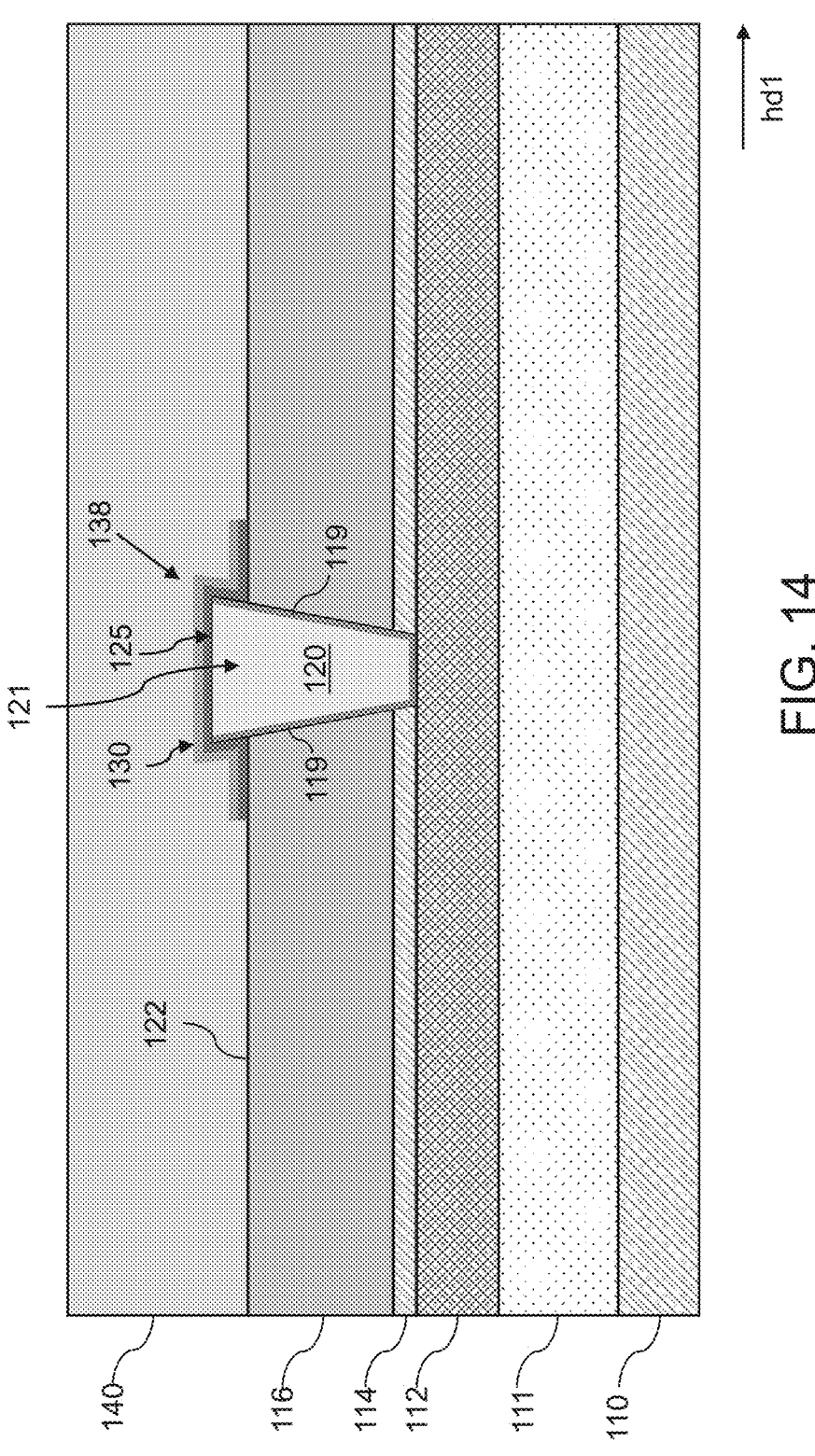
FIG. 14 is a vertical cross-sectional view of an exemplary structure during a process of forming a resistive memory device that includes a fourth dielectric material layer over the layer stack and the exposed upper surface of the third dielectric material layer according to an embodiment of the present disclosure.

FIG. 14 is a vertical cross-sectional view of an exemplary structure during a process of forming a resistive memory device that includes a fourth dielectric material layer 140 over the layer stack 138 and the exposed upper surface 122 of the third dielectric material layer 116 according to an embodiment of the present disclosure. The fourth dielectric material layer 140 may be formed of any suitable dielectric material such as silicon oxide ($SiO_2$), silicon nitride ($Si_3N_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), silicon carbide (SiC) or the like. Other suitable dielectric materials are within the contemplated scope of disclosure. In some embodiments, the fourth dielectric material layer 140 may be composed of the same material as the third dielectric material layer 116. Alternatively, the fourth dielectric material layer 140 may have a different composition than the third dielectric material layer 116. The fourth dielectric material layer 140 may be deposited over the exposed upper surface 122 of the third dielectric material layer 116 and over the upper surface and side surfaces of the layer stack 138 using a suitable deposition method as described above.

Figure 15:
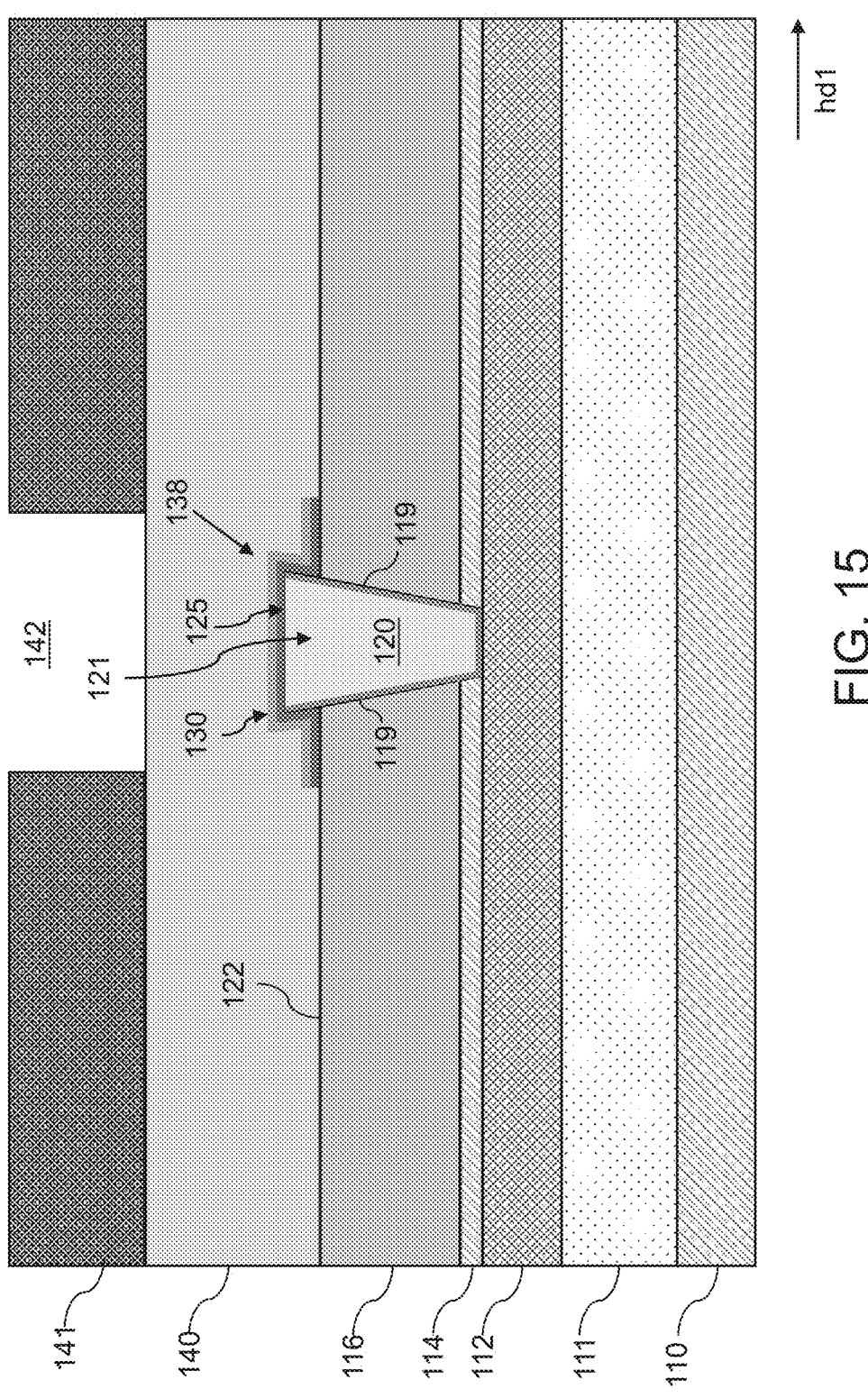
FIG. 15 is a vertical cross-sectional view of an exemplary structure during a process of forming a resistive memory device that includes a patterned mask formed over the upper surface of the fourth dielectric material layer according to an embodiment of the present disclosure.

FIG. 15 is a vertical cross-sectional view of an exemplary structure during a process of forming a resistive memory device that includes a patterned mask 141 formed over the upper surface of the fourth dielectric material layer 140 according to an embodiment of the present disclosure. Referring to FIG. 15, the mask 141, which may include a layer of photoresist and/or a hard mask, may be patterned using a photolithographic technique to form one or more openings 142 through the mask 141. Each opening 141 in the mask 141 may correspond to a location of a layer stack 138 underlying the fourth dielectric material layer 140.

Figure 16:
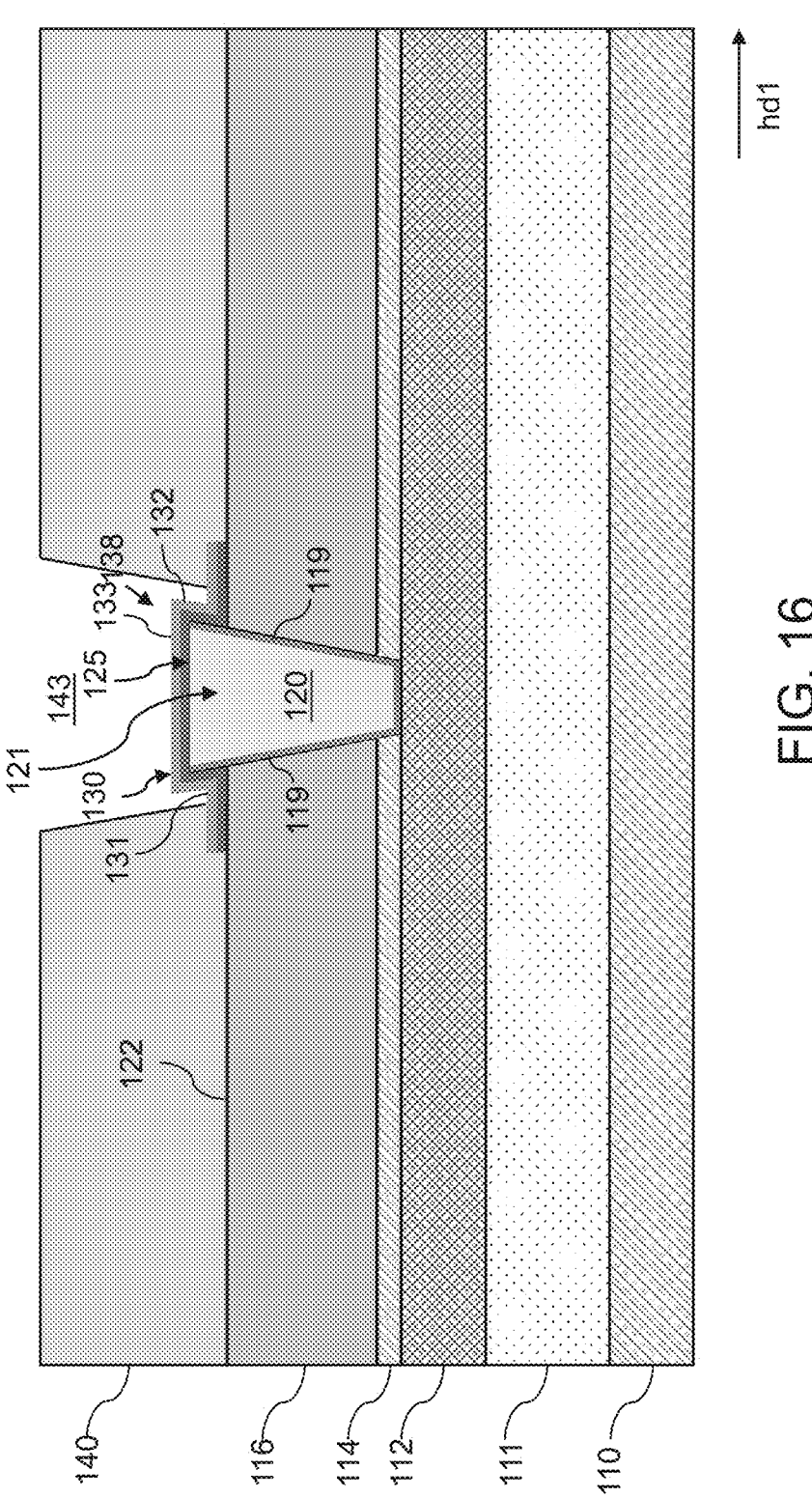
FIG. 16 is a vertical cross-section view of an exemplary structure during a process of forming a resistive memory device showing an opening formed through the fourth dielectric material layer to expose a portion of a layer stack according to an embodiment of the present disclosure.

FIG. 16 is a vertical cross-section view of an exemplary structure during a process of forming a resistive memory device showing an opening 143 formed through the fourth dielectric material layer 140 to expose a portion of a layer stack 138 according to an embodiment of the present disclosure. Referring to FIG. 16, an etching process, such as an anisotropic etching process, may be used to etch the exemplary structure through the patterned mask 141 to remove portions of the fourth dielectric material layer 140 and form the opening 143 through the fourth dielectric material layer 140. The etching process may stop at the top electrode 130 of the layer stack 138. In various embodiments, the second horizontal portion 133, the first vertical portion 132, and a portion of the first horizontal portion 131 of the top electrode 130 may be exposed in the bottom of the opening 143. Following the etching process, the patterned mask 141 may be removed using a suitable process, such as by ashing or by dissolution using a solvent.

Figure 17:
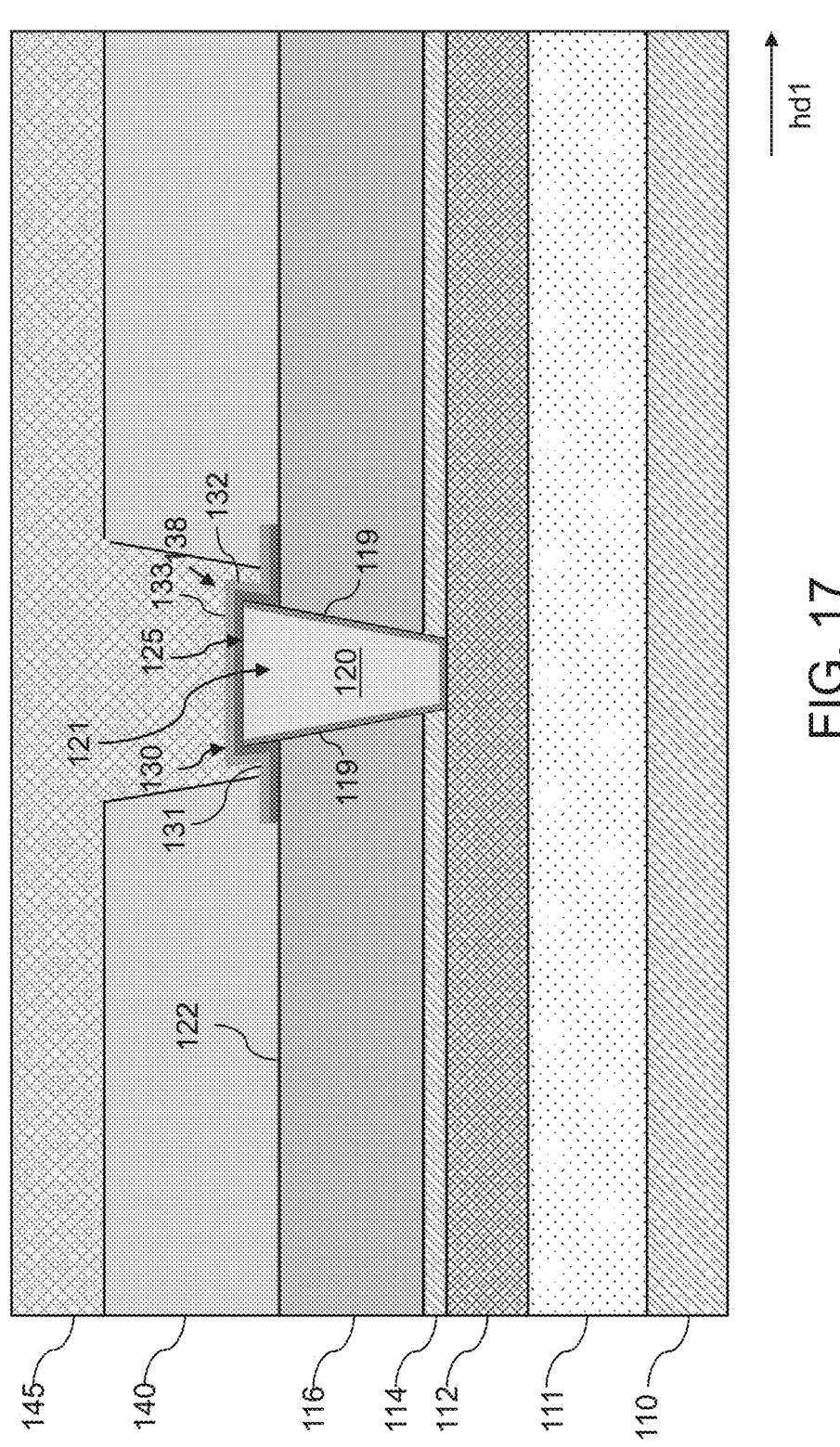
FIG. 17 is a vertical cross-section view of an exemplary structure during a process of forming a resistive memory device showing a conductive material layer deposited over the upper surface of the fourth dielectric material layer and within the opening according to an embodiment of the present disclosure.

FIG. 17 is a vertical cross-section view of an exemplary structure during a process of forming a resistive memory device showing a conductive material layer 145 deposited over the upper surface of the fourth dielectric material layer 140 and within the opening 143 according to an embodiment of the present disclosure. Referring to FIG. 17, the conductive material layer 145 may fill the opening 143 such that the conductive material layer 145 contacts the exposed side surface the fourth dielectric material layer 140 along the sidewall of the opening 143, and contacts the exposed surfaces of the second horizontal portion 133, the first vertical portion 132, and the first horizontal portion 131 of the top electrode 130 in the bottom of the opening 143.

The conductive material layer 145 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), molybdenum (Mo), osmium (Os), thorium (Th), vanadium (V), alloys thereof, and combinations of the same. In some embodiments, the conductive material layer 145 may include a barrier layer, such as a TaN or TiN layer over the fourth dielectric material layer 140 and the top electrode 130 and a conductive fill material may be located over the barrier layer. Other suitable electrically conductive materials for the conductive material layer 145 are within the contemplated scope of disclosure. In some embodiments, the conductive material layer 145 may be composed of the same material as the top electrode 130. Alternatively, the conductive material layer 145 may have a different composition than the top electrode 130. The conductive material layer 145 may be deposited using a suitable deposition method as described above.

Figure 18:
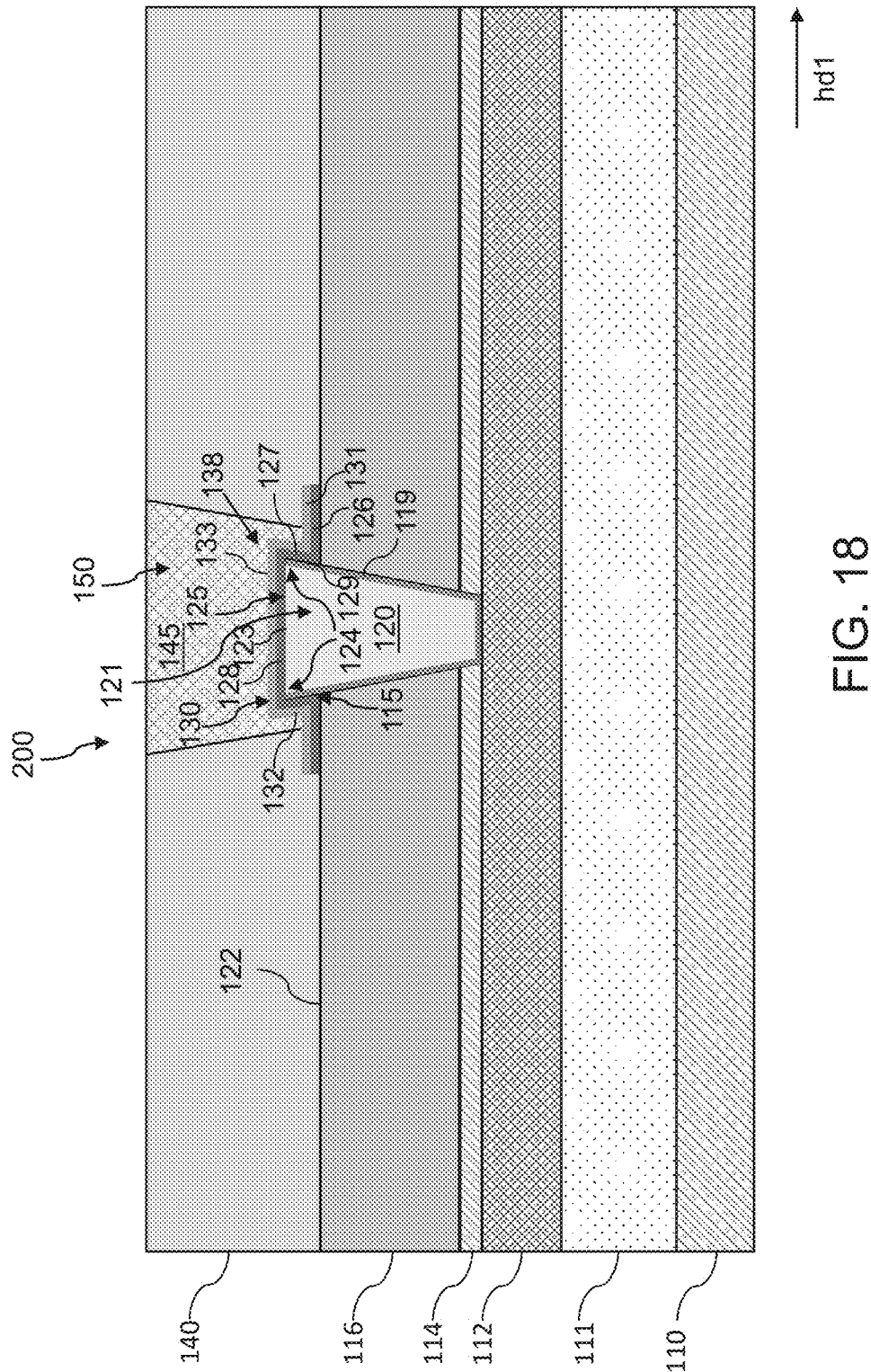
FIG. 18 is a vertical cross-section view of a resistive memory device following a planarization process to remove portions of the conductive material layer from over the upper surface of the fourth dielectric material layer according to an embodiment of the present disclosure.

FIG. 18 is a vertical cross-section view of a resistive memory device 200 following a planarization process to remove portions of the conductive material layer 145 from over the upper surface of the fourth dielectric material layer 140 according to an embodiment of the present disclosure.

Referring to FIG. 18, a planarization process, such as a chemical mechanical planarization (CMP) process, may be used to remove the conductive material layer 145 from over the upper surface of the fourth dielectric material layer 140. The remaining portion of the conductive material layer 140 may form a conductive via 150 that contacts the second horizontal portion 133, the first vertical portion 132, and the first horizontal portion 131 of the top electrode 130, and is laterally surrounded by the fourth dielectric material layer 140. In various embodiments, the upper surface of the conductive via 150 may be substantially co-planar with the upper surface of the fourth dielectric material layer 140.

Referring again to FIG. 18, the memory device 200 in this embodiment includes a layer stack 138 having a switching layer 125 and a top electrode 130 over the switching layer 125. The layer stack 138 is located between a bottom electrode 121 which contacts the switching layer 125, and a conductive via 150 which contacts the top electrode 130. The bottom electrode 121 and the conductive via 150 may be used to apply a voltage across the layer stack 138 in order to change the switching layer 125 from a High Resistance State (HRS) to a Low Resistance State (LRS), and vice versa. A plurality of memory devices 200 such as shown in FIG. 18 may be formed in the exemplary structure. Each memory device 200 may form an individual memory element (e.g., memory cell) of an array 95 of resistive memory devices, such as described above with reference to FIGS. 1B and 1C.

The layer stack 138 in the memory device 200 shown in FIG. 18 is non-planar, meaning that both the switching layer 125 and the top electrode 130 conform to the non-planar profile of the bottom electrode 121, which protrudes above the upper surface 122 of the third dielectric material layer 116. Accordingly, the switching layer 125 includes a first horizontal portion 126 over the upper surface 122 of the third dielectric material layer 116, a second horizontal portion 128 over the upper surface 123 of the bottom electrode 121, and a first vertical portion 127 that extends over a side surface 129 of the bottom electrode 121 between the first horizontal portion 126 and the second horizontal portion 128 of the switching layer 125. In addition, the top electrode 130 includes a first horizontal portion 131 over the first horizontal portion 126 of the switching layer 125, a second horizontal portion 133 over the second horizontal portion 126 of the switching layer 125, and a first vertical portion 132 that extends over the first vertical portion of 127 of the switching layer 125 between the first horizontal portion 131 and the second horizontal portion 133 of the top electrode 130. The conductive via 150 of the memory device 200 may contact the second horizontal portion 133, the first vertical portion 132, and the first horizontal portion 131 of the top electrode 130. The conductive via 150 may be laterally surrounded by a fourth dielectric material layer 140.

Referring to FIGS. 9-11 and 18, the portion of the bottom electrode 121 that protrudes above the upper surface 122 of the third dielectric material layer 116 may include a tapered side surface 129. The tapered side surface 129 of the bottom electrode 121 may provide a reentrant portion 115 adjacent to the exposed side surface 129 of the bottom electrode 121, and a portion of the switching layer 125 may be located within the reentrant portion 115. In various embodiments, the first vertical portion 127 of the switching layer 125 may extend at an oblique angle, $\theta_1$, with respect to the first horizontal portion 126 of the switching layer 125. In addition, the first vertical portion 132 of the top electrode 130 may extend at an oblique angle, $\theta_2$, with respect to the first horizontal portion 131 of the top electrode 130. In some embodiments, $\theta_1$ and $\theta_2$ may both be <90°.

In various embodiments, during operation of the memory device 200, charge crowding may occur near the corner portion 124 of the bottom electrode 121 where the side surface 129 meets the upper surface 123 of the bottom electrode 121. This may provide a localized increase in the electric field near the corner portion 124 of the bottom electrode 121, which protrudes above the upper surface 122 of the third dielectric material layer 116. The enhanced electric field near the corner portion 124 of the bottom electrode 121 may facilitate switching of the switching layer 125 of the memory device 200 between a High Resistance State (HRS) and a Low Resistance State (LRS). Accordingly, a relatively lower voltage may be applied across the non-planar switching layer 125 and the top electrode 130 to change the switching layer 125 between a High Resistance State (HRS) and a Low Resistance State (LRS). This may enable the operating voltage of the memory device 200 to be reduced.

Figure 19:
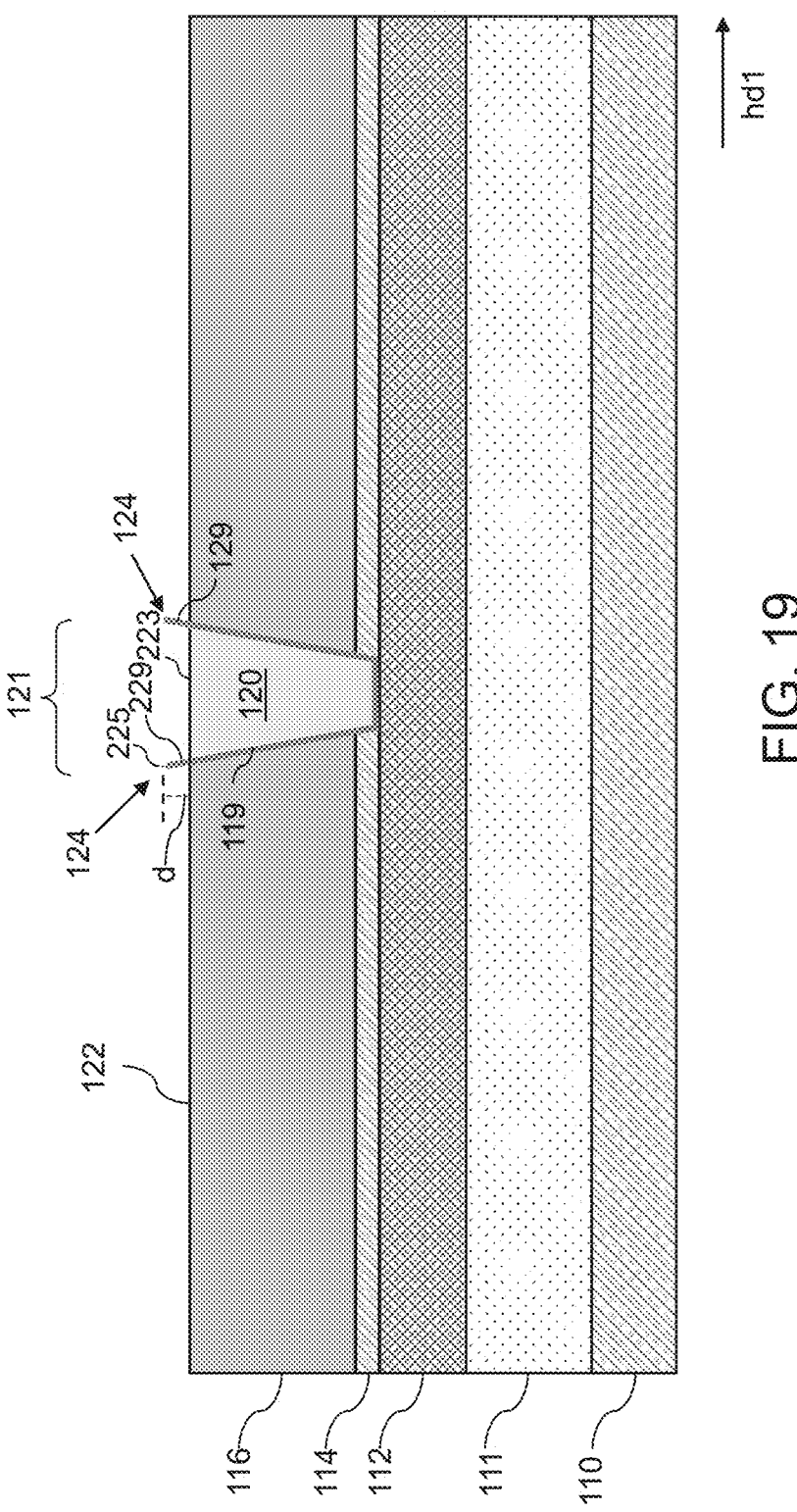
FIG. 19 is a vertical cross-section view of an exemplary intermediate structure during a process of forming a memory device that includes a bottom electrode having a recessed central portion.

FIGS. 19-26 are sequential vertical cross-sectional views of an exemplary structure during a process of forming resistive memory device according to an alternative embodiment of the present disclosure. FIG. 19 is a vertical cross-section view of an exemplary intermediate structure during a process of forming a memory device that includes a substrate 110, a first dielectric material layer 111 over the substrate 110, a metal line 112 embedded in the first dielectric material layer 111, a second dielectric material layer 114 over the first dielectric material layer 111 and the metal line 112, a third dielectric material layer 116 over the second dielectric material layer 114, and a bottom electrode 121 extending through the third dielectric material layer 116 and the second dielectric material layer 114 and contacting the metal line 112. The upper surface 122 of the third dielectric material layer 116 may be recessed relative to the bottom electrode 121 by a recess distance d, such that a portion of the bottom electrode 121 may project above the upper surface 122 of the third dielectric material layer 116. The exemplary intermediate structure shown in FIG. 19 may be derived from the exemplary intermediate structure shown in FIG. 9, thus repeated discussion of the structure and details of the substrate 110, the first dielectric material layer 111, the metal line 112, the second dielectric material layer 114 and the third dielectric material layer 116 are omitted.

The exemplary structure shown in FIG. 19 differs from the exemplary structure shown in FIG. 9 in that the bottom electrode 121 includes a recessed central portion. Referring again to FIG. 19, an etching process may be performed to selectively remove a portion of the bottom electrode 121 such that a central portion of the bottom electrode 121 may be recessed relative to an outer portion of the bottom electrode 121. In some embodiments, the etching process may use an etch chemistry that may have a higher etch selectivity for the material of the conductive fill portion 120 of the bottom electrode 121 relative to the material of the barrier layer 119 of the bottom electrode 121. In various embodiments, the etch rate of the conductive fill portion 120 during the etching process may be at least 5 times greater, such as at least 10 times greater, including 100 times greater or more, than the etch rate of the barrier layer 119 during the etching process. In some embodiments, the etching process may be a dry etch process using plasma and/or radicals of $Cl_2$, $F_2$, $CH_4$, $SF_6$, Ar and/or He which may have a higher etch selectivity for the for the material of the conductive fill portion 120 relative to the material of the barrier layer 119.

Following the etching process, the upper surface 223 of the conductive fill portion 120 may be recessed relative to the barrier layer 119. In one non-limiting embodiment illustrated in FIG. 19, the upper surface 223 of the conductive fill portion 120 may be recessed by the same or substantially the same recess distance, d, as the upper surface 122 of the third dielectric material layer 116, such that the upper surface 223 of the conductive fill portion 120 may be co-planar or substantially co-planar with the upper surface 122 of the third dielectric material layer 116. Alternatively, the upper surface 223 of the conductive fill portion 120 may be recessed by a lesser distance than, or by a greater distance than, the recess distance, d, of the upper surface 122 of the third dielectric material layer 116. In some embodiments, the same etching process that is used to recess the upper surface 122 of the third dielectric material layer 116 relative to the bottom electrode 121 may also recess the upper surface 223 of the conductive fill portion 120 relative to the upper surface 225 of the barrier layer 119 of the bottom electrode 121. Alternatively, a first etching process may be used to recess the third dielectric material layer 116 relative to the bottom electrode 121 and, and a second etching process may be used to recess the conductive fill portion 120 relative to the barrier layer 119 of the bottom electrode 121. The first and second etching processes may be performed in any sequence.

Referring again to FIG. 19, following the etching process (es), the barrier layer 119 may project above the upper surface 223 of the conductive fill portion 120. An interior side surface 229 of the barrier layer 119 may be exposed, where the exposed interior side surface 229 may extend between the upper surface 225 of the barrier layer 119 and the upper surface 223 of the conductive fill portion 120. In embodiments in which the bottom electrode 121 has a cylindrical or frustoconical shape, the exposed interior side surface 229 of the barrier layer 119 may be a curved surface that extends continuously around the peripheral circumference of the conductive fill portion 120. In embodiments in which the bottom electrode 121 has a polygonal cross-sectional shape, the exposed interior side surface 229 of the barrier layer 119 may include a plurality of planar segments extending around the periphery of the conductive fill portion 120.

Figure 20:
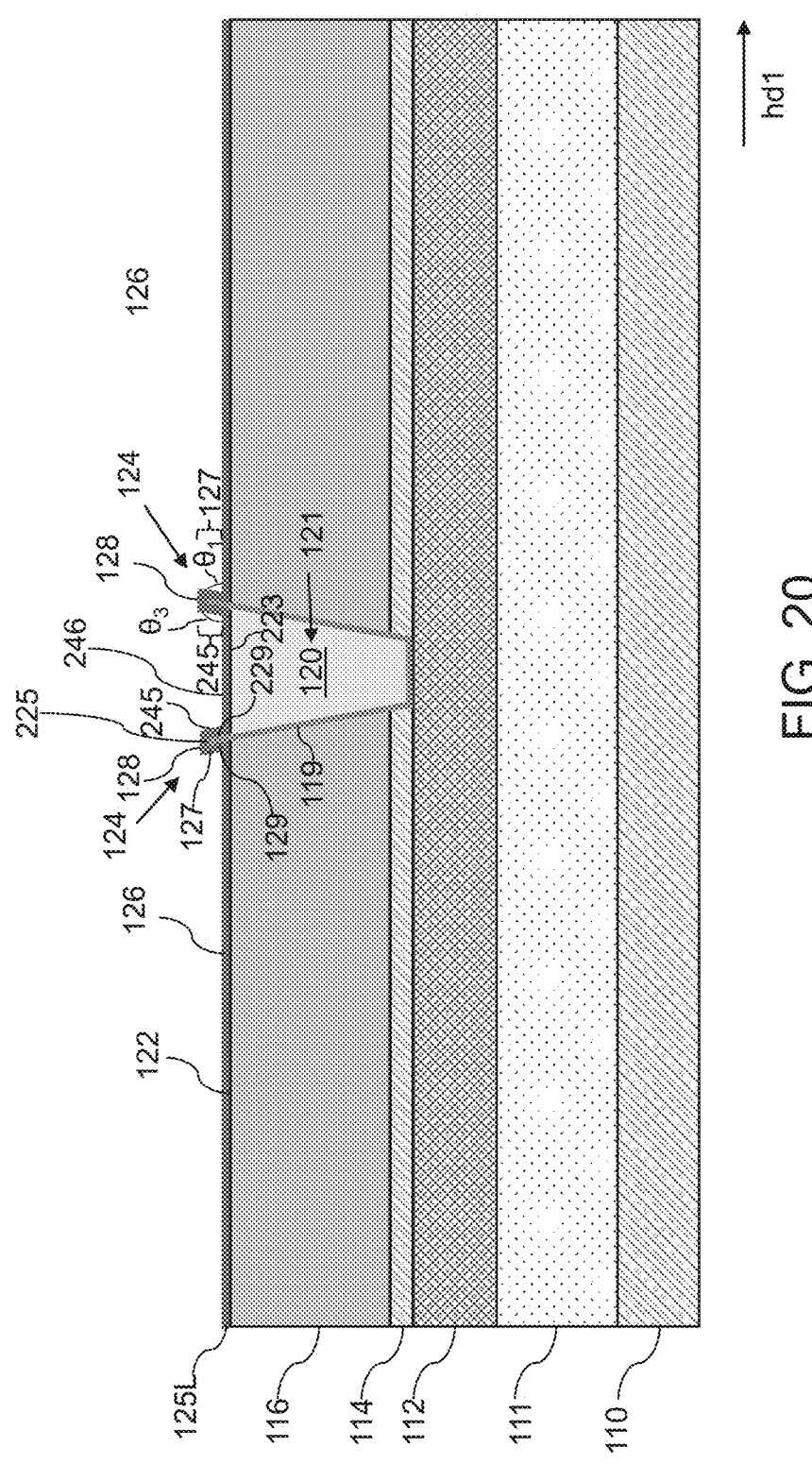
FIG. 20 is a vertical cross-section view of an exemplary structure during a process of forming a resistive memory device that shows a continuous switching layer deposited over the third dielectric material layer and the bottom electrode according to an embodiment of the present disclosure.

FIG. 20 is a vertical cross-section view of an exemplary structure during a process of forming a resistive memory device that shows a continuous switching layer 125L deposited over the third dielectric material layer 116 and the bottom electrode 121 according to an embodiment of the present disclosure. In various embodiments, the continuous switching layer 125L may be conformally deposited over the exposed upper surface 122 of the third dielectric material layer 116 and over the exposed surfaces of the barrier layer 119 and the conductive fill portion 120 of the bottom electrode 121. The continuous switching layer 125L may include a solid-state dielectric material that may be switchable between a High Resistance State (HRS) and a Low Resistance State (LRS), and may include any of the materials described above with reference to FIG. 10. The continuous switching layer 125L may be deposited using a suitable deposition technique as described above.

Referring again to FIG. 20, the continuous switching layer 125L may include a first horizontal portion 126 that is located over the upper surface 122 of the third dielectric material layer 116, a second horizontal portion 128 that is located over the upper surface 225 of the barrier layer 119 of the bottom electrode 121, and a third horizontal portion 246 located over the upper surface 223 of the conductive fill portion 120 of the bottom electrode 121. The first horizontal portion 126, the second horizontal portion 128, and the third horizontal portion 246 of the continuous switching layer 125L may each extend parallel to the first horizontal direction, hd1. The third horizontal portion 246 may be vertically recessed relative to the second horizontal portion 128 of the continuous switching layer 125L. The continuous switching layer 125L may also include a first vertical portion 127 that extends over the side surface 129 of the bottom electrode 121 between the first horizontal portion 126 and the second horizontal portion 128, as in the embodiment described above with reference to FIG. 10. In addition, the continuous switching layer 125L in the embodiment of FIG. 20 may include a second vertical portion 245 that extends over the interior side surface 229 of the barrier layer 119 between the second horizontal portion 128 and the third horizontal portion 246 of the continuous switching layer 125L. In embodiments in which the bottom electrode 121 has a cylindrical or frustoconical shape, the second vertical portion 245 may have a curved outer surface that extends continuously around the periphery of the third horizontal portion 246 of the continuous switching layer 125L. In embodiments in which the bottom electrode 121 has a polygonal cross-sectional shape, the second vertical portion 245 may include a plurality of planar segments extending around the periphery of the third horizontal portion 246 of the continuous switching layer 125L.

In various embodiments, the first vertical portion 127 of the continuous switching layer 125L may extend at an angle, $\theta_1$, with respect to the first horizontal portion 126 of the continuous switching layer 125L, and the second vertical portion 245 of the continuous switching layer 125L may extend at an angle, $\theta_3$, with respect to the third horizontal portion 246 of the continuous switching layer 125L. In some embodiments, $\theta_1$ may be <90°, and $\theta_3$ may be >90°, such as between 90° and about 150°.

Figure 21:
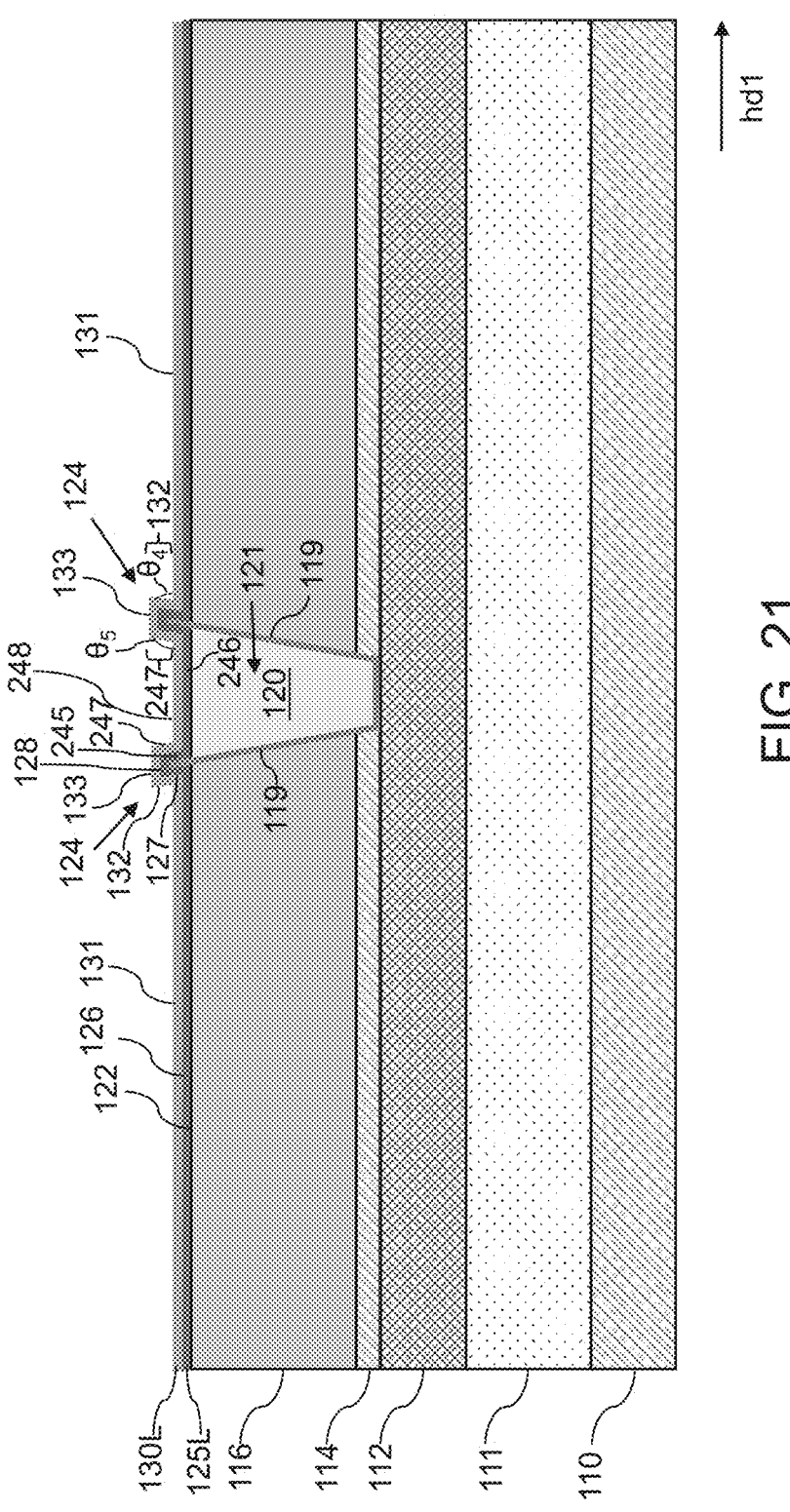
FIG. 21 is a vertical cross-section view of an exemplary structure during a process of forming a resistive memory device that shows a continuous top electrode deposited over the continuous switching layer according to an embodiment of the present disclosure.

FIG. 21 is a vertical cross-section view of an exemplary structure during a process of forming a resistive memory device that shows a continuous top electrode 130L deposited over the continuous switching layer 125L according to an embodiment of the present disclosure. In various embodiments, the continuous top electrode 130L may be conformally deposited over the first horizontal portion 126 of the continuous switching layer 125L, the first vertical portion 127 of the continuous switching layer 125L, the second horizontal portion 128 of the continuous switching layer 125L, the second vertical portion 245 of the continuous switching layer 125L, and the third horizontal portion 246 of the continuous switching layer 125L. The continuous top electrode 130L may include any suitable electrically conductive material, such as the materials discussed above with reference to FIG. 11. The continuous top electrode 130L may be deposited using a suitable deposition process as described above.

Referring again to FIG. 21, the continuous top electrode 130L may include a first horizontal portion 131 that is located over the first horizontal portion 126 of the continuous switching layer 125L, a second horizontal portion 133 that is located over the second horizontal portion 128 of the continuous switching layer 125L, and a third horizontal portion 248 that is located over the third horizontal portion 246 of the continuous switching layer 125L. The first horizontal portion 131, the second horizontal portion 133, and the third horizontal portion 248 of the continuous top electrode 130L may each extend parallel to the first horizontal direction, hd1. The continuous top electrode 130L may further include a first vertical portion 132 that may extend over first vertical portion 127 of the continuous switching layer 125L between the first horizontal portion 131 and the second horizontal portion 133 of the continuous top electrode 130L, as in the embodiment described above with reference to FIG. 21. The continuous top electrode 130L may also include a second vertical portion 247 that may extend over the second vertical portion 245 of the continuous switching layer 125L between the second horizontal portion 128 and the third horizontal portion 248 of the continuous top electrode 130L. In embodiments in which the bottom electrode 121 has a cylindrical or frustoconical shape, the second vertical portion 247 of the continuous top electrode 130L may have a curved outer surface that extends continuously around the periphery of the third horizontal portion 248 of the continuous top electrode 130L. In embodiments in which the bottom electrode 121 has a polygonal cross-sectional shape, the second vertical portion 247 of the continuous top electrode 130L may include a plurality of planar segments extending around the periphery of the third horizontal portion 248 of the continuous top electrode 130L.

In various embodiments, the first vertical portion 127 of the continuous top electrode 130L may extend at an angle, $\theta_4$, with respect to the first horizontal portion 131 of the continuous top electrode 130L, and the second vertical portion 247 of the continuous top electrode 130L may extend at an angle, $\theta_5$, with respect to the third horizontal portion 248 of the continuous top electrode 130L. In some embodiments, $\theta_4$ may be <90°, and θ4 may be >90°, such as between 90° and about 150°.

Figure 22:
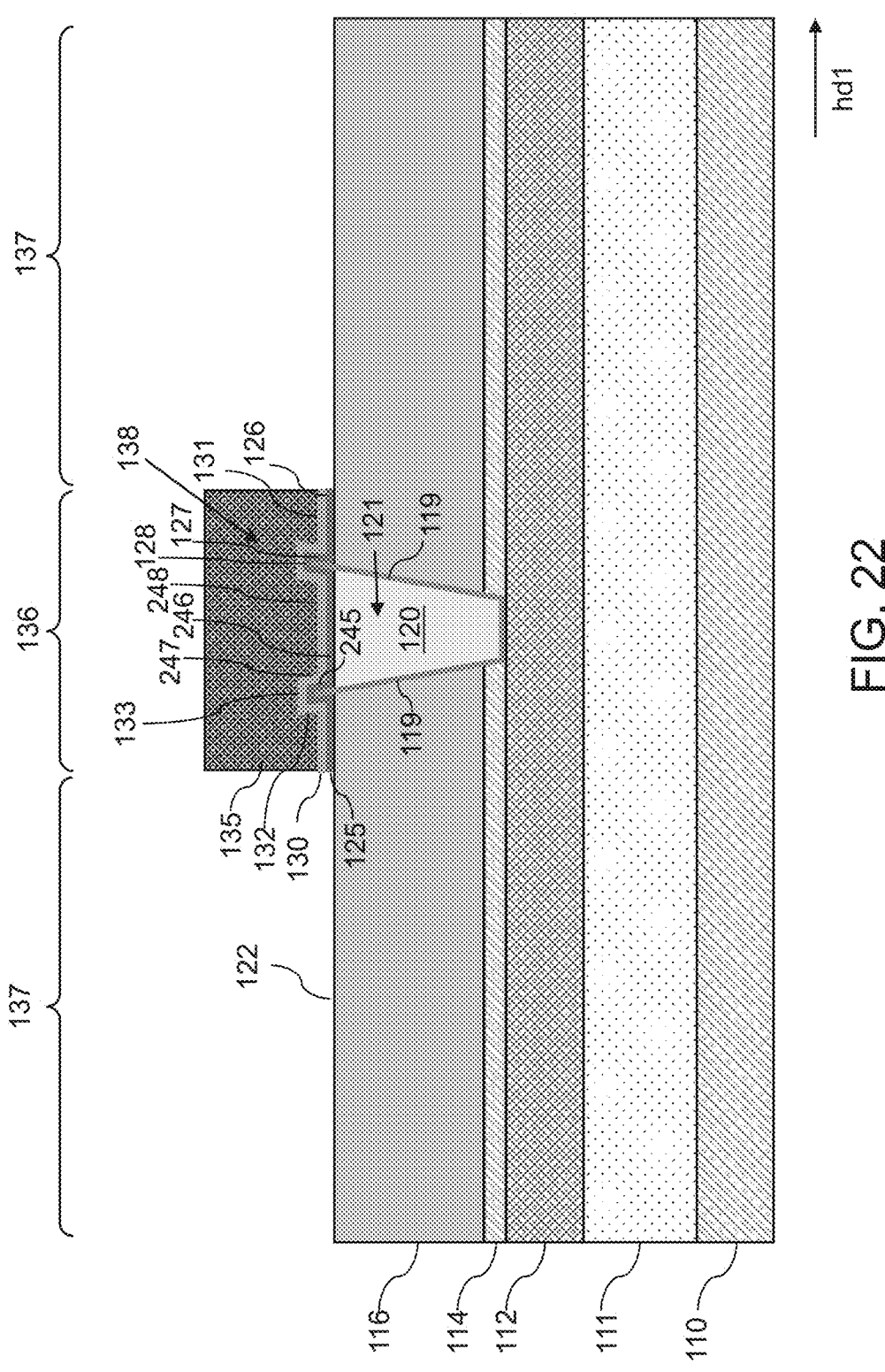
FIG. 22 is a vertical cross-sectional view of an exemplary structure during a process of forming a resistive memory device following an etching process that removes portions of the continuous top electrode and the continuous switching layer that are exposed through a patterned mask.

FIG. 22 is a vertical cross-sectional view of an exemplary structure during a process of forming a resistive memory device following an etching process that removes portions of the continuous top electrode 130L and the continuous switching layer 130L that are exposed through a patterned mask 135. Referring to FIG. 22, a patterned mask 135 as described above with reference to FIG. 12 may be formed over the continuous top electrode 130L and patterned using a photolithographic technique such that a first region 136 of the of the exemplary structure including the bottom electrode 121 and portions of the continuous top electrode 130L and the continuous switching layer 125L is covered by the mask 135, and a second region 137 of the exemplary structure is exposed through the mask 135. Then, an etching process, such as an anisotropic etching process, may be used to remove portions of the continuous top electrode 130L and the continuous switching layer 125L from the second region 137, leaving a layer stack 138 overlying and adjacent to the bottom electrode 121, as described above with reference to FIG. 13. The layer stack 138 may include a discrete switching layer 125 over the third dielectric material layer 116 and the bottom electrode 121, and a discrete top electrode 130 over the discrete switching layer 125. Following the etching process, the patterned mask 135 may be removed using a suitable process, such as by ashing or by dissolution using a solvent.

Figure 23:
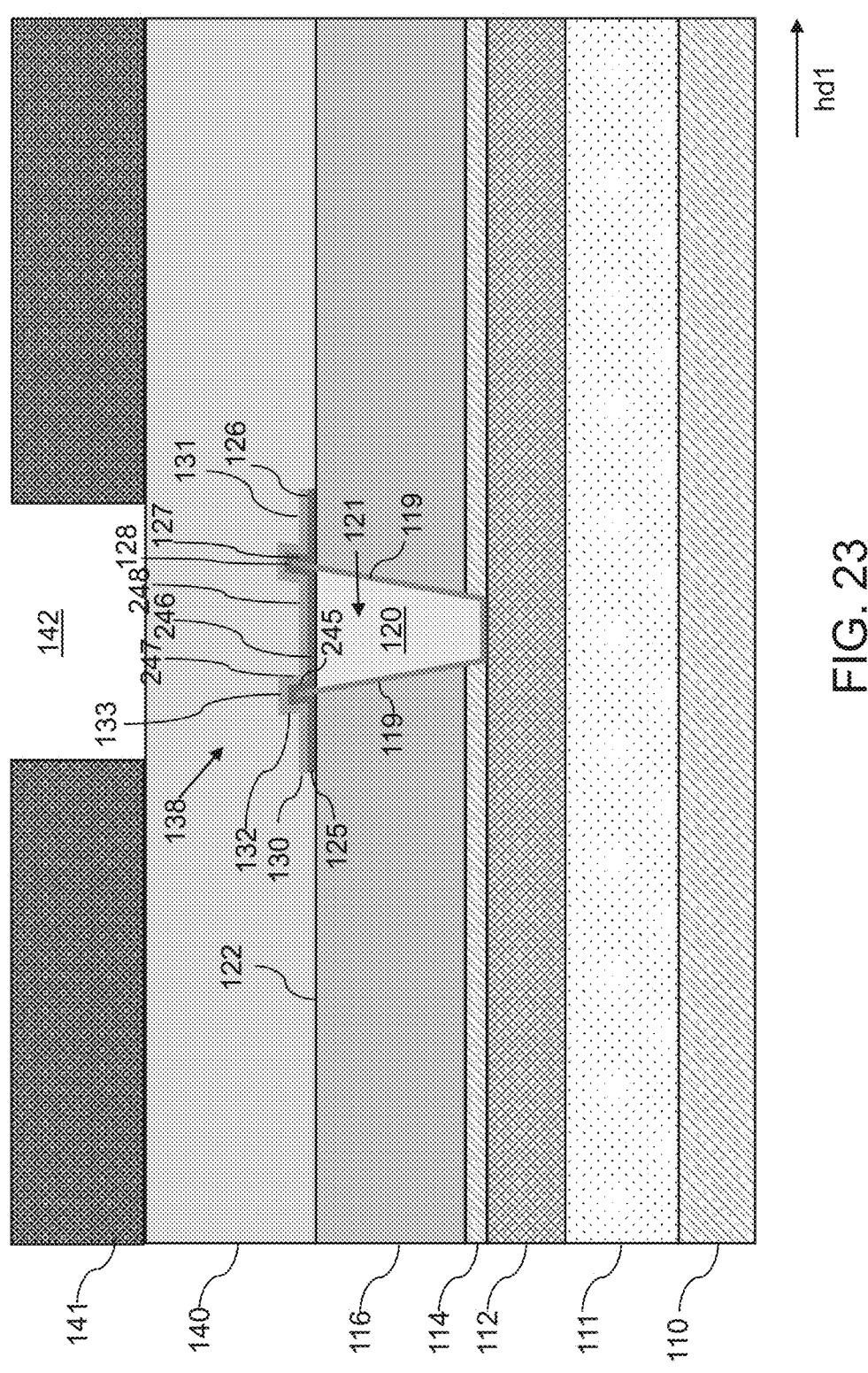
FIG. 23 is a vertical cross-sectional view of an exemplary structure during a process of forming a resistive memory device that includes a fourth dielectric material layer over a layer stack and the exposed upper surface of the third dielectric material layer, and a patterned mask formed over the upper surface of the fourth dielectric material layer according to an embodiment of the present disclosure.

FIG. 23 is a vertical cross-sectional view of an exemplary structure during a process of forming a resistive memory device that includes a fourth dielectric material layer 140 over the layer stack 138 and the exposed upper surface 122 of the third dielectric material layer 116, and a patterned mask 141 formed over the upper surface of the fourth dielectric material layer 140 according to an embodiment of the present disclosure. Referring to FIG. 23, the fourth dielectric material layer 140 may be deposited over the upper surface 122 of the third dielectric material layer 140 and over the upper surface and side surfaces of the layer stack 130 using any suitable deposition method as described above. The fourth dielectric material layer 140 may be formed of any suitable dielectric material, such as any of the materials for the fourth dielectric material layer 140 described above with reference to FIG. 14. A mask 141, which may include a layer of photoresist and/or a hard mask, may be patterned using a photolithographic technique to form one or more openings 142 through the mask 141, where each opening 141 in the mask 141 may correspond to a location of a layer stack 138 underlying the fourth dielectric material layer 140.

Figure 24:
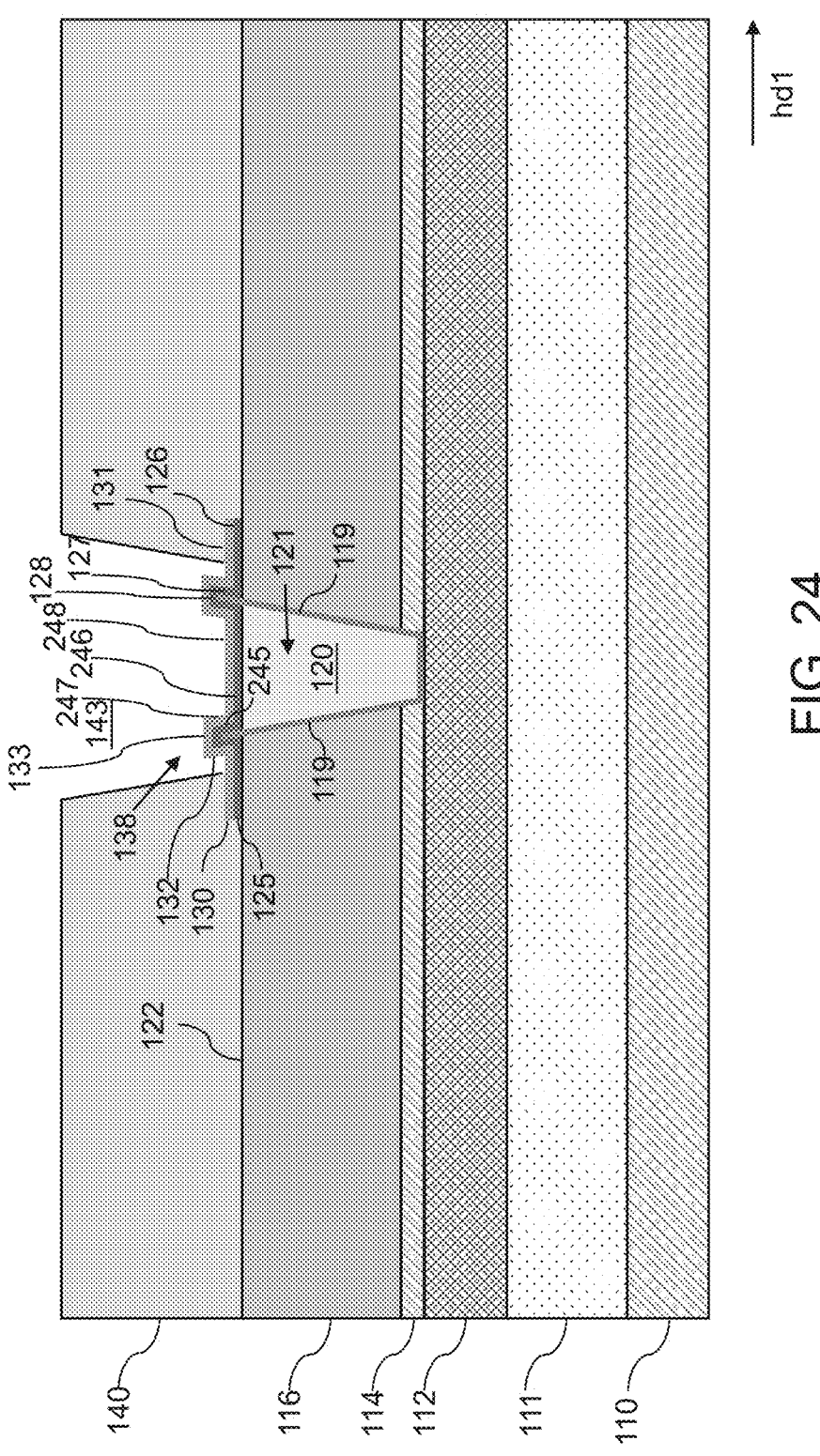
FIG. 24 is a vertical cross-section view of an exemplary structure during a process of forming a resistive memory device showing an opening formed through the fourth dielectric material layer to expose a portion of the layer stack according to an embodiment of the present disclosure.

FIG. 24 is a vertical cross-section view of an exemplary structure during a process of forming a resistive memory device showing an opening 143 formed through the fourth dielectric material layer 140 to expose a portion of a layer stack 138 according to an embodiment of the present disclosure. Referring to FIG. 24, an etching process, such as an anisotropic etching process, may be used to etch the exemplary structure through the patterned mask 141 to remove portions of the fourth dielectric material layer 140 and form the opening 143 through the fourth dielectric material layer 140. The etching process may stop at the top electrode 130 of the layer stack 138. In various embodiments, the first vertical portion 132, the second horizontal portion 133, the second vertical portion 247, the third horizontal portion 248, and a portion of the first horizontal portion 131 of the top electrode 130 may be exposed in the bottom of the opening 143. Following the etching process, the patterned mask 141 may be removed using a suitable process, such as by ashing or by dissolution using a solvent.

Figure 25:
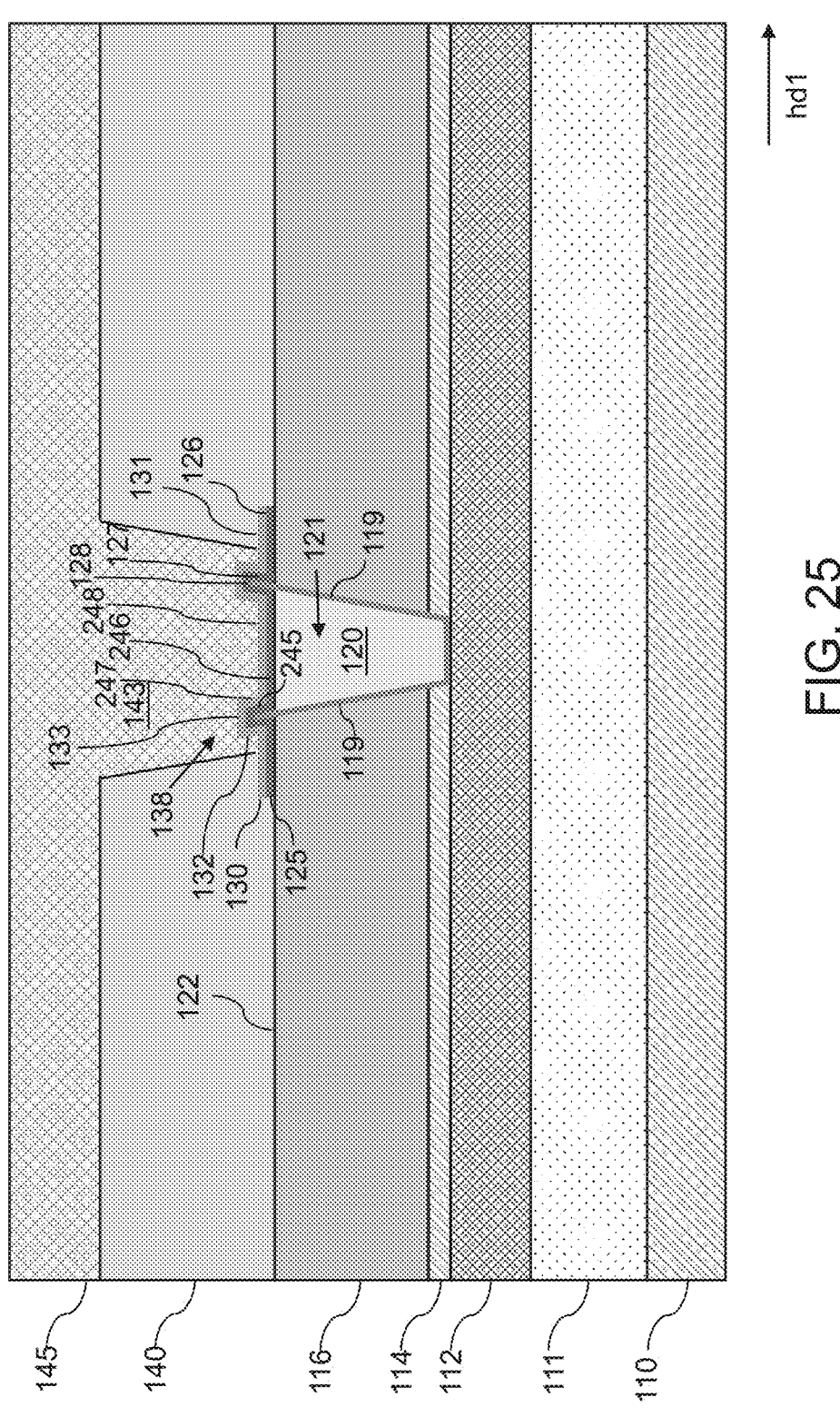
FIG. 25 is a vertical cross-section view of an exemplary structure during a process of forming a resistive memory device showing a conductive material layer deposited over the upper surface of the fourth dielectric material layer and within the opening according to an embodiment of the present disclosure.

FIG. 25 is a vertical cross-section view of an exemplary structure during a process of forming a resistive memory device showing a conductive material layer 145 deposited over the upper surface of the fourth dielectric material layer 140 and within the opening 143 according to an embodiment of the present disclosure. Referring to FIG. 25, the conductive material layer 145 may fill the opening 143 such that the conductive material layer 145 contacts the exposed side surface of the fourth dielectric material layer 140 along the sidewall of the opening 143, and contacts the exposed surfaces of the first horizontal portion 131, the first vertical portion 132, the second horizontal portion 133, the second vertical portion 247, and the third horizontal portion 248 of the top electrode 130 in the bottom of the opening 143. The conductive material layer 145 may include any suitable electrically conductive material, such as any of the materials for the conductive material layer 145 described above with reference to FIG. 17. The conductive material layer 145 may be deposited using any suitable deposition process as described above.

Figure 26:
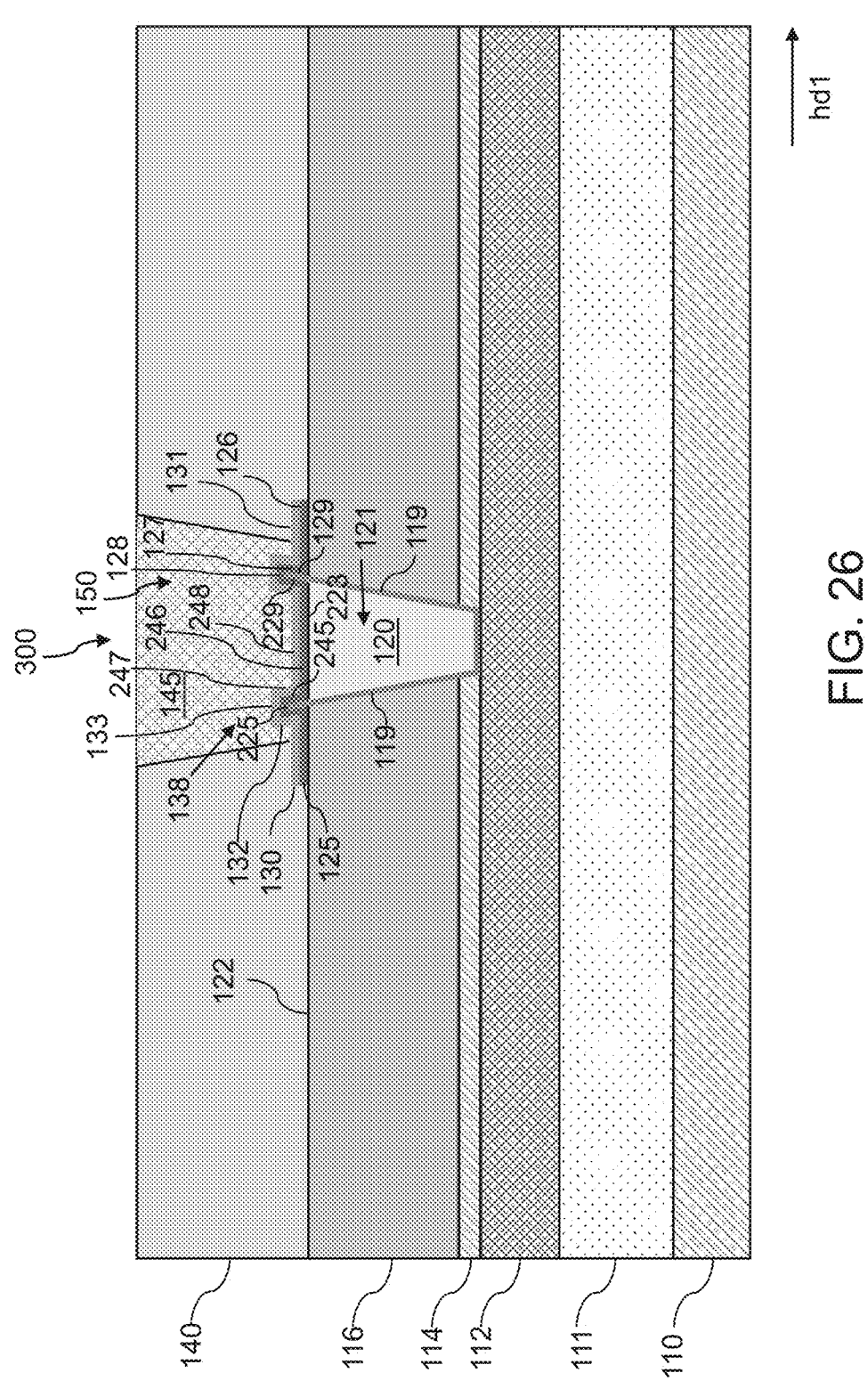
FIG. 26 is a vertical cross-section view of a resistive memory device following a planarization process to remove portions of the conductive material layer from over the upper surface of the fourth dielectric material layer according to an embodiment of the present disclosure.

FIG. 26 is a vertical cross-section view of a resistive memory device 300 following a planarization process to remove portions of the conductive material layer 145 from over the upper surface of the fourth dielectric material layer 140 according to an embodiment of the present disclosure. Referring to FIG. 26, a planarization process, such as a chemical mechanical planarization (CMP) process, may be used to remove the conductive material layer 145 from over the upper surface of the fourth dielectric material layer 140. The remaining portion of the conductive material layer 140 may form a conductive via 150 that contacts the first horizontal portion 131, the first vertical portion 132, the second horizontal portion 133, the second vertical portion 247, and the third horizontal portion 248 of the top electrode 130, and is laterally surrounded by the fourth dielectric material layer 140. In various embodiments, the upper surface of the conductive via 150 may be substantially co-planar with the upper surface of the fourth dielectric material layer 140.

Referring again to FIG. 26, the memory device 300 in this embodiment includes a layer stack 138 having a switching layer 125 and a top electrode 130 over the switching layer 125. The layer stack 138 is located between a bottom electrode 121 which contacts the switching layer 125, and a conductive via 150 which contacts the top electrode 130. The bottom electrode 121 and the conductive via 150 may be used to apply a voltage across the layer stack 138 in order to change the switching layer 125 from a High Resistance State (HRS) to a Low Resistance State (LRS), and vice versa. A plurality of memory devices 300 such as shown in FIG. 26 may be formed in the exemplary structure. Each memory device 300 may form an individual memory element (e.g., memory cell) of an array 95 of resistive memory devices, such as described above with reference to FIGS. 1B and 1C.

The layer stack 138 in the memory device 200 shown in FIG. 26 is non-planar, meaning that both the switching layer 125 and the top electrode 130 conform to the non-planar profile of the bottom electrode 121, which includes a raised outer portion that protrudes above the upper surface 122 of the third dielectric material layer 116, and a recessed central portion that is vertically recessed relative to the outer portion of the bottom electrode 121. In the embodiment shown in FIG. 26, the raised outer portion of the bottom electrode 121 includes the barrier layer 119 which forms the outer surface 129 of the bottom electrode 121, and the recessed central portion includes the conductive fill portion 120 of the bottom electrode 121 which is recessed relative to the barrier layer 119. Accordingly, the switching layer 125 includes a first horizontal portion 126 over the upper surface 122 of the third dielectric material layer 116, a second horizontal portion 128 over the upper surface 225 of the barrier layer 119 of the bottom electrode 121, a third horizontal portion 246 over the upper surface 223 of the conductive fill portion 120 of the bottom electrode 121, a first vertical portion 127 that extends over a side surface 129 of the bottom electrode 121 between the first horizontal portion 126 and the second horizontal portion 128 of the switching layer 125, and a second vertical portion 245 that extends over the interior side surface 229 of the barrier layer 119 of the bottom electrode 121 between the second horizontal portion 128 and the third horizontal portion 246 of the switching layer 125. In addition, the top electrode 130 includes a first horizontal portion 131 over the first horizontal portion 126 of the switching layer 125, a second horizontal portion 133 over the second horizontal portion 126 of the switching layer 125, a third horizontal portion 248 over the third horizontal portion 246 of the switching layer 125, a first vertical portion 132 that extends over the first vertical portion of 127 of the switching layer 125 between the first horizontal portion 131 and the second horizontal portion 133 of the top electrode 130, and a second vertical portion 247 that extends over the second vertical portion 245 of the switching layer 125 between second horizontal portion 133 and the third horizontal portion 248 of the top electrode 130. The conductive via 150 of the memory device 200 may contact the first horizontal portion 131, the first vertical portion 132, the second horizontal portion 133, the second vertical portion 247, and the third horizontal portion 248 of the top electrode 130. The conductive via 150 may be laterally surrounded by a fourth dielectric material layer 140.

Referring to FIGS. 20, 21 and 26, in various embodiments, the first vertical portion 127 of the switching layer

125 may extend at an angle, $\theta_1$, with respect to the first horizontal portion 126 of the switching layer 125, and the second vertical portion 245 of the switching layer 125 may extend at an angle, $\theta_3$, with respect to the third horizontal portion 246 of the switching layer 125. In some embodiments, $\theta_1$ may be <90°, and $\theta3$ may be >90°. In addition, the first vertical portion 127 of the top electrode 130 may extend at an angle, $\theta_4$, with respect to the first horizontal portion 131 of the top electrode 130, and the second vertical portion 247 of the top electrode 130 may extend at an angle, $\theta_5$, with respect to the third horizontal portion 248 of the continuous top electrode 130L. In some embodiments, $\theta_4$ may be <90°, and $\theta_5$ may be >90°.

A resistive memory device 300 as shown in FIG. 26 may induce a charge crowding effect between the non-planar bottom electrode 121 and the non-planar layer stack 138 that may provide a localized increase in the electric field. This enhanced electric field may facilitate switching of the switching layer 125 of the memory device 300 between a High Resistance State (HRS) and a Low Resistance State (LRS). Accordingly, a relatively lower voltage may be applied across the non-planar switching layer 125 and the top electrode 130 to change the switching layer 125 between a High Resistance State (HRS) and a Low Resistance State (LRS). This may enable the operating voltage of the memory device 300 to be reduced.

Figure 27:
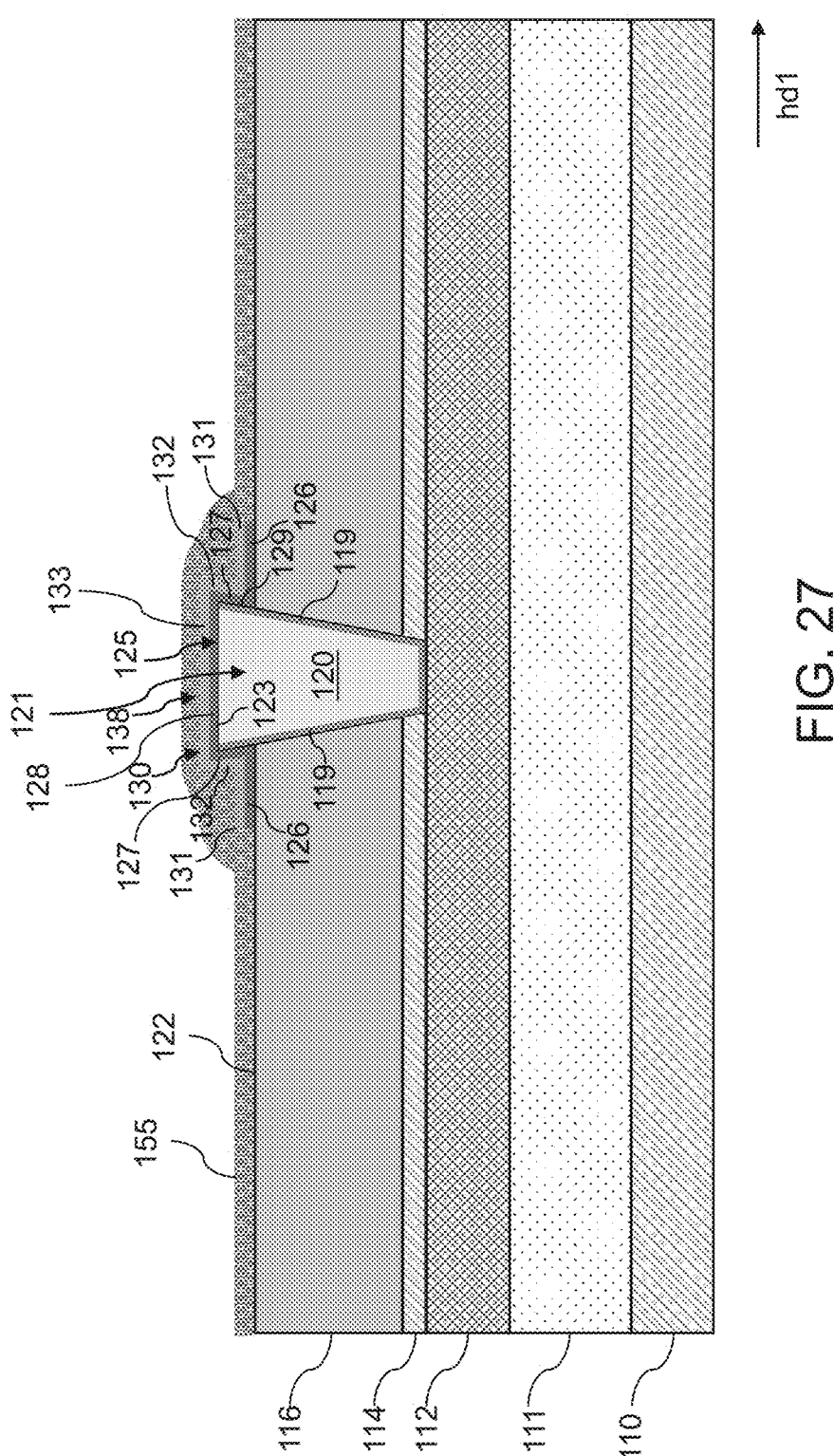
FIG. 27 is a vertical cross-section view of an exemplary intermediate structure during a process of forming a memory device that includes a passivation layer is located over a layer stack and the exposed upper surface of a third dielectric material layer according to an embodiment of the present disclosure.

FIGS. 27-31 are sequential vertical cross-sectional views of an exemplary structure during a process of forming resistive memory device according to yet another alternative embodiment of the present disclosure. FIG. 27 is a vertical cross-section view of an exemplary intermediate structure during a process of forming a memory device that includes a substrate 110, a first dielectric material layer 111 over the substrate 110, a metal line 112 embedded in the first dielectric material layer 111, a second dielectric material layer 114 over the first dielectric material layer 112 and the metal line 112, a third dielectric material layer 116 over the second dielectric material layer 114, and a bottom electrode 121 extending through the third dielectric material layer 116 and the second dielectric material layer 114 and contacting the metal line 112. The upper surface 122 of the third dielectric material layer 116 may be recessed relative to the bottom electrode 121 by a recess distance, d, such that a portion of the bottom electrode 121 may project above the upper surface 122 of the third dielectric material layer 116. A layer stack 138 is located over the upper surface 122 of the third dielectric material layer 116 and over the side surface 129 and upper surface 123 of the bottom electrode 121. The layer stack 138 includes a discrete switching layer 125 including a first horizontal portion 126 located over the upper surface 122 of the third dielectric material layer 116, a first vertical portion 127 located over the side surface 129 of the bottom electrode 121, and a second horizontal portion 128 located over the upper surface 123 of the bottom electrode 121. The layer stack 138 also includes a discrete top electrode 130 located over the discrete switching layer 125, wherein the discrete top electrode 130 includes a first horizontal portion 131 over the first horizontal portion 126 of the switching layer 125, a first vertical portion 132 over the first vertical portion 127 of the switching layer 125, and a second horizontal portion 133 over the second horizontal portion 128 of the switching layer 125. The exemplary intermediate structure shown in FIG. 27 may be derived from the exemplary intermediate structure shown in FIG. 13, thus repeated discussion of the structure and details of the substrate 110, the first dielectric material layer 111, the metal line 112, the second dielectric material layer 114, the third dielectric material layer 116, and the layer stack 138 are omitted.

The exemplary structure shown in FIG. 27 differs from the exemplary structure shown in FIG. 13 in that a passivation layer 155 may be located over the layer stack 138 and the exposed upper surface 122 of the third dielectric material layer 116 according to an embodiment of the present disclosure. Referring to FIG. 27, a passivation layer 155 may be deposited over the upper surface 122 of the third dielectric material layer 116 and over the side and upper surfaces of the layer stack 138. The passivation layer 155 may contact the side surface of the switching layer 125 and the side surface and upper surface of the top electrode 130. Suitable materials for the passivation layer 155 may include, without limitation, silicon nitride (SiN), silicon carbonitride (SiCN), silicon oxynitride (SiON), silicon oxycarbide (SiOC), and combinations thereof. Other suitable materials for the passivation layer 155 are within the contemplated scope of disclosure. The passivation layer 155 may be deposited using a suitable deposition technique as described above.

Figure 28:
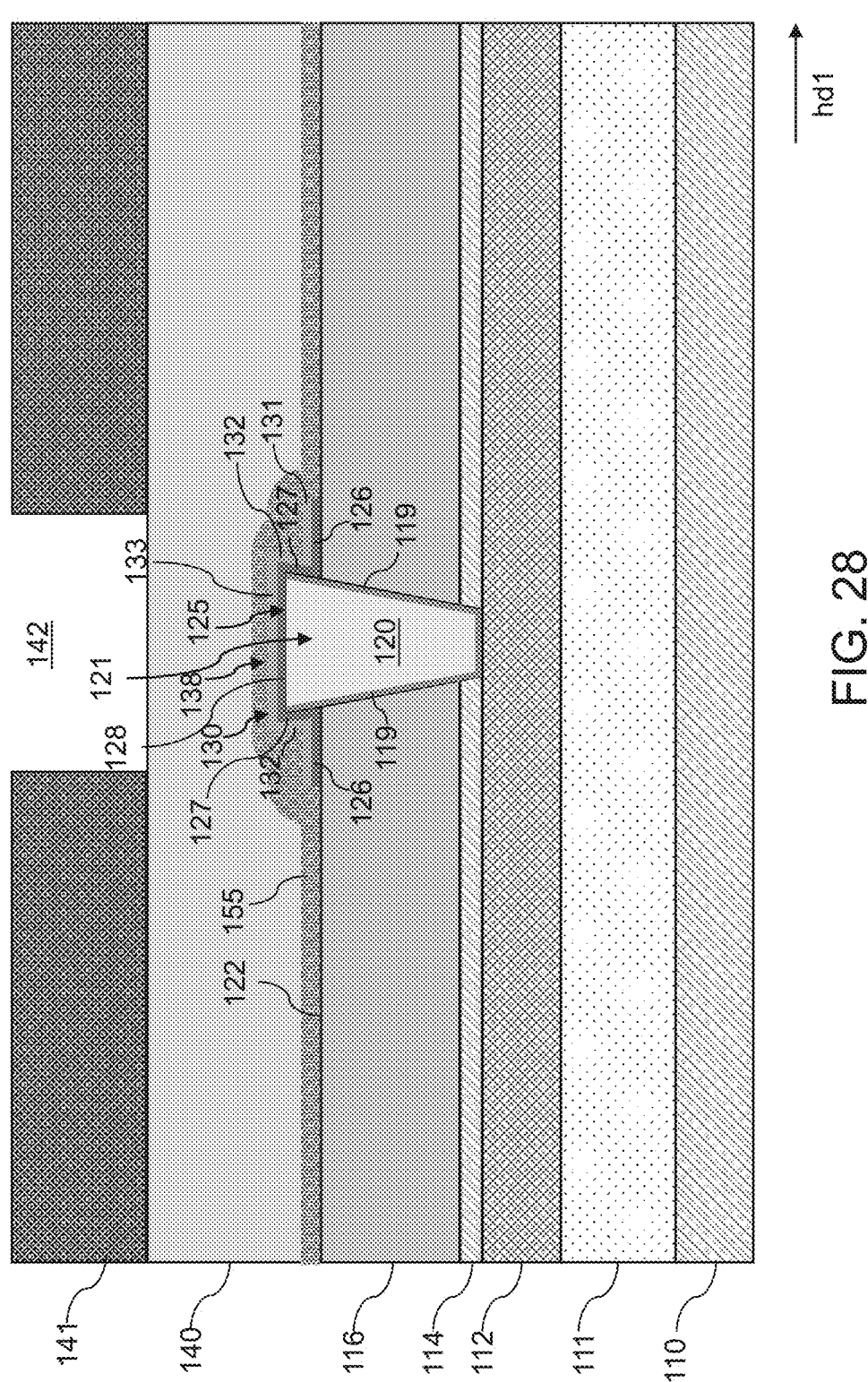
FIG. 28 is a vertical cross-sectional view of an exemplary structure during a process of forming a resistive memory device that includes a fourth dielectric material layer formed over the passivation layer, and a patterned mask formed over the upper surface of the fourth dielectric material layer according to an embodiment of the present disclosure.

FIG. 28 is a vertical cross-sectional view of an exemplary structure during a process of forming a resistive memory device that includes a fourth dielectric material layer 140 formed over the passivation layer 155, and a patterned mask 141 formed over the upper surface of the fourth dielectric material layer 140 according to an embodiment of the present disclosure. Referring to FIG. 28, the fourth dielectric material layer 140 may be deposited over the upper surface of the passivation layer 155 using any suitable deposition method as described above. The fourth dielectric material layer 140 may be formed of any suitable dielectric material, such as any of the materials for the fourth dielectric material layer 140 described above with reference to FIG. 14. A mask 141, which may include a layer of photoresist and/or a hard mask, may be patterned using a photolithographic technique to form one or more openings 142 through the mask 141, where each opening 141 in the mask 141 may correspond to a location of a layer stack 138 underlying the fourth dielectric material layer 140 and the passivation layer 155.

Figure 29:
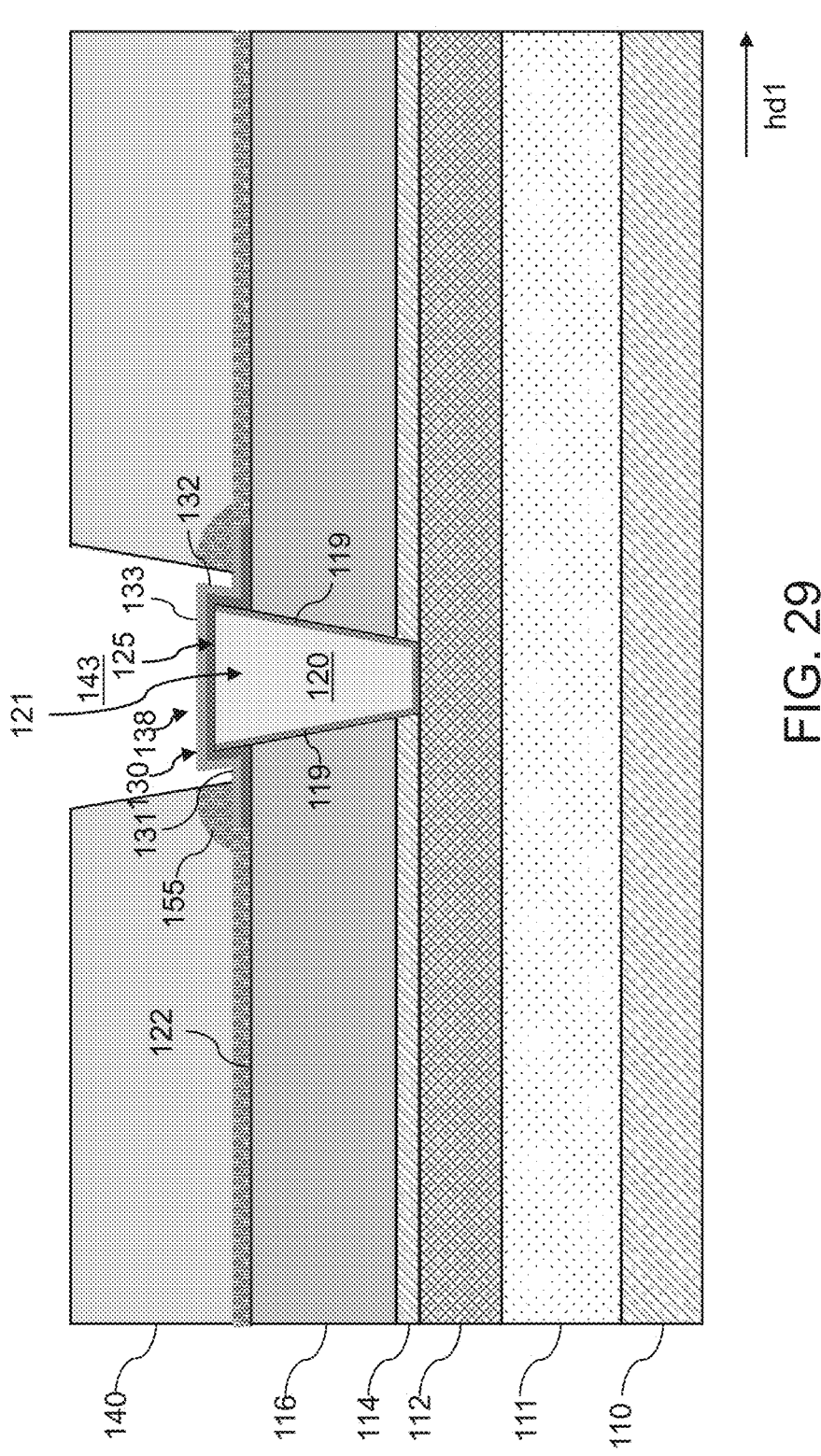
FIG. 29 is a vertical cross-section view of an exemplary structure during a process of forming a resistive memory device showing an opening formed through the fourth dielectric material layer and the passivation layer to expose a portion of a layer stack according to an embodiment of the present disclosure.

FIG. 29 is a vertical cross-section view of an exemplary structure during a process of forming a resistive memory device showing an opening 143 formed through the fourth dielectric material layer 140 and the passivation layer 155 to expose a portion of a layer stack 138 according to an embodiment of the present disclosure. Referring to FIG. 29, an etching process, such as an anisotropic etching process, may be used to etch the exemplary structure through the patterned mask 141 to remove portions of the fourth dielectric material layer 140 and the passivation layer 155 and form the opening 143 through the fourth dielectric material layer 140. The etching process may stop at the top electrode 130 of the layer stack 138. In some embodiments, a single etching process may be used to etch through the fourth dielectric material layer 140 and the passivation layer 155. Alternatively, a first etching step may be used to etch through the fourth dielectric material layer 140, and a second etching step, which may use a different etch chemistry than the first etching step, may be used to etch through the passivation layer 155 to the top electrode 130. In various embodiments, following the etching process, the first vertical portion 132, the second horizontal portion 133, and a portion of the first horizontal portion 131 of the top electrode 130 may be exposed in the bottom of the opening 143. Following the etching process, the patterned mask 141 may be removed using a suitable process, such as by ashing or by dissolution using a solvent.

Figure 30:
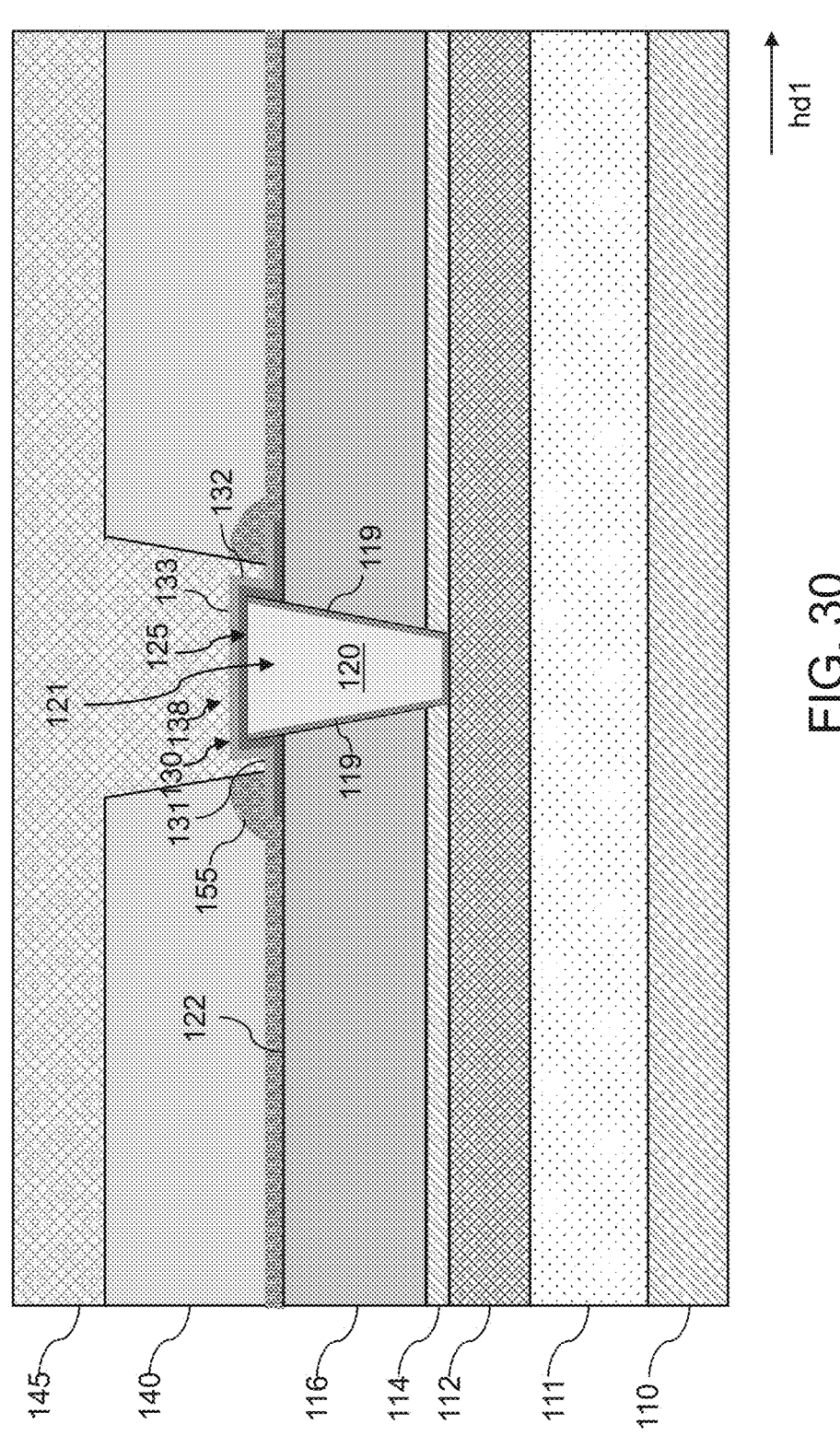
FIG. 30 is a vertical cross-section view of an exemplary structure during a process of forming a resistive memory device showing a conductive material layer deposited over the upper surface of the fourth dielectric material layer and within the opening according to an embodiment of the present disclosure.

FIG. 30 is a vertical cross-section view of an exemplary structure during a process of forming a resistive memory device showing a conductive material layer 145 deposited over the upper surface of the fourth dielectric material layer 140 and within the opening 143 according to an embodiment of the present disclosure. Referring to FIG. 30, the conductive material layer 145 may fill the opening 143 such that the conductive material layer 145 contacts the exposed side surfaces of the fourth dielectric material layer 140 and the passivation layer 155 along the sidewall of the opening 143, and contacts the exposed surfaces of the first horizontal portion 131, the first vertical portion 132, and the second horizontal portion 133 of the top electrode 130 in the bottom of the opening 143. The conductive material layer 145 may include any suitable electrically conductive material, such as any of the materials for the conductive material layer 145 described above with reference to FIG. 17. The conductive material layer 145 may be deposited using any suitable deposition process as described above.

Figure 31:
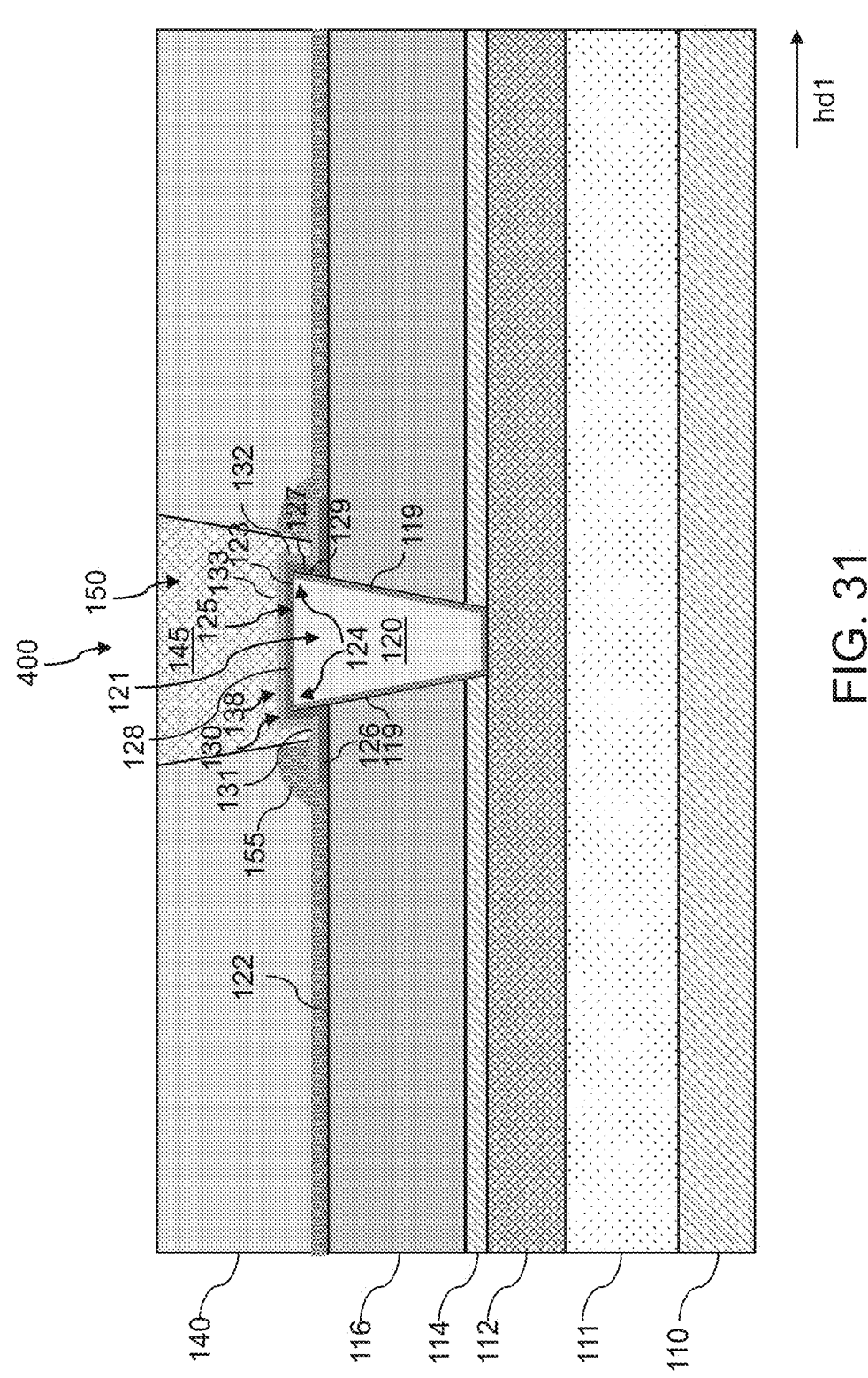
FIG. 31 is a vertical cross-section view of a resistive memory device following a planarization process to remove portions of the conductive material layer from over the upper surface of the fourth dielectric material layer according to an embodiment of the present disclosure.

FIG. 31 is a vertical cross-section view of a resistive memory device 400 following a planarization process to remove portions of the conductive material layer 145 from over the upper surface of the fourth dielectric material layer 140 according to an embodiment of the present disclosure. Referring to FIG. 31, a planarization process, such as a chemical mechanical planarization (CMP) process, may be used to remove the conductive material layer 145 from over the upper surface of the fourth dielectric material layer 140. The remaining portion of the conductive material layer 140 may form a conductive via 150 that contacts the first horizontal portion 131, the first vertical portion 132, and the second horizontal portion 133 of the top electrode 130, and is laterally surrounded by the fourth dielectric material layer 140 and the passivation layer 155. In various embodiments, the upper surface of the conductive via 150 may be substantially co-planar with the upper surface of the fourth dielectric material layer 140.

Referring again to FIG. 31, the memory device 400 in this embodiment includes a layer stack 138 having a switching layer 125 and a top electrode 130 over the switching layer 125. The layer stack 138 is located between a bottom electrode 121 which contacts the switching layer 125, and a conductive via 150 which contacts the top electrode 130. The bottom electrode 121 and the conductive via 150 may be used to apply a voltage across the layer stack 138 in order to change the switching layer 125 from a High Resistance State (HRS) to a Low Resistance State (LRS), and vice versa. A plurality of memory devices 400 such as shown in FIG. 31 may be formed in the exemplary structure. Each memory device 400 may form an individual memory element (e.g., memory cell) of an array 95 of resistive memory devices, such as described above with reference to FIGS. 1B and 1C.

The layer stack 138 in the memory device 400 shown in FIG. 31 is non-planar, meaning that both the switching layer 125 and the top electrode 130 conform to the non-planar profile of the bottom electrode 121, which protrudes above the upper surface 122 of the third dielectric material layer 116. Accordingly, the switching layer 125 includes a first horizontal portion 126 over the upper surface 122 of the third dielectric material layer 116, a second horizontal portion 128 over the upper surface 123 of the bottom electrode 121, and a first vertical portion 127 that extends over a side surface 129 of the bottom electrode 121 between the first horizontal portion 126 and the second horizontal portion 128 of the switching layer 125. In addition, the top electrode 130 includes a first horizontal portion 131 over the first horizontal portion 126 of the switching layer 125, a second horizontal portion 133 over the second horizontal portion 126 of the switching layer 125, and a first vertical portion 132 that extends over the first vertical portion of 127 of the switching layer 125 between the first horizontal portion 131 and the second horizontal portion 133 of the top electrode 130. The conductive via 150 of the memory device 400 may contact the second horizontal portion 133, the first vertical portion 132, and a part of the first horizontal portion 131 of the top electrode 130. The passivation layer 155 may contact the remaining portion of the first horizontal portion 131 of the top electrode 130 that is not contacted by the conductive via 150. The passivation layer 155 may also contact the side surface of the switching layer 125. The conductive via 150 may be laterally surrounded by the passivation layer 150 and a fourth dielectric material layer 140.

Referring to FIGS. 9-11 and 31, the portion of the bottom electrode 121 that protrudes above the upper surface 122 of the third dielectric material layer 116 may include a tapered side surface 129. The tapered side surface 129 of the bottom electrode 121 may provide a reentrant portion 115 adjacent to the exposed side surface 129 of the bottom electrode 121, and a portion of the switching layer 125 may be located within the reentrant portion 115. In various embodiments, the first vertical portion 127 of the switching layer 125 may extend at an oblique angle, $\theta_1$, with respect to the first horizontal portion 126 of the switching layer 125. In addition, the first vertical portion 132 of the top electrode 130 may extend at an oblique angle, $\theta_2$, with respect to the first horizontal portion 131 of the top electrode 130. In some embodiments, $\theta1$ and $\theta_2$ may both be <90°.

In various embodiments, during operation of the memory device 400, charge crowding may occur near the corner portion(s) 124 of the bottom electrode 121 where the side surface 129 meets the upper surface 123 of the bottom electrode 121. This may provide a localized increase in the electric field near the corner portion 124 of the bottom electrode 121 which protrudes above the upper surface 122 of the third dielectric material layer 116. The enhanced electric field near the corner portion 124 of the bottom electrode 121 may facilitate switching of the switching layer 125 of the memory device 200 between a High Resistance State (HRS) and a Low Resistance State (LRS). Accordingly, a relatively lower voltage may be applied across the non-planar switching layer 125 and the top electrode 130 to change the switching layer 125 between a High Resistance State (HRS) and a Low Resistance State (LRS). This may enable the operating voltage of the memory device 400 to be reduced.

Figure 32:
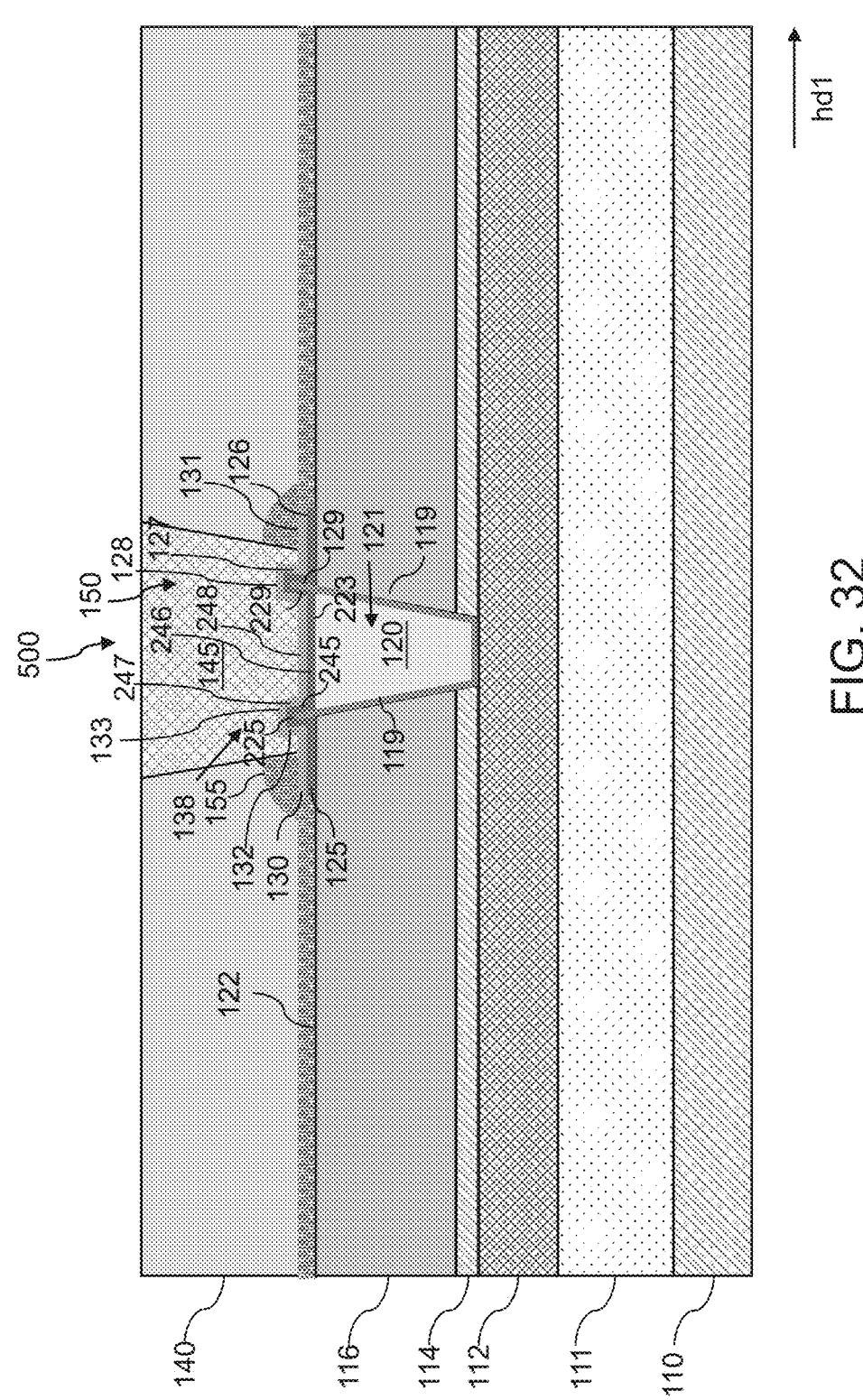
FIG. 32 is a vertical cross-section view of a resistive memory device including a passivation layer and a bottom electrode having a raised outer portion and a recessed central portion according to yet another embodiment of the present disclosure.

FIG. 32 is a vertical cross-section view of a resistive memory device 500 according to yet another embodiment of the present disclosure. The resistive memory device 500 shown in FIG. 32 is similar to the resistive memory device 400 described above with reference to FIG. 31 in that a passivation layer 155 is located over the upper surface 122 of the third dielectric layer 116, over the side surface and a portion of the upper surface of the layer stack 138, and laterally surrounding the conductive via 150. The resistive memory device 500 shown in FIG. 32 may be derived from the exemplary intermediate structure shown in FIG. 21, thus repeated discussion of the structure and details of the substrate 110, the first dielectric material layer 111, the metal line 112, the second dielectric material layer 114, the third dielectric material layer 116, the bottom electrode 121 and the layer stack 138 are omitted. A passivation layer 155 may be deposited over the upper surface 122 of the third dielectric material layer 116 and over the side and upper surfaces of the layer stack 138 of the intermediate structure shown in FIG. 21. Then, the processing steps described above with reference to FIGS. 29-31 may be performed to provide a resistive memory device 500 as shown in FIG. 32.

The layer stack 138 in the memory device 200 shown in FIG. 32 is non-planar, meaning that both the switching layer 125 and the top electrode 130 conform to the non-planar profile of the bottom electrode 121, which includes a raised outer portion that protrudes above the upper surface 122 of the third dielectric material layer 116, and a recessed central portion that is vertically recessed relative to the outer portion of the bottom electrode 121. In the embodiment shown in FIG. 26, the raised outer portion of the bottom electrode 121 includes the barrier layer 119 which forms the outer surface 129 of the bottom electrode 121, and the recessed central portion includes the conductive fill portion 120 of the bottom electrode 121 which is recessed relative to the barrier layer 119. Accordingly, the switching layer 125 includes a first horizontal portion 126 over the upper surface 122 of the third dielectric material layer 116, a second horizontal portion 128 over the upper surface 225 of the barrier layer 119 of the bottom electrode 121, a third horizontal portion 246 over the upper surface 223 of the conductive fill portion 120 of the bottom electrode 121, a first vertical portion 127 that extends over a side surface 129 of the bottom electrode 121 between the first horizontal portion 126 and the second horizontal portion 128 of the switching layer 125, and a second vertical portion 245 that extends over the interior side surface 229 of the barrier layer 119 of the bottom electrode 121 between the second horizontal portion 128 and the third horizontal portion 246 of the switching layer 125. In addition, the top electrode 130 includes a first horizontal portion 131 over the first horizontal portion 126 of the switching layer 125, a second horizontal portion 133 over the second horizontal portion 126 of the switching layer 125, a third horizontal portion 248 over the third horizontal portion 246 of the switching layer 248, a first vertical portion 132 that extends over the first vertical portion of 127 of the switching layer 125 between the first horizontal portion 131 and the second horizontal portion 133 of the top electrode 130, and a second vertical portion 247 that extends over the second vertical portion 245 of the switching layer 125 between second horizontal portion 133 and the third horizontal portion 248 of the top electrode 130. The conductive via 150 of the memory device 200 may contact the first vertical portion 132, the second horizontal portion 133, the second vertical portion 247, the third horizontal portion 248 and a part of the first horizontal portion 131 of the top electrode 130. The passivation layer 155 may contact the remaining portion of the first horizontal portion 131 of the top electrode 130 that is not contacted by the conductive via 150. The passivation layer 155 may also contact the side surface of the switching layer 125. The conductive via 150 may be laterally surrounded by the passivation layer 150 and a fourth dielectric material layer 140.

FIG. 33 is a flowchart illustrating a method 301 of fabricating a resistive memory device 200, 300, 400, 500 according to an embodiment of the present disclosure. Referring to FIGS. 2-8 and 33, in step 302 of method 301, a bottom electrode 121 may be formed in a dielectric material layer 116. Referring to FIGS. 9, 19 and 33, in step 304 of method 301, an upper surface 122 of the dielectric material layer 116 may be recessed relative to an upper surface 123, 225 of the bottom electrode 121 to expose a side surface 129 of the bottom electrode 121. In some embodiments, a central portion of the bottom electrode 121 may also be recessed relative to an outer portion of the bottom electrode 121. For example, as shown in FIG. 9, an upper surface 223 of a conductive fill portion 120 of the bottom electrode 121 may be recessed relative to an upper surface 225 of a barrier layer 119 of the bottom electrode 121.

Referring to FIGS. 10, 20 and 33, in step 306 of method 301, a switching layer 125 may be formed over the upper surface 122 of the dielectric material layer 116 and the exposed side surface 129 and the upper surface 123, 225 of the bottom electrode 121. The switching layer 125 may include a first horizontal portion 126 over the upper surface 122 of the dielectric material layer 116, a second horizontal portion 128 over the upper surface 123, 225 of the bottom electrode 121, and a first vertical portion 127 over the exposed side surface 129 of the bottom electrode 121 between the first horizontal portion 126 and the second horizontal portion 128 of the switching layer 125. In embodiments in which a central portion of the bottom electrode 121 is recessed relative to an outer portion of the bottom electrode 121, the switching layer 125 may further include a third horizontal portion 246 over the upper surface 223 of the recessed central portion of the bottom electrode 121, and a second vertical portion 245 over an interior side surface 229 of the bottom electrode 121 between the second horizontal portion 128 and the third horizontal portion 246 of the switching layer 125.

Referring to FIGS. 11, 21 and 33, in step 308 of method 301, a top electrode 130 may be formed over the switching layer 125. The top electrode 130 may include a first horizontal portion 131 over the first horizontal portion 126 of the switching layer 125, a second horizontal portion 133 over the second horizontal portion 128 of the switching layer 125, and a first vertical portion 132 over the first vertical portion 127 of the switching layer 125 between the first horizontal portion 131 and the second horizontal portion 133 of the top electrode 130. In embodiments in which a central portion of the bottom electrode 121 is recessed relative to an outer portion of the bottom electrode 121, the top electrode 130 may further include a third horizontal portion 248 over the third horizontal portion 246 of the switching layer 125, and a second vertical portion 247 over the second vertical portion 245 of the switching layer 125 between the second horizontal portion 133 and the third horizontal portion 248 of the top electrode 130.

Referring to FIGS. 14-18, 22-25, 28-31 and 33, in step 310 of method 301, a conductive via 150 may be formed over the top electrode 130, where the conductive via 150 may contact the first horizontal portion 131, the second horizontal portion 133 and the first vertical portion 132 of the top electrode 130. In various embodiments, the conductive via 150 may be formed by forming a dielectric material layer 140 over the top electrode 130, forming an opening 143 through the dielectric material layer 140 to expose the second horizontal portion 133, the first vertical portion 132, and part of the first horizontal portion 131 of the top electrode 130 at the bottom of the opening 143, and depositing an electrically conductive material 145 within the opening 143 to form the conductive via 150. The conductive via 150 may be laterally surrounded by the dielectric material layer 140. In some embodiments, a passivation layer 155 may be formed over the top electrode 130 and the switching layer 125 prior to forming the dielectric material layer 140, such that the conductive via 150 may be laterally surrounded by the dielectric material layer 140 and the passivation layer 155.

Referring to all drawings and according to various embodiments of the present disclosure, a resistive memory device 200, 300, 400, 500 includes a bottom electrode 121, a switching layer 125 over the bottom electrode 121, the switching layer 125 including a first horizontal portion 126, a second horizontal portion 128 over an upper surface 123, 225 of the bottom electrode 121, and a first vertical portion 127 over a side surface 129 of the bottom electrode 121 between the first horizontal portion 126 and the second horizontal portion 128 of the switching layer 125, a top electrode 130 over the switching layer 125, the top electrode 130 including a first horizontal portion 131 over the first horizontal portion 126 of the switching layer 125, a second horizontal portion 133 over the second horizontal portion 128 of the switching layer 125, and a first vertical portion 132 over the first vertical portion 127 of the switching layer 125 between the first horizontal portion 131 and the second horizontal portion 133 of the top electrode 130, and a conductive via 150 over the top electrode 130 and contacting the first horizontal portion 131, the second horizontal portion 133 and the first vertical portion 132 of the top electrode 130.

In one embodiment, the switching layer 125 includes a solid-state dielectric material that is switchable between a High Resistance State (HRS) and a Low Resistance State (LRS).

In another embodiment, the resistive memory device 200, 300, 400, 500 further includes a dielectric material layer 116 laterally surrounding the bottom electrode 121, where the bottom electrode 121 includes a portion that protrudes above a top surface 122 of the dielectric material layer 116, and the first horizontal portion 126 of the switching layer 125 extends over the upper surface 123 of the dielectric material layer 116.

In another embodiment, the bottom electrode 121 includes a tapered side surface 129.

In another embodiment, the first vertical portion 127 of the switching layer 125 extends at an oblique angle, θ1, with respect to the first horizontal portion 126 of the switching layer 125, the first vertical portion 132 of the top electrode 130 extends at an oblique angle, θ2, with respect to the first horizontal portion 131 of the top electrode 130, and θ1 and θ2 are both <90°.

In another embodiment, the dielectric material layer 116 is a first dielectric material layer 111, the resistive memory device further including a second dielectric material layer 140 over the first dielectric material layer 116 and laterally surrounding the conductive via 150.

In another embodiment, the second dielectric material layer 140 contacts the first horizontal portion 131 of the top electrode 130.

In another embodiment, the resistive memory device further includes a passivation layer 155 between the first dielectric material layer 116 and the second dielectric material layer 140, the passivation layer 155 contacting an upper surface and a side surface of the top electrode 130 and a side surface of the switching layer 125 and laterally surrounding the conductive via 150.

In another embodiment, the passivation layer 155 includes at least one of silicon nitride (SiN), silicon carbonitride (SiCN), silicon oxynitride (SiON), silicon oxycarbide (SiOC).

In another embodiment, the bottom electrode 121 includes a raised outer portion, a recessed central portion, and an interior side surface 229 between the raised outer portion and the recessed central portion, the second horizontal portion 128 of the switching layer 125 extending over the raised outer portion 119 of the bottom electrode 121.

In another embodiment, the switching layer 125 includes a third horizontal portion 246 over the recessed central portion of the bottom electrode 121, and a second vertical portion 245 over the interior side surface 229 of the bottom electrode 121 between the second horizonal portion 128 and the third horizontal portion 246 of the switching layer 125, and the top electrode 130 includes a third horizontal portion 248 over the third horizontal portion 246 of the switching layer, and a second vertical portion 247 over the second vertical portion 245 of the switching layer 125.

In another embodiment, the second vertical portion 245 of the switching layer 125 layer extends at an oblique angle, $\theta_3$, with respect to the third horizontal portion 246 of the switching layer 125, the second vertical portion 247 of the top electrode 130 extends at an oblique angle, $\theta_5$, with respect to the third horizontal portion 248 of the top electrode 130, and wherein $\theta_3$ and $\theta_5$ are both >90°.

Another embodiment is drawn to a resistive memory device 300, 500 that includes a bottom electrode 121 embedded in a dielectric material layer 116, the bottom electrode 121 having an outer portion that projects above an upper surface 122 of the dielectric material layer 116 and a central portion that is recessed relative to the outer portion, a layer stack 138 over the bottom electrode, the layer stack 138 including a switching layer 125 and a top electrode 130 over the switching layer 130, and a conductive via 150 contacting the top electrode 130 of the layer stack 138.

In one embodiment, the outer portion of the bottom electrode 121 includes a barrier layer 119, and the central portion includes a conductive fill portion 120 of the bottom electrode.

In another embodiment, an upper surface 223 of the conductive fill portion 120 of the bottom electrode 121 is coplanar with the upper surface 122 of the dielectric material layer 116.

In another embodiment, the layer stack 138 extends over the upper surface 122 of the dielectric material layer 116, over an outer surface 129, an upper surface 225 and an interior side surface 229 of the barrier layer 119, and over an upper surface 223 of the conductive fill portion 120 of the bottom electrode 121.

Another embodiment is drawn to a method of fabricating a resistive memory device 200, 300, 400, 500 that includes forming a bottom electrode 121 in a dielectric material layer 116, recessing an upper surface 122 of the dielectric material layer 116 relative to an upper surface 123, 225 of the bottom electrode 121 to expose a side surface 129 of the bottom electrode 121, forming a switching layer 125 over the upper surface 122 of the dielectric material layer 116 and the exposed side surface 129 and the upper surface 123, 225 of the bottom electrode 121, the switching layer 125 including a first horizontal portion 126 over the upper surface 122 of the dielectric material layer 116, a second horizontal portion 128 over the upper surface 123, 225 of the bottom electrode 121, and a first vertical portion 127 over the exposed side surface 129 of the bottom electrode 121 between the first horizontal portion 126 and the second horizontal portion 128 of the switching layer 125, forming a top electrode 130 over the switching layer 125, the top electrode 130 including a first horizontal portion 131 over the first horizontal portion 126 of the switching layer 125, a second horizontal portion 133 over the second horizontal portion 128 of the switching layer 125, and a first vertical portion 132 over the first vertical portion 127 of the switching layer 125 between the first horizontal portion 131 and the second horizontal portion 133 of the top electrode 130, and forming a conductive via 150 over the top electrode 130, where the conductive via 150 contacts the first horizontal portion 131, the second horizontal portion 133, and the first vertical portion 132 of the top electrode 133.

In one embodiment, forming the conductive via 150 includes forming a second dielectric material layer 140 over the top electrode 130, forming an opening 143 through the second dielectric material layer 140 to expose the second horizontal portion 133, the first vertical portion 132, and a part of the first horizontal portion 131 of the top electrode 130 at the bottom of the opening 143, and depositing an electrically conductive material 145 within the opening 143 to form the conductive via 150.

In another embodiment, the method further includes forming a passivation layer 155 over the top electrode 130, where the second dielectric layer 140 is formed over the passivation layer 155, and where forming the opening 143 includes forming the opening 143 through the second dielectric material layer 140 and the passivation layer 155 to expose the second horizontal portion 133, the first vertical portion 132, and a part of the first horizontal portion 131 of the top electrode 130 at the bottom of the opening 143.

In another embodiment, the method further includes recessing a central portion of the bottom electrode 121 relative to an outer portion of the bottom electrode 121 prior to forming the switching layer 125, where the second horizontal portion 128 of the switching layer 125 is located over the upper surface 225 of the outer portion of the bottom electrode 121, and the switching layer 125 further includes a third horizontal portion 246 over the upper surface 223 of the recessed central portion of the bottom electrode 121, and a second vertical portion 245 over an interior side surface 229 of the bottom electrode 121 between the outer portion and the recessed central portion of the bottom electrode 121, and the top electrode 130 includes a third horizontal portion 248 over the third horizontal portion 246 of the switching layer 125, and a second vertical portion 247 over the second vertical portion 245 of the switching layer 125.

By providing a resistive memory device including a switching layer and a top electrode which conform to a non-planar profile of the bottom electrode, charge crowding and a localized increase in electric field may facilitate resistance-state switching of the memory device and provide a resistive memory device that may function at a reduced operating voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive memory device, comprising:
   a bottom electrode comprising a barrier layer and a conductive fill portion, wherein the barrier layer forms a bottom surface and a side surface of the bottom electrode;
   a dielectric material layer laterally surrounding the bottom electrode, wherein the bottom electrode includes a portion that protrudes above an upper surface of the dielectric material layer;

a switching layer over the bottom electrode, the switching layer comprising a first horizontal portion over the upper surface of the dielectric material layer, a second horizontal portion directly contacting an upper surface of the bottom electrode, and a first vertical portion directly contacting the barrier layer on the side surface of the bottom electrode between the first horizontal portion and the second horizontal portion of the switching layer, wherein a line segment having a first endpoint on the upper surface of the dielectric material layer and a second endpoint on the side surface of the bottom electrode and extending in a vertical direction substantially perpendicular to the upper surface of the dielectric material layer intersects the switching layer;

a top electrode over the switching layer, the top electrode comprising a first horizontal portion over the first horizontal portion of the switching layer, a second horizontal portion over the second horizontal portion of the switching layer, and a first vertical portion over the first vertical portion of the switching layer between the first horizontal portion and the second horizontal portion of the top electrode; and a conductive via over the top electrode and contacting the first horizontal portion, the second horizontal portion and the first vertical portion of the top electrode, wherein the portion of the bottom electrode that protrudes above the upper surface of the dielectric material layer has a tapered side surface that defines a reentrant portion adjacent to the side surface of the bottom electrode, wherein the reentrant portion comprises a volume surrounding the bottom electrode within which a vertical line segment extending from the upper surface of the dielectric material layer contacts either the side surface or a corner portion where the side surface meets the upper surface of the bottom electrode, wherein an upper portion of the barrier layer extends above an upper surface of the conductive fill portion, and the switching layer directly contacts the upper portion of the barrier layer on two opposite sides of the upper portion of the barrier layer.

2. The resistive memory device of claim 1, wherein the switching layer comprises a solid-state dielectric material that is switchable between a High Resistance State (HRS) and a Low Resistance State (LRS).

3. The resistive memory device of claim 1, wherein:
the first vertical portion of the switching layer extends at an oblique angle, θ1, with respect to the first horizontal portion of the switching layer, and
the first vertical portion of the top electrode extends at an oblique angle, θ2, with respect to the first horizontal portion of the top electrode, and θ1 and θ2 are both <90°.

4. The resistive memory device of claim 1, wherein the dielectric material layer comprises a first dielectric material layer, the resistive memory device further comprising a second dielectric material layer over the first dielectric material layer and laterally surrounding the conductive via.

5. The resistive memory device of claim 4, wherein the second dielectric material layer contacts the first horizontal portion of the top electrode.

6. The resistive memory device of claim 5, further comprising a passivation layer between the first dielectric material layer and the second dielectric material layer, the passivation layer contacting an upper surface and a side surface of the top electrode and a side surface of the switching layer and laterally surrounding the conductive via.

7. The resistive memory device of claim 6, wherein the passivation layer comprises at least one of silicon nitride (SiN), silicon carbonitride (SiCN), silicon oxynitride (SiON), and silicon oxycarbide (SiOC).

8. The resistive memory device of claim 1, wherein the bottom electrode comprises a raised outer portion, a recessed central portion, and an interior side surface between the raised outer portion and the recessed central portion, the second horizontal portion of the switching layer extending over the raised outer portion of the bottom electrode.

9. The resistive memory device of claim 8, wherein:
the switching layer comprises a third horizontal portion over the recessed central portion of the bottom electrode, and a second vertical portion over the interior side surface of the bottom electrode between the second horizonal portion and the third horizontal portion of the switching layer, and
the top electrode comprises a third horizontal portion over the third horizontal portion of the switching layer, and a second vertical portion over the second vertical portion of the switching layer.

10. The resistive memory device of claim 9, wherein:
the second vertical portion of the switching layer extends at an oblique angle, θ3, with respect to the third horizontal portion of the switching layer,
the second vertical portion of the top electrode extends at an oblique angle, θ5, with respect to the third horizontal portion of the top electrode, and wherein θ3 and θ5 are both >90°.

11. A resistive memory device, comprising:
a bottom electrode embedded in a dielectric material layer, the bottom electrode having an outer portion that projects above an upper surface of the dielectric material layer and a central portion that is recessed relative to the outer portion, wherein an upper surface of a conductive fill portion of the bottom electrode is coplanar with the upper surface of the dielectric material layer;
a layer stack over the bottom electrode, the layer stack comprising a switching layer and a top electrode over the switching layer; and
a conductive via contacting the top electrode of the layer stack and comprising a lower portion extending below a horizontal plane containing an upper surface of the bottom electrode and laterally surrounding the outer portion of the bottom electrode, wherein the lower portion of the conductive via contacts the top electrode below the horizontal plane containing the upper surface of the bottom electrode.

12. The resistive memory device of claim 11, wherein the outer portion of the bottom electrode comprises a barrier layer, and the central portion comprises the conductive fill portion of the bottom electrode.

13. The resistive memory device of claim 1, wherein a portion of the conductive via laterally surrounds a portion of the bottom electrode.

14. The resistive memory device of claim 12, wherein the layer stack extends over the upper surface of the dielectric material layer, over an outer surface, an upper surface and an interior side surface of the barrier layer, and over an upper surface of the conductive fill portion of the bottom electrode.

15. A resistive memory device, comprising:
a bottom electrode comprising a side surface, an upper surface and a corner portion between the side surface and the upper surface;
a dielectric material layer laterally surrounding the bottom electrode, wherein the bottom electrode comprises a conductive fill portion having an upper surface that is coplanar with an upper surface of the dielectric material layer;

a non-planar layer stack comprising a switching layer and a top electrode over the side surface, the upper surface and the corner portion of the bottom electrode; and a conductive via contacting the non-planar layer stack, wherein a portion of the conductive via laterally surrounds a portion of the bottom electrode and the portion of the conductive via laterally surrounding the portion of the bottom electrode contacts the top electrode.

16. The resistive memory device of claim 15, wherein the bottom electrode comprises a tapered side surface, and a portion of the conductive via extends vertically beneath the corner portion of the bottom electrode.

17. The resistive memory device of claim 15, wherein the corner portion of the bottom electrode is located where the side surface of the bottom electrode meets the upper surface of the bottom electrode.

18. The resistive memory device of claim 15, wherein the bottom electrode comprises an exterior side surface and an interior side surface, the corner portion of the bottom electrode is located between the exterior side surface and the interior side surface, and the upper surface of the bottom electrode is vertically recessed with respect to the corner portion of the bottom electrode.

19. The resistive memory device of claim 15, further comprising a passivation layer contacting an upper surface and a side surface of the top electrode and a side surface of the switching layer and laterally surrounding the conductive via.

* * * * *